United States Patent
Currie

(10) Patent No.: US 7,335,545 B2
(45) Date of Patent: Feb. 26, 2008

(54) CONTROL OF STRAIN IN DEVICE LAYERS BY PREVENTION OF RELAXATION

(75) Inventor: Matthew T. Currie, Brookline, MA (US)

(73) Assignee: AmberWave Systems Corporation, Salem, NH (US)

( * ) Notice: Subject to any disclaimer, the term of this patent is extended or adjusted under 35 U.S.C. 154(b) by 48 days.

(21) Appl. No.: 11/227,529

(22) Filed: Sep. 15, 2005

(65) Prior Publication Data

US 2006/0014366 A1 Jan. 19, 2006

Related U.S. Application Data

(63) Continuation-in-part of application No. 10/456,103, filed on Jun. 6, 2003, now Pat. No. 6,995,430.

(60) Provisional application No. 60/416,000, filed on Oct. 4, 2002, provisional application No. 60/404,058, filed on Aug. 15, 2002, provisional application No. 60/386,968, filed on Jun. 7, 2002.

(51) Int. Cl.
  *H01L 21/336* (2006.01)
  *H01L 21/8234* (2006.01)
(52) U.S. Cl. ............... 438/197; 438/938; 257/E29.193
(58) Field of Classification Search ........... 438/197, 438/938; 257/E29.193
  See application file for complete search history.

(56) References Cited

U.S. PATENT DOCUMENTS

| 4,010,045 | A | 3/1977 | Ruehrwein |
| 4,704,302 | A | 11/1987 | Bruel et al. |
| 4,710,788 | A | 12/1987 | Dambkes et al. |
| 4,969,031 | A | 11/1990 | Kobayashi et al. |
| 4,987,462 | A | 1/1991 | Kim et al. |
| 4,990,979 | A | 2/1991 | Otto et al. |
| 4,997,776 | A | 3/1991 | Harame et al. |
| 5,013,681 | A | 5/1991 | Godbey et al. |
| 5,089,872 | A | 2/1992 | Ozturk et al. |
| 5,091,767 | A | 2/1992 | Bean et al. |
| 5,155,571 | A | 10/1992 | Wang et al. |
| 5,166,084 | A | 11/1992 | Pfiester |
| 5,177,583 | A | 1/1993 | Endo et al. |
| 5,202,284 | A | 4/1993 | Kamins et al. |
| 5,207,864 | A | 5/1993 | Bhat et al. |
| 5,208,182 | A | 5/1993 | Narayan et al. |
| 5,212,110 | A | 5/1993 | Pfiester et al. |

(Continued)

FOREIGN PATENT DOCUMENTS

DE 4101167 7/1992

(Continued)

OTHER PUBLICATIONS

"2-Bit/Cell EEPROM Cell Using Band to Band Tunneling for Data Read-Out," IBM Technical Disclosure Bulletin, vol. 35, No. 4B (Sep. 1992) pp. 136-140.

(Continued)

*Primary Examiner*—Asok Kumar Sarkar
(74) *Attorney, Agent, or Firm*—Goodwin Procter LLP

(57) ABSTRACT

The benefits of strained semiconductors are combined with silicon-on-insulator approaches to substrate and device fabrication. Strain in the strained semiconductors is controlled for improved device performance.

31 Claims, 31 Drawing Sheets

U.S. PATENT DOCUMENTS

| | | | |
|---|---|---|---|
| 5,221,413 A | 6/1993 | Brasen et al. |
| 5,240,876 A | 8/1993 | Gaul et al. |
| 5,241,197 A | 8/1993 | Murakami et al. |
| 5,242,847 A | 9/1993 | Ozturk et al. |
| 5,250,445 A | 10/1993 | Bean et al. |
| 5,285,086 A | 2/1994 | Fitzgerald, Jr. |
| 5,291,439 A | 3/1994 | Kauffmann et al. |
| 5,298,452 A | 3/1994 | Meyerson |
| 5,310,451 A | 5/1994 | Tejwani et al. |
| 5,316,958 A | 5/1994 | Meyerson |
| 5,346,848 A | 9/1994 | Grupen-Shemansky et al. |
| 5,355,006 A * | 10/1994 | Iguchi ..................... 257/296 |
| 5,374,564 A | 12/1994 | Bruel et al. |
| 5,399,522 A | 3/1995 | Ohori et al. |
| 5,413,679 A | 5/1995 | Godbey |
| 5,424,243 A | 6/1995 | Takasaki et al. |
| 5,426,069 A | 6/1995 | Selvakumar et al. |
| 5,426,316 A | 6/1995 | Mohammad |
| 5,439,843 A | 8/1995 | Sakaguchi et al. |
| 5,442,205 A | 8/1995 | Brasen et al. |
| 5,461,243 A | 10/1995 | Ek et al. |
| 5,461,250 A | 10/1995 | Burghartz et al. |
| 5,462,883 A | 10/1995 | Dennard et al. |
| 5,476,813 A | 12/1995 | Naruse et al. |
| 5,479,033 A | 12/1995 | Baca et al. |
| 5,484,664 A | 1/1996 | Kitahara et al. |
| 5,523,243 A | 6/1996 | Mohammad |
| 5,523,592 A | 6/1996 | Nakagawa et al. |
| 5,534,713 A | 7/1996 | Ismail et al. |
| 5,536,361 A | 7/1996 | Kondo et al. |
| 5,540,785 A | 7/1996 | Dennard et al. |
| 5,548,128 A | 8/1996 | Soref et al. |
| 5,572,043 A | 11/1996 | Shimizu et al. |
| 5,596,527 A | 1/1997 | Tomioka et al. |
| 5,607,876 A | 3/1997 | Biegelsen et al. |
| 5,617,351 A | 4/1997 | Bertin et al. |
| 5,630,905 A | 5/1997 | Lynch et al. |
| 5,656,690 A * | 8/1997 | Pradl et al. ................. 524/847 |
| 5,659,187 A | 8/1997 | Legoues et al. |
| 5,683,934 A | 11/1997 | Candelaria |
| 5,698,869 A | 12/1997 | Yoshimi et al. |
| 5,714,777 A | 2/1998 | Ismail et al. |
| 5,728,623 A | 3/1998 | Mori et al. |
| 5,739,567 A | 4/1998 | Wong |
| 5,759,898 A | 6/1998 | Ek et al. |
| 5,777,347 A | 7/1998 | Bartelink |
| 5,786,612 A | 7/1998 | Otani et al. |
| 5,786,614 A | 7/1998 | Chuang et al. |
| 5,792,679 A | 8/1998 | Nakato |
| 5,808,344 A | 9/1998 | Ismail et al. |
| 5,847,419 A | 12/1998 | Imai et al. |
| 5,863,830 A | 1/1999 | Bruel et al. |
| 5,877,070 A | 3/1999 | Goesele et al. |
| 5,882,987 A | 3/1999 | Srikrishnan |
| 5,891,769 A | 4/1999 | Liaw et al. |
| 5,906,708 A | 5/1999 | Robinson et al. |
| 5,906,951 A | 5/1999 | Chu et al. |
| 5,912,479 A | 6/1999 | Mori et al. |
| 5,923,046 A | 7/1999 | Tezuka et al. |
| 5,943,560 A | 8/1999 | Chang et al. |
| 5,963,817 A | 10/1999 | Chu et al. |
| 5,966,622 A | 10/1999 | Levine et al. |
| 5,993,677 A | 11/1999 | Biasse et al. |
| 5,998,807 A | 12/1999 | Lustig et al. |
| 6,013,134 A | 1/2000 | Chu et al. |
| 6,013,563 A | 1/2000 | Henley et al. |
| 6,020,252 A | 2/2000 | Aspar et al. |
| 6,033,974 A | 3/2000 | Henley et al. |
| 6,033,995 A | 3/2000 | Muller |
| 6,058,044 A | 5/2000 | Sugiura et al. |
| 6,059,895 A | 5/2000 | Chu et al. |
| 6,074,919 A | 6/2000 | Gardner et al. |
| 6,096,590 A | 8/2000 | Chan et al. |
| 6,103,559 A | 8/2000 | Gardner et al. |
| 6,103,597 A | 8/2000 | Aspar et al. |
| 6,103,599 A | 8/2000 | Henley et al. |
| 6,107,653 A | 8/2000 | Fitzgerald |
| 6,111,267 A | 8/2000 | Fischer et al. |
| 6,117,750 A | 9/2000 | Bensahel et al. |
| 6,130,453 A | 10/2000 | Mei et al. |
| 6,133,799 A | 10/2000 | Favors, Jr. et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,160,303 A | 12/2000 | Fattaruso |
| 6,162,688 A | 12/2000 | Gardner et al. |
| 6,162,705 A | 12/2000 | Henley et al. |
| 6,184,111 B1 | 2/2001 | Henley et al. |
| 6,190,998 B1 | 2/2001 | Bruel et al. |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto et al. |
| 6,210,988 B1 | 4/2001 | Howe et al. |
| 6,218,677 B1 | 4/2001 | Broekaert |
| 6,225,192 B1 | 5/2001 | Aspar et al. |
| 6,228,694 B1 | 5/2001 | Doyle et al. |
| 6,232,138 B1 | 5/2001 | Fitzgerald et al. |
| 6,235,567 B1 | 5/2001 | Huang |
| 6,235,568 B1 | 5/2001 | Murthy et al. |
| 6,242,324 B1 | 6/2001 | Kub et al. |
| 6,249,022 B1 | 6/2001 | Lin et al. |
| 6,251,751 B1 | 6/2001 | Chu et al. |
| 6,251,755 B1 | 6/2001 | Furukawa et al. |
| 6,261,929 B1 | 7/2001 | Gehrke et al. |
| 6,266,278 B1 | 7/2001 | Harari et al. |
| 6,271,551 B1 | 8/2001 | Schmitz et al. |
| 6,271,726 B1 | 8/2001 | Fransis et al. |
| 6,281,532 B1 | 8/2001 | Doyle et al. |
| 6,290,804 B1 | 9/2001 | Henley et al. |
| 6,291,321 B1 | 9/2001 | Fitzgerald |
| 6,303,468 B1 | 10/2001 | Aspar et al. |
| 6,313,016 B1 | 11/2001 | Kibbel et al. |
| 6,316,301 B1 | 11/2001 | Kant |
| 6,323,108 B1 | 11/2001 | Kub et al. |
| 6,326,664 B1 | 12/2001 | Chau et al. |
| 6,326,667 B1 | 12/2001 | Sugiyama et al. |
| 6,329,063 B2 | 12/2001 | Lo et al. |
| 6,335,546 B1 | 1/2002 | Tsuda et al. |
| 6,339,232 B1 | 1/2002 | Takagi et al. |
| 6,344,417 B1 | 2/2002 | Usenko |
| 6,346,459 B1 | 2/2002 | Usenko et al. |
| 6,350,993 B1 | 2/2002 | Chu et al. |
| 6,352,909 B1 | 3/2002 | Usenko |
| 6,355,493 B1 | 3/2002 | Usenko |
| 6,368,733 B1 | 4/2002 | Nishinaga et al. |
| 6,368,938 B1 | 4/2002 | Usenko |
| 6,369,438 B1 | 4/2002 | Sugiyama et al. |
| 6,372,356 B1 | 4/2002 | Thornton et al. |
| 6,372,593 B1 | 4/2002 | Hattori et al. |
| 6,372,609 B1 | 4/2002 | Aga et al. |
| 6,387,829 B1 | 5/2002 | Usenko et al. |
| 6,391,740 B1 | 5/2002 | Cheung et al. |
| 6,399,970 B2 | 6/2002 | Kubo et al. |
| 6,403,975 B1 | 6/2002 | Brunner et al. |
| 6,407,406 B1 | 6/2002 | Tezuka et al. |
| 6,410,371 B1 | 6/2002 | Yu et al. |
| 6,425,951 B1 | 7/2002 | Chu et al. |
| 6,429,061 B1 | 8/2002 | Rim |
| 6,429,098 B1 | 8/2002 | Bensahel et al. |
| 6,445,016 B1 | 9/2002 | An et al. |
| 6,448,152 B1 | 9/2002 | Henley et al. |

| | | |
|---|---|---|
| 6,455,397 B1 | 9/2002 | Belford |
| 6,458,672 B1 | 10/2002 | Henley et al. |
| 6,475,072 B1 | 11/2002 | Canaperi et al. |
| 6,489,639 B1 | 12/2002 | Hoke et al. |
| 6,492,216 B1 * | 12/2002 | Yeo et al. .................. 438/197 |
| 6,514,836 B2 | 2/2003 | Belford |
| 6,515,335 B1 | 2/2003 | Christiansen et al. |
| 6,521,041 B2 | 2/2003 | Wu et al. |
| 6,524,935 B1 | 2/2003 | Canaperi et al. |
| 6,534,381 B2 | 3/2003 | Cheung et al. |
| 6,537,370 B1 | 3/2003 | Hernandez et al. |
| 6,555,839 B2 | 4/2003 | Fitzgerald |
| 6,563,152 B2 | 5/2003 | Roberds et al. |
| 6,573,126 B2 | 6/2003 | Cheng et al. |
| 6,583,015 B2 | 6/2003 | Fitzgerald et al. |
| 6,583,437 B2 | 6/2003 | Mizuno et al. |
| 6,591,321 B1 | 7/2003 | Arimilli et al. |
| 6,593,191 B2 | 7/2003 | Fitzgerald |
| 6,593,625 B2 | 7/2003 | Christiansen et al. |
| 6,596,610 B1 | 7/2003 | Kuwabara et al. |
| 6,597,016 B1 | 7/2003 | Yuki et al. |
| 6,602,613 B1 | 8/2003 | Fitzgerald |
| 6,603,156 B2 | 8/2003 | Rim |
| 6,605,498 B1 | 8/2003 | Murthy et al. |
| 6,607,948 B1 | 8/2003 | Sugiyama et al. |
| 6,621,131 B2 | 9/2003 | Murthy et al. |
| 6,624,047 B1 | 9/2003 | Sakaguchi et al. |
| 6,624,478 B2 | 9/2003 | Anderson et al. |
| 6,632,724 B2 | 10/2003 | Henley et al. |
| 6,635,909 B2 | 10/2003 | Clark et al. |
| 6,645,831 B1 | 11/2003 | Shaheen et al. |
| 6,646,322 B2 | 11/2003 | Fitzgerald |
| 6,649,492 B2 | 11/2003 | Chu et al. |
| 6,656,271 B2 | 12/2003 | Yonehara et al. |
| 6,657,223 B1 | 12/2003 | Wang et al. |
| 6,664,169 B1 | 12/2003 | Iwasaki et al. |
| 6,672,137 B1 | 1/2004 | Isomura et al. |
| 6,677,183 B2 | 1/2004 | Sakaguchi et al. |
| 6,677,192 B1 | 1/2004 | Fitzgerald |
| 6,680,240 B1 | 1/2004 | Maszara |
| 6,680,260 B2 | 1/2004 | Akiyama et al. |
| 6,689,671 B1 * | 2/2004 | Yu et al. .................. 438/486 |
| 6,690,043 B1 | 2/2004 | Usuda et al. |
| 6,703,144 B2 | 3/2004 | Fitzgerald |
| 6,703,648 B1 | 3/2004 | Xiang et al. |
| 6,703,688 B1 | 3/2004 | Fitzergald |
| 6,706,614 B1 | 3/2004 | An et al. |
| 6,706,618 B2 | 3/2004 | Takisawa et al. |
| 6,707,106 B1 | 3/2004 | Wristers et al. |
| 6,709,903 B2 | 3/2004 | Christiansen et al. |
| 6,709,909 B2 | 3/2004 | Mizuno et al. |
| 6,713,326 B2 | 3/2004 | Cheng et al. |
| 6,737,670 B2 | 5/2004 | Cheng et al. |
| 6,743,684 B2 | 6/2004 | Liu |
| 6,750,130 B1 | 6/2004 | Fitzgerald |
| 2001/0003364 A1 | 6/2001 | Sugawara et al. |
| 2001/0007789 A1 | 7/2001 | Aspar et al. |
| 2002/0043660 A1 | 4/2002 | Yamazaki et al. |
| 2002/0052084 A1 | 5/2002 | Fitzgerald |
| 2002/0063292 A1 | 5/2002 | Armstrong et al. |
| 2002/0084000 A1 | 7/2002 | Fitzgerald |
| 2002/0096717 A1 | 7/2002 | Chu et al. |
| 2002/0100942 A1 | 8/2002 | Fitzgerald et al. |
| 2002/0123167 A1 | 9/2002 | Fitzgerald |
| 2002/0123183 A1 | 9/2002 | Fitzgerald |
| 2002/0123197 A1 | 9/2002 | Fitzgerald et al. |
| 2002/0125471 A1 | 9/2002 | Fitzgerald et al. |
| 2002/0125497 A1 | 9/2002 | Fitzgerald |
| 2002/0140031 A1 | 10/2002 | Rim |
| 2002/0146892 A1 | 10/2002 | Notsu et al. |
| 2002/0168864 A1 | 11/2002 | Cheng et al. |
| 2002/0190284 A1 | 12/2002 | Murthy et al. |
| 2003/0003679 A1 | 1/2003 | Doyle et al. |
| 2003/0013305 A1 | 1/2003 | Sugii et al. |
| 2003/0013323 A1 | 1/2003 | Hammond et al. |
| 2003/0025131 A1 | 2/2003 | Lee et al. |
| 2003/0027381 A1 | 2/2003 | Buynoski et al. |
| 2003/0034529 A1 | 2/2003 | Fitzgerald et al. |
| 2003/0057439 A1 | 3/2003 | Fitzgerald |
| 2003/0077867 A1 | 4/2003 | Fitzergald |
| 2003/0102498 A1 | 6/2003 | Braithwaite et al. |
| 2003/0119280 A1 | 6/2003 | Lee et al. |
| 2003/0127646 A1 | 7/2003 | Christiansen et al. |
| 2003/0139000 A1 | 7/2003 | Bedell et al. |
| 2003/0157787 A1 | 8/2003 | Murthy et al. |
| 2003/0160300 A1 | 8/2003 | Takenaka et al. |
| 2003/0178681 A1 | 9/2003 | Clark et al. |
| 2003/0189229 A1 | 10/2003 | Mouli |
| 2003/0199126 A1 | 10/2003 | Chu et al. |
| 2003/0201458 A1 | 10/2003 | Clark et al. |
| 2003/0203600 A1 | 10/2003 | Chu et al. |
| 2003/0207127 A1 | 11/2003 | Murthy et al. |
| 2003/0215990 A1 | 11/2003 | Fitzgerald et al. |
| 2003/0218189 A1 | 11/2003 | Christiansen et al. |
| 2003/0219957 A1 | 11/2003 | Kuwabara et al. |
| 2003/0227036 A1 | 12/2003 | Sugiyama et al. |
| 2003/0227057 A1 | 12/2003 | Lochtefeld et al. |
| 2003/0230778 A1 | 12/2003 | Park et al. |
| 2003/0232467 A1 | 12/2003 | Anderson et al. |
| 2004/0007724 A1 | 1/2004 | Murthy et al. |
| 2004/0009649 A1 | 1/2004 | Kub et al. |
| 2004/0012037 A1 | 1/2004 | Venkatesan et al. |
| 2004/0012075 A1 | 1/2004 | Bedell et al. |
| 2004/0014276 A1 | 1/2004 | Murthy et al. |
| 2004/0014304 A1 | 1/2004 | Bhattacharyya |
| 2004/0018699 A1 | 1/2004 | Boyd et al. |
| 2004/0031979 A1 | 2/2004 | Lochtefeld et al. |
| 2004/0031990 A1 | 2/2004 | Jin et al. |
| 2004/0041174 A1 | 3/2004 | Okihara |
| 2004/0041210 A1 | 3/2004 | Mouli |
| 2004/0048091 A1 | 3/2004 | Sato et al. |
| 2004/0048454 A1 | 3/2004 | Sakaguchi |
| 2004/0051140 A1 | 3/2004 | Bhattacharyya |
| 2004/0053477 A1 | 3/2004 | Ghyselen et al. |
| 2004/0070035 A1 | 4/2004 | Murthy et al. |
| 2004/0075149 A1 | 4/2004 | Fitzgerald et al. |
| 2004/0084735 A1 | 5/2004 | Murthy et al. |
| 2004/0119101 A1 | 6/2004 | Schrom et al. |
| 2004/0142545 A1 | 7/2004 | Ngo et al. |
| 2004/0173790 A1 | 9/2004 | Yeo et al. |
| 2004/0173815 A1 | 9/2004 | Yeo et al. |
| 2006/0003510 A1 | 1/2006 | Kammler et al. |

FOREIGN PATENT DOCUMENTS

| | | |
|---|---|---|
| EP | 0514018 | 11/1992 |
| EP | 0587520 | 3/1994 |
| EP | 0683522 | 11/1995 |
| EP | 0828296 | 3/1998 |
| EP | 0829908 | 3/1998 |
| EP | 0838858 | 4/1998 |
| EP | 1020900 | 7/2000 |
| EP | 1174928 | 1/2002 |
| GB | 2342777 | 4/2000 |
| JP | 61141116 | 6/1986 |
| JP | 2210816 | 8/1990 |
| JP | 3036717 | 2/1991 |
| JP | 4307974 | 10/1992 |
| JP | 5166724 | 7/1993 |
| JP | 6177046 | 6/1994 |
| JP | 6244112 | 9/1994 |
| JP | 7106446 | 4/1995 |
| JP | 7240372 | 9/1995 |
| JP | 9219524 | 8/1997 |
| JP | 10270685 | 10/1998 |
| JP | 11233744 | 8/1999 |

| | | |
|---|---|---|
| JP | 200031491 | 1/2000 |
| JP | 2000021783 | 1/2000 |
| JP | 2001319935 | 11/2001 |
| JP | 2002076334 | 3/2002 |
| JP | 2002164520 | 6/2002 |
| JP | 2002289533 | 10/2002 |
| WO | WO-9859365 | 12/1998 |
| WO | WO-9953539 | 10/1999 |
| WO | WO-0048239 | 8/2000 |
| WO | WO-0054338 | 9/2000 |
| WO | WO-0122482 | 3/2001 |
| WO | WO-0154202 | 7/2001 |
| WO | WO-0193338 | 12/2001 |
| WO | WO-0199169 | 12/2001 |
| WO | WO-0213262 | 2/2002 |
| WO | WO-0215244 | 2/2002 |
| WO | WO-0227783 | 4/2002 |
| WO | WO-0247168 | 6/2002 |
| WO | WO-02071488 | 9/2002 |
| WO | WO-02071491 | 9/2002 |
| WO | WO-02071495 | 9/2002 |
| WO | WO-02082514 | 10/2002 |
| WO | WO-2004006311 | 1/2004 |
| WO | WO-2004006326 | 1/2004 |
| WO | WO-2004006327 | 1/2004 |
| WO | WO-2004019403 | 3/2004 |
| WO | WO-2004019404 | 3/2004 |

OTHER PUBLICATIONS

Armstrong et al., "Design of Si/SiGe Heterojunction Complementary Metal-Oxide-Semiconductor Transistors," IEDM Technical Digest (1995) pp. 761-764.

Armstrong, "Technology for SiGe Heterostructure-Based CMOS Devices", Ph.D Thesis, Massachusetts Institute of Technology (1999) pp. 1-154.

Augusto et al., "Proposal for a New Process Flow for the Fabrication of Silicon-Based Complementary MOD-MOSFETs without Ion Implantation," Thin Solid Films, vol. 294, No. 1-2 (1997) pp. 254-258.

Barradas et al., "RBS analysis of MBE-grown SiGe/(001) Si heterostructures with thin, high Ge content SiGe channels for HMOS transistors," Modern Physics Letters B (2001) (abstract).

Batterman, "Hillocks, Pits, and Etch Rate in Germanium Crystals," J. App. Physics, vol. 28, No. 11 (1957), pp. 1236-1241.

Bohg, "Ethylene Diamine-Pyrocatechol-Water Mixture Shows Etching Anomaly in Boron-Doped Silicon," J. Electrochemical Soc'y, vol. 118, No. 2 (1971), pp. 401-402.

Borenstein et al., "A New Ultra-Hard Etch-Stop Layer for High Precision Micromachining," Proceedings of the 12th IEEE Int'l Conf. on Micro Electro Mechanical Systems (MEMs) (1999) pp. 205-210.

Bouillon et al., "Search for the optimal channel architecture for 0.18/0.12 μm bulk CMOS Experimental study," IEEE (1996) pp. 21.2.1-21.2.4.

Bruel et al., ".RTM.Smart Cut: A Promising New SOI Material Technology," Proc. 1995 IEEE Int'l SOI Conf., pp. 178-179.

Bruel, "Silicon on Insulator Material Technology," Electronic Letters, vol. 13, No. 14 (1995) pp. 1201-1202.

Brunner et al., "Molecular beam epitaxy growth and thermal stability of $Si_{1-x}Ge_x$ layers on extremely thin silicon-on-insulator substrates," Thin Solid Films, vol. 321 (1998), pp. 245-250.

Bufler et al., "Hole transport in strained $Si_{1-x}Ge_x$ alloys on $Si_{1-y}Ge_y$ substrates," J. App. Physics, vol. 84, No. 10 (1998) pp. 5597-5602.

Burghartz et al., "Microwave Inductors and Capacitors in Standard Multilevel Interconnect Silicon Technology", IEEE Trans. on Microwave Theory and Techniques, vol. 44, No. 1 (1996) pp. 100-104.

Canaperi et al., "Preparation of a relaxed Si-Ge layer on an insulator in fabricating high-speed semiconductor devices with strained epitaxial films," International Business Machines Corporation, USA (2002) (abstract).

Carlin et al., "High Efficiency GaAs-on-Si Solar Cells with High Voc Using Graded GeSi Buffers," IEEE (2000) pp. 1006-1011.

Chang et al., "Selective Etching of SiGe/Si Heterostructures," J. Electrochemical Soc'y, No. 1 (1991) pp. 202-204.

Chen et al., "The Band Model and the Etching Mechanism of Silicon in Aqueous KOH," J. Electrochemical Soc'y, vol. 142, No. 1 (1995), pp. 170-176.

Cheng et al., "Electron Mobility Enhancement in Strained-Si n-MOSFETs Fabricated on SiGe-on-Insulator (SGOI) Substrates," IEEE Electron Device Letters, vol. 22, No. 7 (2001) pp. 321-323.

Cheng et al., "Relaxed Silicon-Germanium on Insulator Substrate by Layer Transfer," J. Electronic Materials, vol. 30, No. 12 (2001) pp. L37-L39.

Cullis et al, "Growth ripples upon strained SiGe epitaxial layers on Si and misfit dislocation interactions," J. Vac. Sci. Tech. A, vol. 12, No. 4 (1994) pp. 1924-1931.

Currie et al., "Carrier mobilities and process stability of strained Si n- and p-MOSFETs on SiGe virtual substrates," J. Vac. Sci. Technol. B., vol. 19, No. 6 (2001) pp. 2268-2279.

Currie et al., "Controlling Threading Dislocation in Ge on Si Using Graded SiGe Layers and Chemical-Mechanical Polishing," vol. 72 No. 14 (1998) pp. 1718-1720.

Desmond et al., "The Effects of Process-Induced Defects on the Chemical Selectivity of Highly Doped Boron Etch Stops in Silicon," J. Electrochemical Soc'y, vol. 141, No. 1 (1994), pp. 178-184.

Eaglesham et al., "Dislocation-Free Stranski-Krastanow Growth of Ge on Si(100)," Physical Review Letters, vol. 64, No. 16 (1990) pp. 1943-1946.

Ehman et al., "Morphology of Etch Pits on Germanium Studied by Optical and Scanning Electron Microscopy," J. App. Physics, vol. 41, No. 7 (1970), pp. 2824-2827.

Feijoo et al., "Epitaxial Si-Ge Etch Stop Layers with Ethylene Diamine Pyrocatechol for Bonded and Etchback Silicon-on-Insulator," J. Electronic Materials, vol. 23, No. 6 (1994) pp. 493-496.

Feijoo et al., "Etch Stop Barriers in Silicon Produced by Ion Implantation of Electrically Non-Active Species," J. Electrochemical Soc'y, vol. 139, No. 8 (1992), pp. 2309-2313.

Finne et al., "A Water-Amine-Complexing Agent System for Etching Silicon," J. Electrochemical Soc'y, vol. 114, No. 9 (1967), pp. 965-970.

Fischetti et al., "Band structure, deformation potentials, and carrier mobility in strained Si, Ge, and SiGe alloys," J. Appl. Phys., vol. 80, No. 4 (1996) pp. 2234-2252.

Fischetti, "Long-range Coulomb interactions in small Si devices. Part II. Effective electron mobility in thin-oxide structures," J. App. Physics, vol. 89, No. 2 (2001) pp. 1232-1250.

Fitzgerald et al., "Dislocation dynamics in relaxed graded composition semiconductors," Materials Science and Engineering B67 (1999) pp. 53-61.

Fitzgerald et al., "Relaxed $Ge_xSi_{1-x}$ structures for III-V integration with Si and high mobility two-dimensional electron gases in Si," AT&T Bell Laboratories, Murray Hill, NJ 07974 (1992) American Vacuum Society, pp. 1807-1819.

Fitzgerald et al., "Totally Relaxed $Ge_xSi_{1-x}$ Layers with Low Threading Dislocation Densities Grown on Si Substrates," Applied Physics Letters, vol. 59, No. 7 (1991) pp. 811-813.

Fitzgerald, "GeSi/Si Nanostuctures," Annual Rev. Materials Science, vol. 25 (1995), pp. 417-454.

Frank, "Orientation-Dependent Dissolution of Germanium," J. App. Physics, vol. 31, No. 11 (1960), pp. 1996-1999.

Fukatsu, "SiGe-based semiconductor-on-insulator substrate created by low-energy separation-by-implanted-oxygen," Applied Physics Letters, vol. 72, No. 26 (1998) pp. 3485-3487.

Gannavaram et al., "Low Temperature (<800° C.) Recessed Junction Selective Silicon-Germanium Source/Drain Technology for sub-70 nm CMOS," 2000 IEEE IEDM Tech. Dig., pp. 437-440.

Garone et al., "Silicon vapor phase epitaxial growth catalysis by the presence of germane," Applied Physics Letters, vol. 56, No. 13 (1990) pp. 1275-1277.

Ge et al., "Process-Strained Si (PSS) CMOS Technology Featuring 3D Strain Engineering," IEEE IEDM Tech. Dig., (2003) pp. 73-76.

Ghandi et al., "Chemical Etching of Germanium," J. Electrochemical Soc'y, vol. 135, No. 8 (1988), pp. 2053-2054.

Ghani et al., "A 90nm High Volume Manufacturing Logic Technology Featuring Novel 45nm Gate Length Strained Silicon CMOS Transistors," IEEE IEDM Tech. Dig., (2003), 978-980.

Godbey et al., "A $Si_{0.7}Ge_{0.3}$ strained-layer etch stop for the generation of thin layer undoped silicon," Applied Physics Letters, vol. 56, No. 4 (1990), pp. 373-375.

Godbey et al., "Fabrication of Bond and Etch-Back Silicon Insulator Using a Strained $Sl_{0.7}GE_{0.3}$ Layer as an Etch Stop," J. Electrical Soc'y, vol. 137, No. 10 (1990) pp. 3219-3223.

Gray and Meyer, "Phase-Locked Loops," Analysis and Design of Analog Integrated Circuits (1984) pp. 605-632.

Grillot et al., "Acceptor diffusion and segregation in $(Al_xGa_{1-x})_{0.5}In_{0.5}P$ heterostructures," J. App. Physics, vol. 91, No. 8 (2002), pp. 4891-4899.

Grutzmacher et al., "Ge segregation in SiGe/Si heterostructures and its dependence on deposition technique and growth atmosphere," Applied Physics Letters, vol. 63, No. 18 (1993) pp. 2531-2533.

Hackbarth et al., "Alternatives to thick MBE-grown relaxed SiGe buffers," Thin Solid Films, vol. 369, No. 1-2 (2000) pp. 148-151.

Hackbarth et al., "Strain relieved SiGe buffers for Si-based heterostructure field-effect transistors," J. Crystal Growth, vol. 201/202 (1999) pp. 734-738.

Halsall et al., "Electron diffraction and Raman studies of the effect of substrate misorientation on ordering in the AlGaInP system," J. App. Physics, vol. 85, No. 1 (1999), pp. 199-202.

Hamada et al., "A New Asepct of Mechanical Stress Effects in Scaled MOS Devices," IEEE Trans. on Electron Devices, vol. 38, No. 4 (1991), pp. 895-900.

Herzog et al., "SiGe-based FETS: buffer issues and device results," Thin Solid Films, vol. 380 (2000) pp. 36-41.

Herzog et al., "X-Ray Investigation of Boron- and Germanium-Doped Silicon Epitaxial Layers," J. Electrochemical Soc'y, vol. 131, No. 12 (1984), pp. 2969-2974.

Hock et al., "Carrier mobilities in modulation doped $Si_{1-x}Ge_x$ heterostructures with respect to FET applications," Thin Solid Films, vol. 336 (1998) pp. 141-144.

Hock et al., "High hole mobility in $Si_{0.17}Ge_{0.83}$ channel metal-oxide-semiconductor field-effect transistors grown by plasma-enhanced chemical vapor deposition," Applied Physics Letters, vol. 76, No. 26 (2000) pp. 3920-3922.

Hock et al., "High performance 0.25 μm p-type Ge/SiGe MODFETs," Electronics Letters, vol. 34, No. 19 (1998) pp. 1888-1889.

Holmes, "The Orientation Dependence of Etching Effects on Germanium Crystals," Acta Metallurgica, vol. 7, No. 4 (1959), pp. 283-290.

Hsu et al., "Surface morphology of related $Ge_xSi_{1-x}$ films," Appl. Phys. Lett., vol. 61, No. 11 (1992), pp. 1293-1295.

Huang et al., "High-quality strain-relaxed SiGe alloy grown on implanted silicon-on-insulator substrate," Applied Physics Letters, vol. 76, No. 19 (2000) pp. 2680-2682.

Huang et al., "Isolation Process Dependence of Channel Mobility in Thin-Film SOI Devices," IEEE Electron Device Letters, vol. 17, No. 6 (1996), pp. 291-293.

Huang et al., "LOCOS-Induced Stress Effects on Thin-Film SOI Devices," IEEE Trans. on Electron Devices, vol. 44, No. 4 (1997), pp. 646-650.

Huang et al., "The Impact of Scaling Down to Deep Submicron on CMOS RF Circuits", IEEE J. Solid-State Circuits, vol. 33, No. 7, (1998) pp. 1023-1036.

Huang et al., "Carrier Mobility enhancement in strained Si-on-insulator fabricated by wafer bonding," 2001 Symp. on VLSI Technology, Dig. Tech. Papers, pp. 57-58.

Huang, et al., "Reduction of Source/Drain Series Resistance and Its Impact on Device Performance for PMOS Transistors with Raised $Si_{1-x}Ge_x$ Source/Drain," IEEE Electron Device Letters, vol. 21, No. 9, (2000) pp. 448-450.

Hunt et al., "Highly Selective Etch Stop by Stress Compensation for Thin-Film BESOI," 1990 IEEE/SOI Tech. Conf., (1990), pp. 145-146.

IBM Technical Disclosure Bulletin, vol. 32, No. 8A, (1990) "Optimal Growth Technique and Structure for Strain Relaxation of Si-Ge Layerson Si Substrates", pp. 330-331.

Iida et al., "Thermal behavior of residual strain in silicon-on-insulator bonded wafer and effects on electron mobility," Solid-State Electronics, vol. 43 (1999), pp. 1117-1120.

International Search Report for Related International Application No. PCT/US2003/18007, Jan. 5, 2004.

Ishikawa et al., "Creation of Si-Ge-based SIMOX structures by low energy oxygen implantation," Proc. 1997 IEEE International SOI Conference (1997) pp. 16-17.

Ishikawa et al., "SiGe-on-insulator substrate using SiGe alloy grown Si(001)," Applied Physics Letters, vol. 75, No. 7 (1999) pp. 983-985.

Ismail et al., "Modulation-doped n-type Si/SiGe with inverted interface," Appl. Phys. Lett., vol. 65, No. 10 (1994) pp. 1248-1250.

Ismail, "Si/SiGe High-Speed Field-Effect Transistors," Electron Devices Meeting, Washington, D.C. (1995) pp. 20.1.1-20.1.4.

Ito et al., "Mechanical Stress Effect on Etch-Stop Nitride and its Impact on Deep Submicron Transistor Design," IEEE IEDM Tech. Dig, (2000), pp. 247-250.

Jaccodine, "Use of Modified Free Energy Theorems to Predict Equilibrium Growing and Etching Shapes," J. Applied Physics, vol. 33, No. 8 (1962), pp. 2643-2647.

Kearney et al., "The effect of alloy scattering on the mobility of holes in a $Si_{1-x}Ge_x$ quantum well," Semicond. Sci Technol., vol. 13 (1998) pp. 174-180.

Kern, "Chemical Etching of Silicon, Germanium, Gallium, Arsenide, and Gallium Phosphide," RCA Review, vol. 39 (1978), pp. 278-308.

Kim et al., "A Fully Integrated 1.9-GHz CMOS Low-Noise Amplifier," IEEE Microwave and Guided Wave Letters, vol. 8, No. 8 (1998) pp. 293-295.

Koester et al., "Extremely High Transconductance $Ge/Si_{0.4}Ge_{0.6}$ p-MODFET's Grown by UHV-CVD," IEEE Electron Device Letters, vol. 21, No. 3 (2000) pp. 110-112.

Konig et al., "Design Rules for n-Type SiGe Hetero FETs," Solid State Electronics, vol. 41, No. 10 (1997), pp. 1541-1547.

Konig et al., "p-Type Ge-Channel MODFET's with High Transconductance Grown on Si Substrates," IEEE Electron Device Letters, vol. 14, No. 4 (1993) pp. 205-207.

Konig et al., "SiGe HBTs and HFETs," Solid-State Electronics, vol. 38, No. 9 (1995) pp. 1595-1602.

Kummer et al., "Low energy plasma enhanced chemical vapor deposition," Materials Science and Engineering B89 (2002) pp. 288-295.

Kuznetsov et al., "Technology for high-performance n-channel SiGe modulation-doped field-effect transistors," J. Vac. Sci. Tech. B, 13(6) (1995) pp. 2892-2896.

Lang et al., "Bulk Micromachining of Ge for IR Gratings," J. Micromechanics and Microengineering, vol. 6, No. 1 (Mar. 1996), pp. 46-48.

Langdo et al., (2000) "Preparation of Novel SiGe-free Strained Si on Insulator Substrates" IEEE Int'l SOI Conference, pp. 211-212 (XP002263057).

Larson, "Integrated Circuit Technology Options for RFIC's—Present Status and Future Directions," IEEE J. Solid-State Circuits, vol. 33, No. 3 (1998) pp. 387-399.

Leancu et al., "Anisotropic Etching of Germanium," Sensors and Actuators, A46-47 (1995), pp. 35-37.

Lee et al., "CMOS RF Integrated Circuits at 5 GHz and Beyond," Proceedings of the IEEE, vol. 88, No. 10 (2000) pp. 1560-1571.

Lee et al., "Strained Ge channel p-type metal-oxide-semiconductor field-effect transistors grown on $Si_{1-x}Ge_x/Si$ virtual substrates," Applied Physics Letters, vol. 79, No. 20 (2001) pp. 3344-3346.

Lee et al., "Strained Ge channel p-type MOSFETs fabricated on $Si_{1-x}Ge_x/Si$ virtual substrates," Mat. Res. Soc. Symp. Proc., vol. 686 (2002) pp. A1.9.1-A1.9.5.

LeGoues et al., "Relaxation of SiGe thin films grown on $Si/SiO_2$ substrates," Applied Physics Letters, vol. 75, No. 11 (1994), pp. 7240-7246.

Lehmann et al., "Implanted Carbon: An Effective Etch-Stop in Silicon," J. Electrochemical Soc'y, vol. 138, No. 5 (May 1991), pp. 3-4.

Leitz et al., "Channel Engineering of SiGe-Based Heterostructures for High Mobility MOSFETs," Mat. Res. Soc. Symp. Proc., vol. 686 (2002) pp. A3.10.1-A3.10.6.

Leitz et al., "Dislocation glide and blocking kinetics in compositionally graded SiGe/Si," J. Applied Physics, vol. 90, No. 6 (2001) pp. 2730-2736.

Leitz et al., "Hole mobility enhancements in strained Si/Si$_{1-y}$Ge$_y$ p-type metal-oxide-semiconductor field-effect transistors grown on relaxed Si$_{1-x}$Ge$_x$ (X<y) virtual substrates," Applied Physics Letters, vol. 79, No. 25 (2001) pp. 4246-4248.

Li et al., "Design of high speed Si/SiGe heterojunction complementary metal-oxide-semiconductor field effect transistors with reduced short-channel effects," J. Vac. Sci. Tech., vol. 20 No. 3 (2002) pp. 1030-1033.

Lochtefeld et al., "Investigating the Relationship Between Electron Mobility and Velocity in Deeply Scaled NMOS via Mechanical Stress," IEEE Electron Device Letters, vol. 22, No. 12 (2001), pp. 591-593.

Lu et al., "High Performance 0.1 .mu.m Gate-Length P-Type SiGe MODFETs's and MOS-MODFET's", IEEE Transactions on Electron Devices, vol. 47, No. 8 (Aug. 2000) pp. 1645-1652.

Maiti et al., "Strained-Si heterostructure field effect transistors," Semicond. Sci. Technol., vol. 13 (1998) pp. 1225-1246.

Maszara, "Silicon-On-Insulator by Wafer Bonding: A Review," J. Electrochemical Soc'y, No. 1 (1991) pp. 341-347.

Meyerson et al., "Cooperative Growth Phenomena in Silicon/Germanium Low-Temperature Epitaxy," Applied Physics Letters, vol. 53, No. 25 (1988) pp. 2555-2557.

Mizuno et al., "Advanced SOI-MOSFETs with Strained-Si Channel for High Speed CMOS-Electron/Hole Mobility Enhancement," 2000 Symp. on VLSI Technology, Dig. Tech. Papers, pp. 210-211.

Mizuno et al., "Electron and Hold Mobility Enhancement in Strained-Si MOSFET's on SiGe-on-Insulator Substrates Fabricated by SIMOX Technology", IEEE Electron Device Letters, vol. 21, No. 5 (2000) pp. 230-232.

Mizuno et al., "High Performance Strained-Si p-MOSFETs on SiGe-on-Insulator Substrates Fabricated by SIMOX Technology," IEEE IDEM Tech. Dig. (1999) pp. 934-936.

Narozny et al., "Si/SiGe Heterojunction Bipolar Transistor with Graded GAP SiGe Base Made by Molecular Beam Epitaxy," IEEE IEDM (1998), pp. 562-565.

Nayak et al., "High-Mobility Strained-Si PMOSFET's," IEEE Trans. on Electron Devices, vol. 43, No. 10 (1996) pp. 1709-1716.

O'Neill et al., "SiGe Virtual substrate N-channel heterojunction MOSFETS," Semicond. Sci. Technol., vol. 14 (1999) pp. 784-789.

Ootsuka et al., "A Highly Dense, High-Performance 130nm node CMOS Technology for Large Scale System-on-a-Chip Applications," IEEE IEDM Tech. Dig. (2000), pp. 575-578.

Ota et al., "Novel Locally Strained Channel Technique for High Performance 55nm CMOS," IEEE IEDM Tech. Dig. (2002), pp. 27-30.

Ota, Y. et al., "Application of heterojunction FET to power amplifier for cellular telephone," Electronics Letters, vol. 30 No. 11 (1994) pp. 906-907.

Ozturk, et al., "Advanced Si$_{1-x}$Ge$_x$ Source/Drain and Contact Technologies for Sub-70 nm CMOS," IEEE IEDM Tech. Dig., (2002), pp. 375-378.

Ozturk, et al., "Low Resistivity Nickel Germanosilicide Contacts to Ultra-Shallow Si$_{1-x}$Ge$_x$ Source/Drain Junctions for Nanoscale CMOS," IEEE IEDM Tech. Dig. (2003), pp. 497-500.

Ozturk, et al., "Selective Silicon-Gremanium Source/Drain Technology for Nanoscale CMOS," Mat. Res. Soc. Symp. Proc., vol. 717, (2002), pp. C4.1.1-C4.1.12.

Ozturk, et al., "Ultra-Shallow Source/Drain Junctions for Nanoscale CMOS Using Selective Silicon-Germanium Technology," Extended Abstract of International Workshop on Junction Technology, (2001), pp. 77-82.

Palik et al., "Ellipsometric Study of the Etch-Stop Mechanism in Heavily Doped Silicon," J. Electrochemical Soc'y, vol. 132, No. 1 (1985), pp. 135-141.

Palik et al., "Study of Bias-Dependent Etching of Si in Aqueous KOH," J. Electrochemical Soc'y, vol. 134, No. 2 (1987), pp. 404-409.

Palik et al., "Study of the Etch-Stop Mechanism in Silicon," J. Electrochemical Soc'y, vol. 129, No. 9 (1982), pp. 2051-2059.

Papananos, "Low Noise Amplifiers in MOS Technologies," and "Low Noise Tuned-LC Oscillator," Radio-Frequency Microelectronic Circuits for Telecommunication Applications (1999) pp. 115-117, 188-193.

Parker et al., "SiGe heterostructure CMOS circuits and applications," Solid State Electronics, vol. 43 (1999) pp. 1497-1506.

Petersen, "Silicon as a Mechanical Material," Proceedings of the IEEE, vol. 70, No. 5 (1982), pp. 420-457.

Powell et al., "New approach to the growth of low dislocation relaxed SiGe material," Applied Physics Letters, vol. 64, No. 14 (1994), pp. 1865-1858.

Rai-Choudhury et al., "Doping of Epitaxial Silicon," J. Crystal Growth, vol. 7 (1970), pp. 361-367.

Raley et al., "(100) Silicon Etch-Rate Dependence on Boron Concentration in Ethylenediamine-Pyrocatechol-Water Solutions," J. Electrochemical Soc'y, vol. 131, No. 1 (1984), pp. 161-170.

Ransom et al., "Gate-Self-Aligned n-channel and p-channel Germanium MOSFET's," IEEE Trans. on Electron Devices, vol. 38, No. 12 (1991) pp. 2695.

Reinking et al., "Fabricating of high-mobility Ge p-channel MOSFETs on Si substrates," Electronics Letters, vol. 35, No. 6 (1999) pp. 503-504.

Rim et al., "Enhanced Hole Mobilities in Surface-channel Strained-Si p-MOSFETs," 1995 IEDM, pp. 517-520.

Rim et al., "Fabrication and Analysis of Deep Submicron Strained-Si N-MOSFET's," IEEE Trans. on Electron Devices, vol. 47, No. 7 (2000) pp. 1406-1415.

Rim, "Application of Silicon-Based Heterostructures to Enhanced Mobility-Metal-Oxide-Semiconductor Field-Effect Transistors," Ph.D. Thesis, Stanford University (1999) pp. 1-184.

Robbins et al., "A model for heterogeneous grwoth of Si$_{1-x}$Ge$_x$ films for hydrides," J. App. Physics, vol. 69, No. 6 (1991) pp. 3729-3732.

Sadek et al., "Design of Si/SiGe Heterojunction Complementary Metal-Oxide-Semiconductor Transistors," IEEE Trans. Electron Devices (Aug. 1996) pp. 1224-1232.

Sakaguchi et al., "ELTRAN® by Splitting Porous Si Layers," Proc. 195$^{th}$ Int. SOI Symposium, vol. 99-3, Electrochemical Society (1999) pp. 117-121.

Schaffler, "High-Mobility Si and Ge Structures," Semiconductor Science and Technology, vol. 12 (1997) pp. 1515-1549.

Seidel et al., "Anisotropic Etching of Crystalline Silicon in Alkaline Solutions," J. Electrochemical Soc'y., vol. 137, No. 11 (1990), pp. 3626-3632.

Senna et al., "Gallium Doping for Silicon Etch Stop in KOH," Transducers '95/Eurosensors IX, the 8$^{th}$ International Conference on Solid-State Sensors and Actuators and Eurosensors IX, Stockholm, Sweden, Jun. 25-29, 1995, pp. 194-195.

Shang et al., "The Development of an Anisotropic Si Etch Process Selective to Ge$_x$Si$_{1-x}$ Underlayers," J. Electrochemical Soc'y., vol. 141, No. 2 (1994), pp. 507-510.

Shimizu et al., "Local Mechanical-Stress Control (LMC): A New Technique for CMOS-Performance Enhancement," IEEE International Electron Devices Meeting Technical Digest, (2001), pp. 433-436.

Soderbarg, "Fabrication of BESOI-Materials Using Implanted Nitrogen as an Effective Etch Stop Barrier," 1989 IEEE SOS/SOI Technology Conference, (1989), pp. 64.

Sugimoto et al., "A 2V, 500 MHz and 3V, 920 MHz Low-Power Current-Mode 0.6 .mu.m CMOS VCO Circuit", IEICE Trans. Electron., vol. E82-C, No. 7 (1999) pp. 1327-1329.

Sundaram et al., "Electrochemical etching of Silicon by Hydrazine," J. Electrochemical Soc'y, vol. 140, No. 6 (Jun. 1993), pp. 1592-1597.

Sze, "Physics of Semiconductor Devices," (1991).

Takagi et al., "On the University of Inversion Layer Mobility in Si MOSFET's: Part 1-Effects of Substrate Impurity Concentration," IEEE Transactions on Electron Devices, vol. 41, No. 12 (1994), pp. 2357-2362.

Ternent et al., "Metal Gate Strained Silicon MOSFETs for Microwave Integrated Circuits", IEEE (2000) pp. 38-43.

Thompson et al., "A 90nm Logic Technology Featuring 50nm Strained-Silicon Channel Transistors, 7 layers of Cu Interconnects, Low k ILD, and 1 µm² SRAM Cell," IEEE International Electron Devices Meeting Technical Digest, (2002), pp. 61-64.

Thompson et al., "A Logic Nanotechnology Featuring Strained-Silicon," IEEE Electron Device Letters, vol. 25, No. 4 (2004), pp. 191-193.

Ting et al., "Monolithic Integration of III-V Materials and Devices on Silicon," Part of the SPIE Conf. on Silicon-Based Optoelectronics, San Jose, CA (1999), pp. 19-28.

Tiwari et al., "Hole Mobility Improvement in Silicon-on-Insulator and Bulk Silicon Transistors Using Local Strain," IEEE International Electron Devices Meeting Technical Digest, (1997), pp. 939-941.

Tsang et al., "Measurements of alloy composition and strain in thin $Ge_xSi_{1-x}$ layers," J. Appl. Phys., vol. 75 No. 12 (1994) pp. 8098-8108.

Tweet et al., "Factors determining the composition of strained GeSi layers grown with disilane and germane," Applied Physics Letters, vol. 65, No. 20 (1994) pp. 2579-2581.

Uchino, et al., "A Raised Source/Drain Technology Using In-situ P-doped SiGe and B-doped Si for 0.1 µm CMOS ULSIs," IEEE International Electron Device Meeting Technical Digest, (1997), pp. 479-482.

Usami et al., "Spectroscopic study of Si-based quantum wells with neighboring confinement structure," Semicon. Sci. Technol. (1997) (abstract).

Vol'fson et al., "Fundamental Absorption Edge of Silicon Heavily Doped with Donor or Acceptor Impurities," Soviet Physics Semiconductors, vol. 1, No. 3 (1967), pp. 327-332.

Welser et al., "Electron Mobility Enhancement in Strained-Si N-Type Metal-Oxide-Semiconductor Field-Effect Transistors," IEEE Electron Device Letters, vol. 15, No. 3 (1994) pp. 100-102.

Welser et al., "Evidence of Real-Space Hot-Electron Transfer in High Mobility, Strained-Si Multilayer MOSFETs," IEEE IDEM Technical Digest (1993) pp. 545-548.

Welser et al., "NMOS and PMOS Transistors Fabricated in Strained Silicon/Relaxed Silicon-Germanium Structures," IEEE IDEM Technical Digest (1992) pp. 1000-1002.

Welser, "The Application of Strained Silicon/Relaxed Silicon Germanium Heterostructures to Metal-Oxide-Semiconductor Field-Effect Transistors," Ph.D. Thesis, Stanford University (1994) pp. 1-205.

Wolf et al., "Silicon Processing for the VLSI Era," vol. 1 Process Technology (1986) pp. 384-386.

Wu, "Novel Etch-Stop Materials for Silicon Micromachining," Thesis Submitted to the Massachusetts Institute of Technology Department of Materials Science and Engineering on May 9, 1997, pp. 1-62.

Xie et al., "Semiconductor Surface Roughness: Dependence on Sign and Magnitude of Bulk Strain," The Physical Review Letters, vol. 73, No. 22 (1994) pp. 3006-3009.

Xie et al., "Very high mobility two-dimensional hole gas in $Si/Ge_xSi_{1-x}/Ge$ structures grown by molecular beam epitaxy," Appl. Phys. Lett., vol. 63, No. 16 (1993) pp. 2263-2264. cited by other.

Xie, "SiGe Field effect transistors," Materials Science and Engineering, vol. 25 (1999) pp. 89-121. cited by other.

Yamagata et al., "Bonding, Splitting and Thinning by Porous Si in ELTRAN®; SOI-Epi Wafer®," Mat. Res. Soc. Symp. Proc., vol. 681E (2001) pp. 18.2.1-18.2.10. cited by other.

Yeo et al., "Nanoscale Ultra-Thin-Body Silicon-on-Insulator P-MOSFET with a SiGe/Si Heterostructure Channel," IEEE Electron Device Letters, vol. 21, No. 4 (2000) pp. 161-163. cited by other.

Yi et al., "$Si_{1-x}Ge_x$/Si Multiple Quantum Well Wires Fabricated Using Selective Etching," Materials Research Society Symposium Proceedings, vol. 379 (1995), pp. 91-96.

Zhang et al., "Demonstration of a GaAs-Based Compliant Substrate Using Wafer Bonding and Substrate Removal Techniques," Electronic Materials and Processing Research Laboratory, Department of Electrical Engineering, University Park, PA 16802 (1998) pp. 25-28.

Al-Bayati et al., "Exploring the limits of pre-amorphization implants on controlling channeling and diffusion of low energy B implants and ultra shallow junction formation," 2000 Conf. on Ion Implantation Technology, pp. 54-57.

Andrieu et al., "Co-integrated Dual Strained Channels on Fully Depleted sSDOI CMOSFETs with HfO₂/TiN Gate Stack down to 15nm Gate Length," 2005 IEEE Int'l SOI Conf. Proc., pp. 223-224.

Partial International Search Report for Internation Patent Application No. PCT/US2006/035814, Feb. 7, 2007 (7 pages).

Thean et al., "Performance of super-critical strained-si directly on insulator (SC-SSOI) CMOS based on high-performance PD-SOI technology," 2005 Symp. on VLSI Tech., Dig. Tech. Papers, pp. 134-135.

International Search Report and Written Opinion for International Patent Application No. PCT/US2006/035814, May 7, 2007.

* cited by examiner

CONTROL OF STRAIN IN DEVICE LAYERS BY PREVENTION OF RELAXATION

RELATED APPLICATIONS

This application is a continuation-in-part of U.S. application Ser. No. 10/456,103 filed Jun. 6, 2003 now U.S. Pat. No. 6,995,430, which claims the benefit of U.S. Provisional Application 60/386,968 filed Jun. 7, 2002, U.S. Provisional Application 60/404,058 filed Aug. 15, 2002, and U.S. Provisional Application 60/416,000 filed Oct. 4, 2002; the entire disclosures of these non-provisional and three provisional applications are hereby incorporated by reference.

FIELD OF THE INVENTION

This invention relates to devices and structures comprising strained semiconductor layers and insulator layers.

BACKGROUND

Strained silicon-on-insulator structures for semiconductor devices combine the benefits of two advanced approaches to performance enhancement: silicon-on-insulator (SOI) technology and strained silicon (Si) technology. The strained silicon-on-insulator configuration offers various advantages associated with the insulating substrate, such as reduced parasitic capacitances and improved isolation. Strained Si provides improved carrier mobilities. Devices such as strained Si metal-oxide-semiconductor field-effect transistors (MOSFETs) combine enhanced carrier mobilities with the advantages of insulating substrates.

Strained-silicon-on-insulator substrates are typically fabricated as follows. First, a relaxed silicon-germanium (SiGe) layer is formed on an insulator by one of several techniques such as separation by implantation of oxygen (SIMOX), wafer bonding and etch back; wafer bonding and hydrogen exfoliation layer transfer; or recrystallization of amorphous material. Then, a strained Si layer is epitaxially grown to form a strained-silicon-on-insulator structure, with strained Si disposed over SiGe. The relaxed-SiGe-on-insulator layer serves as the template for inducing strain in the Si layer. This induced strain (i.e., a dimensionless value indicating the change in gauge length of a sample, in the direction of an applied stress, divided by its original gauge length) is typically greater than $10^{-3}$.

This structure has limitations. It is not conducive to the production of fully-depleted strained-silicon-on-insulator devices in which the layer over the insulating material must be thin enough (<300 angstroms [Å]) to allow for full depletion of the layer during device operation. Fully depleted transistors may be the favored version of SOI for MOSFET technologies beyond the 90 nm technology node. The relaxed SiGe layer adds to the total thickness of this layer and thus makes it difficult to achieve the small thicknesses required for fully depleted SOI device fabrication. The relaxed SiGe layer is not required, however, if a strained Si layer can be produced directly on the insulating material. Thus, there is a need for a method to produce strained silicon—or other semiconductor—layers directly on insulating substrates.

At the same time, a uniformly strained layer may not be preferable for the formation of different types of devices on a single substrate. In addition, a pre-amorphization implant (PAI) that may be performed to improve device characteristics may result in strained layer relaxation, leading to a loss of carrier mobility enhancement.

SUMMARY

The present invention includes a strained-semiconductor-on-insulator (SSOI) substrate structure and methods for fabricating the substrate structure in which strain may be selectively and locally relaxed to improve device operation. MOSFETs fabricated on this substrate will have the benefits of SOI MOSFETs as well as the benefits of strained Si mobility enhancement. By eliminating the SiGe relaxed layer traditionally found beneath the strained Si layer, the use of SSOI technology is simplified. For example, issues such as the diffusion of Ge into the strained Si layer during high temperature processes are avoided.

This approach enables the fabrication of well-controlled, epitaxially-defined, thin strained semiconductor layers directly on an insulator layer. Tensile or compressive strain levels of $\sim 10^{-3}$ or greater are possible in these structures, and are not diminished after thermal anneal cycles. In some embodiments, the strain-inducing relaxed layer is not present in the final structure, eliminating some of the key problems inherent in current strained Si-on-insulator solutions. This fabrication process is suitable for the production of enhanced-mobility substrates applicable to partially or fully depleted SSOI technology.

Further processing of the SSOI substrates may include control of the degree of strain and/or relaxation of portions of the strained layer to improve performance of devices fabricated on the SSOI substrates. Such control may be attained by, e.g., selective PAI and incorporation of strain-inducing stressors.

In an aspect, the invention features a method for forming a structure, the method including forming a strained semiconductor layer over a first substrate. A strained portion of the strained semiconductor layer is masked, and a portion of the strain is selectively relaxed in at least a portion of the strained semiconductor layer to define a relaxed portion of the strained semiconductor layer. The masked strained portion of the strained semiconductor layer remains strained.

One or more of the following features may be included. Selectively relaxing at least a portion of the strain may include performing a pre-amorphization implant by introducing a dose of isoelectronic ions into the strained semiconductor layer, the dose exceeding a critical dose for amorphization. A thickness of the amorphous region may be more than 50% of a thickness of the strained semiconductor layer.

Prior to selectively relaxing at least a portion of the strain, the strained semiconductor layer may be bonded to a dielectric layer disposed on a second substrate.

A first transistor may be formed, including a first channel disposed in the relaxed portion, and a second transistor may be formed, including a second channel disposed in the strained portion. A first strain-inducing stressor may be formed, configured to induce a first type of strain in the first channel, and a second strain-inducing stressor may be formed, configured to induce a second type of strain in the second channel, wherein the first type of strain and the second type of strain are different. The first type of strain may be tensile and the second type of strain may be compressive, or the first type of strain may be compressive and the second type of strain may be tensile.

In another aspect, the invention features a method for forming a structure, the method including providing a substrate comprising a strained semiconductor layer disposed over and contacting a dielectric layer disposed over a semiconductor substrate, the strained semiconductor layer having a first strain. A first transistor, such as a MOSFET or a finFET, is formed, including a channel disposed in a portion of the strained semiconductor layer, and a strain-inducing stressor configured to induce a second strain in the channel. The strain-inducing stressor may be at least one of (i) strain-inducing source and drain regions defined in respective recesses; (ii) an overlayer disposed over a gate of the transistor; (iii) a shallow-trench isolation region; (iv) a gate electrode; (v) metal-semiconductor alloy disposed on at least one of a gate, a source region and a drain region; (vi) a sidewall spacer; (vii) at least one void disposed below at least one of source region, a drain region, and a channel of the transistor; and (viii) a package.

A second transistor may be formed, including a second channel disposed in a second portion of the strained semiconductor layer. The second transistor may further include a second strain-inducing stressor configured to induce a third strain in the second channel. A type of the second strain may be different from a type of the third strain. The first transistor may be an NMOS transistor and the second transistor may be a PMOS transistor. The first channel may be tensilely strained and the second channel may be compressively strained. Alternatively, the first channel may be strained and the second channel may be relaxed.

In another aspect, the invention features a structure including a substrate comprising a substantially strained layer disposed over and contacting a dielectric layer disposed over a semiconductor substrate, the substantially strained layer having a first portion and a second portion. A first transistor has a first strained channel, the first channel disposed in the first portion of the substantially strained layer, and a first strain-inducing stressor inducing only a portion of the strain in the first channel. A second transistor has a second strained channel, the second channel disposed in the second portion of the substantially strained layer. At least one second strain-inducing stressor induces substantially all of the strain in the second channel. The first transistor may be an NMOSFET, and the second transistor may be a PMOSFET. At least one of the first and second transistors may be a finFET.

The type of strain induced by the first strain-inducing stressor may be different from the type of strain induced by the at least one second strain-inducing stressor. The type of strain induced by the first strain-inducing stressor may be tensile and the type of strain induced by the at least one second strain-inducing stressor may be compressive.

The type of strain induced by the first strain-inducing stressor may be compressive and the type of strain induced by the at least one second strain-inducing stressor may be tensile.

The first strain-inducing stressor may be at least one of (i) strain-inducing source and drain regions defined in respective recesses; (ii) an overlayer disposed over a gate of the first transistor; (iii) a shallow-trench isolation region; (iv) a gate electrode; (v) metal-semiconductor alloy disposed on at least one of a gate, a source region, and a drain region; (vi) a sidewall spacer of the first transistor; (vii) at least one void disposed below at least one of source region, a drain region, and a channel of the first transistor; and (viii) a package.

The at least one second strain-inducing stressor may be at least one of (i) strain-inducing source and drain regions defined in respective recesses; (ii) an overlayer disposed over a gate of the second transistor; (iii) a shallow-trench isolation region; (iv) a gate electrode; (v) metal-semiconductor alloy disposed on at least one of a gate, a source region, and a drain region of the second transistor; (vi) a sidewall spacer; (vii) at least one void disposed below at least one of source region, a drain region, and a channel of the second transistor; and (viii) a package.

The type of strain induced by the second strain-inducing stressor may be different from a type of strain in the substantially strained layer.

In another aspect, the invention features a method for forming a structure, the method including providing a substrate comprising a strained semiconductor layer disposed over and contacting a dielectric layer disposed over a semiconductor substrate, the strained semiconductor layer having a first type of strain. A transistor, including a channel disposed in a portion of the strained semiconductor layer, is formed by performing an implant of an isoelectronic species to introduce a plurality of point defects into a region of the strained semiconductor layer. A shallow source and drain implant, and a deep source and drain implant are performed.

One or more of the following features may be included. The point defects may include interstitial defects, and performing the implant may include performing a pre-amorphization implant to introduce at least a critical dose of interstitial defects into the region of the strained semiconductor layer to amorphize the region. The thickness of the amorphous region may be less than 50% of the thickness of the strained semiconductor layer, e.g., less than 25% of the thickness of the strained semiconductor layer.

The amorphized region may be recrystallized. The recrystallized region may have a second type of strain substantially the same as the first type of strain. The first and second types of strain may be tensile strain or compressive strain. The pre-amorphization implant may be performed selectively on the region of the strained semiconductor layer.

Forming the transistor may include defining a strain-inducing stressor that induces strain of a same type as the first strain, e.g., tensile strain or compressive strain.

The point defects may be lattice vacancies and performing the implant may include performing a co-implant to create lattice vacancies in the region of the strained semiconductor layer, the region of the strained semiconductor layer remaining crystalline.

The region of the strained semiconductor layer may include a drain of the transistor and the implant may be performed at an angle of less than 90° with respect to a top surface of the drain. The implant may be performed at a temperature above 25° C.

In another aspect, the invention features a method for forming a structure, the method including providing a substrate including a strained semiconductor layer disposed over and contacting a dielectric layer disposed over a semiconductor substrate, the strained semiconductor layer having a first strain. A first transistor is formed by (i) defining a channel disposed in a portion of the strained semiconductor layer, (ii) removing at least a portion of the strained semiconductor layer proximate the channel to define a recess, and (iii) selectively depositing a conductive material into the recess to define at least a portion of a source or a drain of the first transistor.

One or more of the following features may be included. The conductive material may include at least one of a metal and a doped semiconductor. After deposition of the conductive material, the channel of the first transistor may have a strain of the same type as the first strain.

In another aspect, the invention features a structure including a substrate including a substantially strained layer disposed over and contacting a dielectric layer disposed over a semiconductor substrate. A first transistor has a first strained channel, the first channel disposed in a first portion of the substantially strained layer, and a first stain-inducing stressor inducing a first type of strain in the first channel. A second transistor has a second strained channel, the second channel disposed in a second portion of the substantially strained layer, and a second strain-inducing stressor inducing a second type of strain in the second channel.

One or more of the following features may be included. The first strain may be a same type of strain as the second strain, e.g., tensile strain or compressive strain.

The first strain-inducing stressor may be at least one of (i) strain-inducing source and drain regions defined in respective recesses; (ii) an overlayer disposed over a gate of the first transistor; (iii) a shallow-trench isolation region; (iv) a gate electrode; (v) metal-semiconductor alloy disposed on at least one of a gate, a source region, and a drain region; (vi) a sidewall spacer of the first transistor; (vii) at least one void disposed below at least one of source region, a drain region, and a channel of the first transistor; and (viii) a package.

The at least one second strain-inducing stressor may be at least one of (i) strain-inducing source and drain regions defined in respective recesses; (ii) an overlayer disposed over a gate of the second transistor; (iii) a shallow-trench isolation region; (iv) a gate electrode; (v) metal-semiconductor alloy disposed on at least one of a gate, a source region, and a drain region of the second transistor; (vi) a sidewall spacer; (vii) at least one void disposed below at least one of source region, a drain region, and a channel of the second transistor; and (viii) a package.

The first transistor may be an NMOSFET and the second transistor may be a PMOSFET. At least one of the first and second transistors may be a finFET. The first stress-inducing stressor may induce only a portion of the strain in the first channel and the second stress-inducing stressor may induce only a portion of the strain in the second channel.

Like-referenced features represent common features in corresponding drawings.

DETAILED DESCRIPTION

An SSOI structure may be formed by wafer bonding followed by cleaving. FIGS. 1A-2B illustrate formation of a suitable strained layer on a wafer for bonding, as further described below.

Figure 1A:
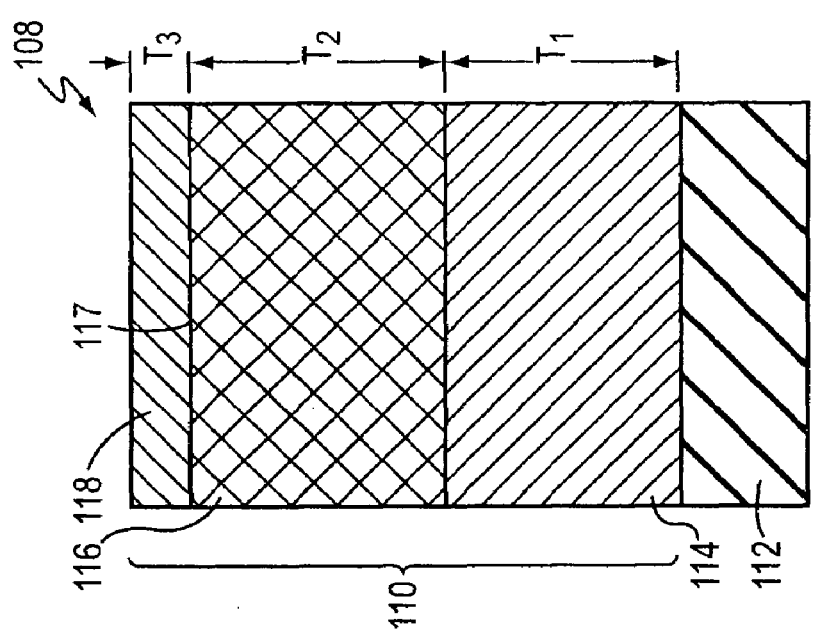
FIGS. 1A, 1B, 2A, 2B, and 3-6 are schematic cross-sectional views of substrates illustrating a method for fabricating an SSOI substrate.

Referring to FIG. 1A, an epitaxial wafer 108 has a plurality of layers 110 disposed over a substrate 112. Substrate 112 may be formed of a semiconductor, such as Si, Ge, or SiGe. The layers 110 include a graded buffer layer 114, which may be formed of $Si_{1-y}Ge_y$, with a maximum Ge content of, e.g., 10-80% (i.e., y=0.1-0.8) and a thickness $T_1$ of, for example, 1-8 micrometers (μm).

A relaxed layer 116 is disposed over graded buffer layer 114. Relaxed layer 116 may be formed of uniform $Si_{1-x}Ge_x$ having a Ge content of, for example, 10-80% (i.e., x=0.1-0.8), and a thickness $T_2$ of, for example, 0.2-2 μm. In some embodiments, $Si_{1-x}Ge_x$ may include $Si_{0.70}Ge_{0.30}$ and $T_2$ may be approximately 1.5 μm. Relaxed layer 116 may be fully relaxed, as determined by triple axis X-ray diffraction, and may have a threading dislocation density of $<10^6$ dislocations/cm$^2$, as determined by etch pit density (EPD) analysis. Because threading dislocations are linear defects disposed within a volume of crystalline material, threading dislocation density may be measured as either the number of dislocations intersecting a unit area within a unit volume or the line length of dislocation per unit volume. Threading dislocation density therefore, may, be expressed in either units of dislocations/cm$^2$ or cm/cm$^3$. Relaxed layer 116 may have a surface particle density of, e.g., less than about 0.3 particles/cm$^2$. Further, a relaxed layer 116 produced in accordance with the present invention may have a localized light-scattering defect level of less than about 0.3 defects/cm$^2$ for particle defects having a size (diameter) greater than 0.13 μm, a defect level of about 0.2 defects/cm$^2$ for particle defects having a size greater than 0.16 μm, a defect level of about 0.1 defects/cm$^2$ for particle defects having a size greater than 0.2 μm, and a defect level of about 0.03 defects/cm$^2$ for defects having a size greater than 1 μm. Conventional process optimization may enable reduction of the localized light-scattering defect levels to about 0.09 defects/cm$^2$ for particle defects having a size greater than 0.09 μm and to 0.05 defects/cm$^2$ for particle defects having a size greater than 0.12 μm.

Substrate 112, graded layer 114, and relaxed layer 116 may be formed from various materials systems, including various combinations of group II, group III, group IV, group V, and group VI elements. For example, each of substrate 112, graded layer 114, and relaxed layer 116 may include or consist essentially of a III-V compound. Substrate 112 may include or consist essentially of gallium arsenide (GaAs), graded layer 114 and relaxed layer 116 may include or consist essentially of indium gallium arsenide (InGaAs) or aluminum gallium arsenide (AlGaAs). These examples are merely illustrative, and many other material systems are suitable.

A strained semiconductor layer 118 is disposed over relaxed layer 116. Strained layer 118 may include or consist essentially of a semiconductor such as at least one of a group II, a group III, a group IV, a group V, and a group VI element. Strained semiconductor layer 118 may include or consist essentially of, for example, Si, Ge, SiGe, GaAs, indium phosphide (InP), and/or zinc selenide (ZnSe). In some embodiments, strained semiconductor layer 118 may include approximately 100% Ge, and may be compressively strained. Strained semiconductor layer 118 comprising 100% Ge may be formed over, e.g., relaxed layer 116 containing uniform $Si_{1-x}Ge_x$ having a Ge content of, for example, 50-80% (i.e., x=0.5-0.8), preferably 70% (x=0.7). Strained layer 118 has a thickness $T_3$ of, for example, 50-1000 Å. In an embodiment, $T_3$ may be approximately 200-500 Å.

Strained layer 118 may be formed by epitaxy, such as by atmospheric-pressure CVD (APCVD), low- (or reduced-) pressure CVD (LPCVD), ultra-high-vacuum CVD (UH-VCVD), by molecular beam epitaxy (MBE), or by atomic layer deposition (ALD). Strained layer 118 containing Si may be formed by CVD with precursors such as silane, disilane, or trisilane. Strained layer 118 containing Ge may be formed by CVD with precursors such as germane or digermane. The epitaxial growth system may be a single-wafer or multiple-wafer batch reactor. The growth system may also utilize a low-energy plasma to enhance layer growth kinetics. Strained layer 118 may be formed at a relatively low temperature, e.g., less than 700° C., to facilitate the definition of an abrupt interface 117 between strained layer 118 and relaxed layer 116. This abrupt interface 117 may enhance the subsequent separation of strained layer 118 from relaxed layer 116, as discussed below with reference to FIGS. 4 and 5. Abrupt interface 117 is characterized by the transition of Si or Ge content (in this example) proceeding in at least 1 decade (order of magnitude in atomic concentration) per nanometer of depth into the sample. In an embodiment, this abruptness may be better than 2 decades per nanometer.

In an embodiment in which strained layer 118 contains substantially 100% Si, strained layer 118 may be formed in a dedicated chamber of a deposition tool that is not exposed to Ge source gases, thereby avoiding cross-contamination and improving the quality of the interface between strained layer 118 and relaxed layer 116. Furthermore, strained layer 118 may be formed from an isotopically pure silicon precursor(s). Isotopically pure Si has better thermal conductivity than conventional Si. Higher thermal conductivity may help dissipate heat from devices subsequently formed on strained layer 118, thereby maintaining the enhanced carrier mobilities provided by strained layer 118.

After formation, strained layer 118 has an initial misfit dislocation density, of, for example, $0-10^5$ cm/cm$^2$. In an embodiment, strained layer 118 has an initial misfit dislocation density of approximately 0 cm/cm$^2$. Because misfit dislocations are linear defects generally lying within a plane between two crystals within an area, they may be measured in terms of total line length per unit area. Misfit dislocation density, therefore, may be expressed in units of dislocations/cm or cm/cm$^2$. In one embodiment, strained layer 118 is tensilely strained, e.g., Si formed over SiGe. In another embodiment, strained layer 118 is compressively strained, e.g., Ge formed over SiGe.

Strained layer 118 may have a surface particle density of, e.g., less than about 0.3 particles/cm$^2$. As used herein, "surface particle density" includes not only surface particles but also light-scattering defects, and crystal-originated pits (COPs), and other defects incorporated into strained layer 118. Further, strained layer 118 produced in accordance with the present invention may have a localized light-scattering defect level of less than about 0.3 defects/cm$^2$ for particle defects having a size (diameter) greater than 0.13 µm, a defect level of about 0.2 defects/cm$^2$ for particle defects having a size greater than 0.16 µm, a defect level of about 0.1 defects/cm$^2$ for particle defects having a size greater than 0.2 µm, and a defect level of about 0.03 defects/cm$^2$ for defects having a size greater than 1 µm. Process optimization may enable reduction of the localized light-scattering defect levels to about 0.09 defects/cm$^2$ for particle defects having a size greater than 0.09 µm and to 0.05 defects/cm$^2$ for particle defects having a size greater than 0.12 µm. These surface particles may be incorporated in strained layer 118 during the formation of strained layer 118, or they may result from the propagation of surface defects from an underlying layer, such as relaxed layer 116.

In alternative embodiments, graded layer 114 may be absent from the structure. Relaxed layer 116 may be formed in various ways, and the invention is not limited to embodiments having graded layer 114. In other embodiments, strained layer 118 may be formed directly on substrate 112. In this case, the strain in layer 118 may be induced by lattice mismatch between layer 118 and substrate 112; or induced mechanically, e.g., by the deposition of overlayers, such as $Si_3N_4$; or induced by thermal mismatch between layer 118 and a subsequently grown layer, such as a SiGe layer. In some embodiments, a uniform semiconductor layer (not shown), having a thickness of approximately 0.5 µm and comprising the same semiconductor material as substrate 112, is disposed between graded buffer layer 114 and substrate 112. This uniform semiconductor layer may be grown to improve the material quality of layers subsequently grown on substrate 112, such as graded buffer layer 114, by providing a clean, contaminant-free surface for epitaxial growth. In certain embodiments, relaxed layer 116 may be planarized prior to growth of strained layer 118 to eliminate the crosshatched surface roughness induced by graded buffer layer 114. (See, e.g., M. T. Currie, et al., *Appl. Phys. Lett.*, 72 (14) p. 1718 (1998), incorporated herein by reference.) The planarization may be performed by a method such as chemical mechanical polishing (CMP), and may improve the quality of a subsequent bonding process (see below) because it minimizes the wafer surface roughness and increases wafer flatness, thus providing a greater surface area for bonding.

Figure 1B:
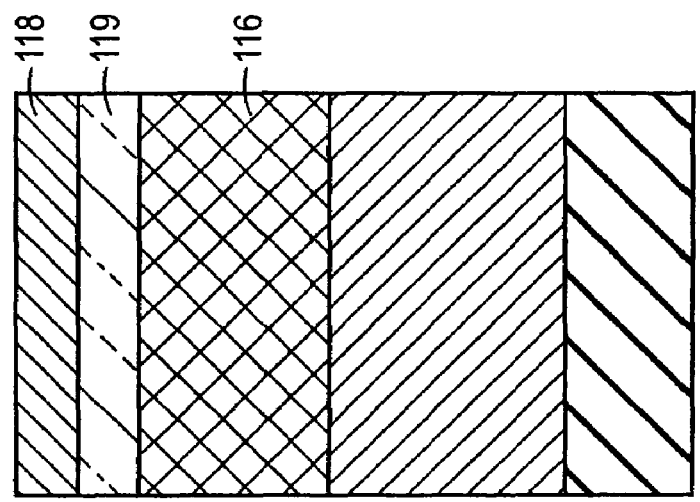

Referring to FIG. 1B, after planarization of relaxed layer 116, a relaxed semiconductor regrowth layer 119 including a semiconductor such as SiGe may be grown on relaxed layer 116, thus improving the quality of subsequent strained layer 118 growth by ensuring a clean surface for the growth of strained layer 118. Growing on this clean surface may be preferable to growing strained material, e.g., silicon, on a surface that is possibly contaminated by oxygen and carbon from the planarization process. The conditions for epitaxy of the relaxed semiconductor regrowth layer 119 on the planarized relaxed layer 116 should be chosen such that surface roughness of the resulting structure, including layers formed over regrowth layer 119, is minimized to ensure a surface suitable for subsequent high quality bonding. High quality bonding may be defined as the existence of a bond between two wafers that is substantially free of bubbles or voids at the interface. Measures that may help ensure a smooth surface for strained layer 118 growth, thereby facilitating bonding, include substantially matching a lattice of the semiconductor regrowth layer 119 to that of the underlying relaxed layer 116, by keeping the regrowth thickness below approximately 1 µm, and/or by keeping the growth emperature below approximately 850° C. for at least a portion of the semiconductor layer 119 growth. It may also be advantageous for relaxed layer 116 to be substantially free of particles or areas with high threading dislocation densities (i.e., threading dislocation pile-ups) which could induce non-planarity in the regrowth and decrease the quality of the subsequent bond.

Figure 2B:
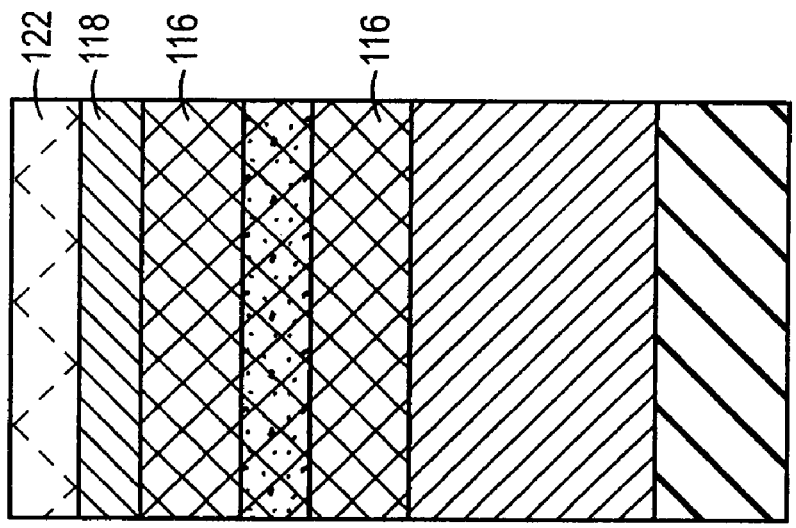
Figure 2A:
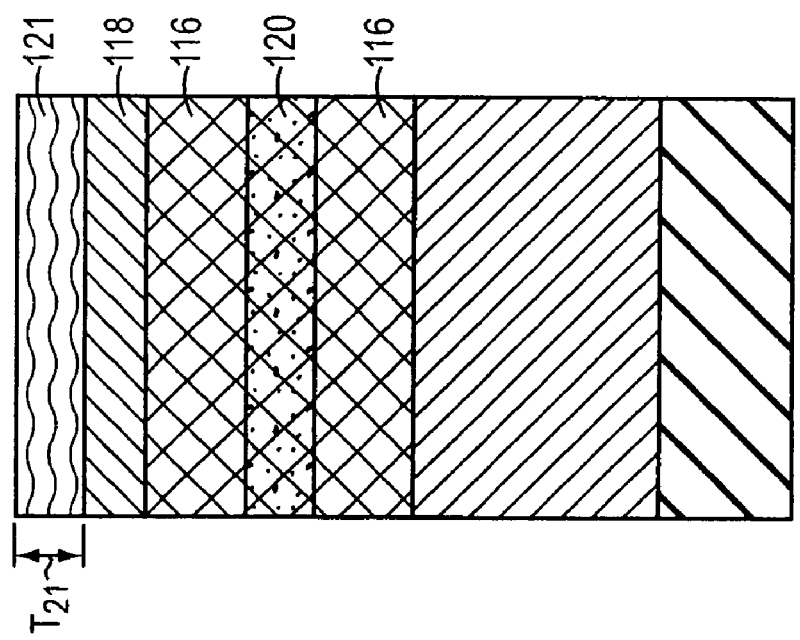

Referring to FIG. 2A, in an embodiment, hydrogen ions are implanted into relaxed layer 116 to define a cleave plane

120. This implantation is similar to the SMARTCUT process that has been demonstrated in silicon by, e.g., SOITEC, S. A., based in Grenoble, France. Implantation parameters may include implantation of hydrogen ($H_2^+$) to a dose of 2.5-5× $10^{16}$ ions/cm$^2$ at an energy of, e.g., 50-100 keV. For example, $H_2^+$ may be implanted at an energy of 75 keV and a dose of 4×10$^{16}$ ions/cm$^2$ through strained layer 118 into relaxed layer 116. In alternative embodiments, it may be favorable to implant at energies less than 50 keV to decrease the depth of cleave plane 120 and decrease the amount of material subsequently removed during the cleaving process (see discussion below with reference to FIG. 4). In an alternative embodiment, other implanted species may be used, such as $H^+$ or $He^+$, with the dose and energy being adjusted accordingly. The implantation may also be performed prior to the formation of strained layer 118. Then, the subsequent growth of strained layer 118 is preferably performed at a temperature low enough to prevent premature cleaving along cleave plane 120, i.e., prior to the wafer bonding process. This cleaving temperature is a complex function of the implanted species, implanted dose, and implanted material. Typically, premature cleaving may be avoided by maintaining a growth temperature below approximately 500° C.

Figure 3:
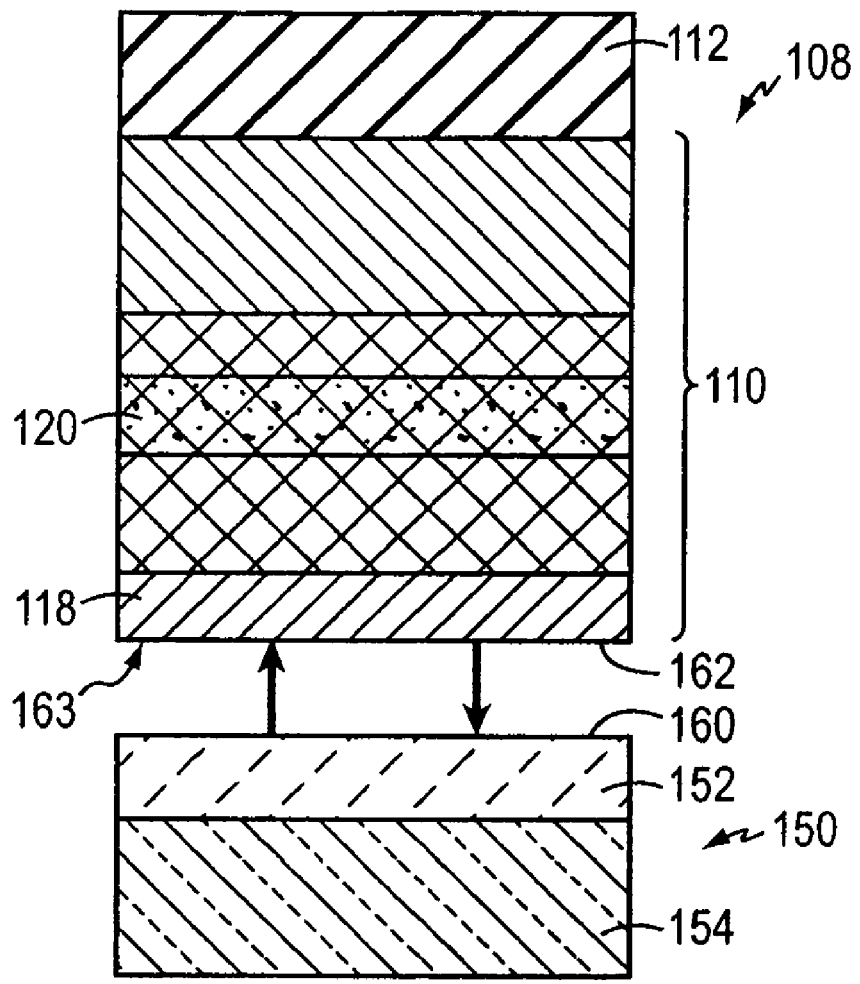

In some embodiments, such as when strained layer 118 comprises nearly 100% Ge, a thin layer 121 of another material, such as Si, may be formed over strained layer 118 prior to bonding (see discussion with respect to FIG. 3). This thin layer 121 may be formed to enhance subsequent bonding of strained layer 118 to an insulator, such as an oxide. Thin layer 121 may have a thickness $T_{21}$ of, for example, 0.5-5 nm.

In some embodiments, strained layer 118 may be planarized by, e.g., CMP, to improve the quality of the subsequent bond. Strained layer 118 may have a low surface roughness, e.g., less than 0.5 nm root mean square (RMS). Referring to FIG. 2B, in some embodiments, a dielectric layer 122 may be formed over strained layer 118 prior to ion implantation into relaxed layer 116 to improve the quality of the subsequent bond. Dielectric layer 122 may be, e.g., silicon dioxide ($SiO_2$) deposited by, for example, LPCVD or by high density plasma (HDP). An LPCVD deposited $SiO_2$ layer may be subjected to a densification step at elevated temperature. Suitable conditions for this densification step may be, for example, a 10 minute anneal at 800° C. in a nitrogen ambient. Alternatively, dielectric layer 122 may include low-temperature oxide (LTO), which may be subsequently densified at elevated temperature in nitrogen or oxygen ambients. Suitable conditions for this densification step can be a 10 minute anneal at 800° C. in an oxygen ambient. Dielectric layer 122 may be planarized by, e.g., CMP to improve the quality of the subsequent bond. In an alternative embodiment, it may be advantageous for dielectric layer 122 to be formed from thermally grown $SiO_2$ in order to provide a high quality semiconductor/dielectric interface in the final structure. In an embodiment, strained layer 118 comprises approximately 100% Ge and dielectric layer 122 comprises, for example, germanium dioxide ($GeO_2$); germanium oxynitride (GeON); a high-k insulator having a higher dielectric constant than that of Si such as hafnium oxide ($HfO_2$) or hafnium silicate (HfSiON, $HfSiO_4$); or a multilayer structure including $GeO_2$ and $SiO_2$. Ge has an oxidation behavior different from that of Si, and the deposition methods may be altered accordingly.

Referring to FIG. 3, epitaxial wafer 108 is bonded to a handle wafer 150. Either handle wafer 150, epitaxial wafer 108, or both have a top dielectric layer (see, e.g., dielectric layer 122 in FIG. 2B) to facilitate the bonding process and to serve as an insulator layer in the final substrate structure. Handle wafer 150 may have a dielectric layer 152 disposed over a semiconductor substrate 154. Dielectric layer 152 may include or consist essentially of, for example, $SiO_2$. In an embodiment, dielectric layer 152 includes a material having a melting point ($T_m$) higher than a $T_m$ of pure $SiO_2$, i.e., higher than 1700° C. Examples of such materials are silicon nitride ($Si_3N_4$), aluminum oxide, magnesium oxide, etc. Using dielectric layer 152 with a high $T_m$ helps prevents possible relaxation of the transferred strained semiconductor layer 118 that may occur during subsequent processing, due to softening of the underlying dielectric layer 152 at temperatures typically used during device fabrication (approximately 1000-1200° C.). In other embodiments, handle wafer 150 may include a combination of a bulk semiconductor material and a dielectric layer, such as an SOI substrate. Semiconductor substrate 154 includes or consists essentially of a semiconductor material such as, for example, Si, Ge, or SiGe.

Handle wafer 150 and epitaxial wafer 108 are cleaned by a wet chemical cleaning procedure to facilitate bonding, such as by a hydrophilic surface preparation process to assist the bonding of a semiconductor material, e.g., strained layer 118, to a dielectric material, e.g., dielectric layer 152. For example, a suitable prebonding surface preparation cleaning procedure may include a modified megasonic RCA SC1 clean containing ammonium hydroxide, hydrogen peroxide, and water ($NH_4OH:H_2O_2:H_2O$) at a ratio of 1:4:20 at 60° C. for 10 minutes, followed by a deionized (DI) water rinse and spin dry. The wafer bonding energy should be strong enough to sustain the subsequent layer transfer (see FIG. 4). In some embodiments, top surfaces 160, 162 of handle wafer 150 and epitaxial wafer 108, including a top surface 163 of strained semiconductor layer 118, may be subjected to a plasma activation, either before, after, or instead of a wet clean, to increase the bond strength. The plasma environment may include at least one of the following species: oxygen, ammonia, argon, nitrogen, diborane, and phosphine. After an appropriate cleaning step, handle wafer 150 and epitaxial wafer 108 are bonded together by bringing top surfaces 160, 162 in contact with each other at room temperature. The bond strength may be greater than 1000 mJ/m$^2$, achieved at a low temperature, such as less than 600° C.

Figures 4, 5, 6:
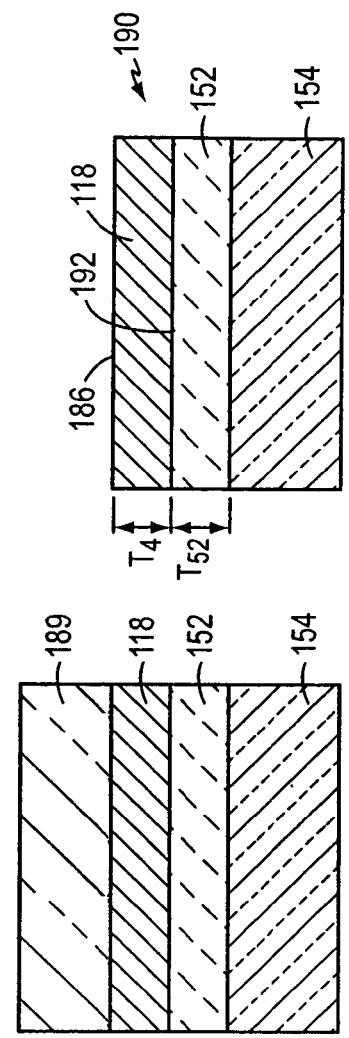

Referring to FIG. 4 as well as to FIG. 3, a split is induced at cleave plane 120 by annealing handle wafer 150 and epitaxial wafer 108 after they are bonded together. This split may be induced by an anneal at 300-700° C., e.g., 550° C., inducing hydrogen exfoliation layer transfer (i.e., along cleave plane 120) and resulting in the formation of two separate wafers 170, 172. One of these wafers (i.e., wafer 170) has a first portion 180 of relaxed layer 116 (see FIG. 1A) disposed over strained layer 118. Strained layer 118 is in contact with dielectric layer 152 on semiconductor substrate 154. The other of these wafers (i.e., wafer 172) includes substrate 112, graded layer 114, and a remaining portion 182 of relaxed layer 116. In some embodiments, wafer splitting may be induced by mechanical force in addition to or instead of annealing. If necessary, wafer 170 with strained layer 118 may be annealed further at 600-900° C., e.g., at a temperature greater than 800° C., to strengthen the bond between the strained layer 118 and dielectric layer 152. In some embodiments, this anneal is limited to an upper temperature of about 900° C. to avoid the destruction of a strained Si/relaxed SiGe heterojunction by diffusion. Wafer 172 may be planarized, and used as starting substrate 8 for growth of another strained layer 118. In this manner, wafer 172 may be "recycled" and the process illustrated in FIGS. 1A-5 may be repeated. An alternative "recycling" method may include providing relaxed layer 116 that is several μm thick and repeating the process illustrated in FIGS. 1A-5, starting with the formation of strained layer 118. Because the formation of this thick relaxed layer 116 may lead to bowing of substrate 112, a layer including, e.g., oxide or nitride, may be formed on the backside of substrate 112 to counteract the bowing. Alternatively substrate 112 may be pre-bowed when cut and polished, in anticipation of the bow being removed by the formation of thick relaxed layer 116.

Referring to FIG. 4 as well as to FIG. 5, relaxed layer portion 180 is removed from strained layer 118. In an embodiment, removal of relaxed layer portion 180, containing, e.g., SiGe, includes oxidizing the relaxed layer portion 180 by wet (steam) oxidation. For example, at temperatures below approximately 800° C., such as temperatures between 600-750° C., wet oxidation will oxidize SiGe much more rapidly then Si, such that the oxidation front will effectively stop when it reaches the strained layer 118, in embodiments in which strained layer 118 includes Si. The difference between wet oxidation rates of SiGe and Si may be even greater at lower temperatures, such as approximately 400° C.-600° C. Good oxidation selectivity is provided by this difference in oxidation rates, i.e., SiGe may be efficiently removed at low temperatures with oxidation stopping when strained layer 118 is reached. This wet oxidation results in the transformation of SiGe to a thermal insulator 184, e.g., $Si_xGe_yO_z$. The thermal insulator 184 resulting from this oxidation is removed in a selective wet or dry etch, e.g., wet hydrofluoric acid. In some embodiments, it may be more economical to oxidize and strip several times, instead of just once.

In certain embodiments, wet oxidation may not completely remove the relaxed layer portion 180. Here, a localized rejection of Ge may occur during oxidation, resulting in the presence of a residual Ge-rich SiGe region at the oxidation front, on the order of, for example, several nanometers in lateral extent. A surface clean may be performed to remove this residual Ge. For example, the residual Ge may be removed by a dry oxidation at, e.g., 600° C., after the wet oxidation and strip described above. Another wet clean may be performed in conjunction with—or instead of—the dry oxidation. Examples of possible wet etches for removing residual Ge include a Piranha etch, i.e., a wet etch that is a mixture of sulfuric acid and hydrogen peroxide ($H_2SO_4$:$H_2O_2$) at a ratio of, for example, 3:1. An HF dip may be performed after the Piranha etch. Alternatively, an RCA SC1 clean may be used to remove the residual Ge. The process of Piranha or RCA SC1 etching and HF removal of resulting oxide may be repeated more than once. In an embodiment, relaxed layer portion including, e.g., SiGe, is removed by etching and annealing under a hydrochloric acid (HCl) ambient.

In the case of a strained Si layer, the surface Ge concentration of the final strained Si surface is preferably less than about $10^{12}$ atoms/cm$^2$ when measured by a technique such as total reflection x-ray fluorescence (TXRF) or the combination of vapor phase decomposition (VPD) with a spectroscopy technique such as graphite furnace atomic absorption spectroscopy (GFAAS) or inductively-coupled plasma mass spectroscopy (ICP-MS). In some embodiments, after cleaving, a planarization step or a wet oxidation step may be performed to remove a portion of the damaged relaxed layer portion 180 as well as to increase the smoothness of its surface. A smoother surface may improve the uniformity of subsequent complete removal of a remainder of relaxed layer portion 180 by, e.g., wet chemical etching. After removal of relaxed layer portion 180, strained layer 118 may be planarized. Planarization of strained layer 118 may be performed by, e.g., CMP; an anneal at a temperature greater than, for example, 800° C., in a hydrogen ($H_2$) or hydrochloric acid (HCl) containing ambient; or cluster ion beam smoothing.

Referring to FIG. 6, an SSOI substrate 190 has strained layer 118 disposed over an insulator, such as dielectric layer 152 formed on semiconductor substrate 154. Strained layer 118 has a thickness $T_4$ selected from a range of, for example, 50-1000 Å, with a thickness uniformity of better than approximately ±5% and a surface roughness of less than approximately 20 Å. Dielectric layer 152 has a thickness $T_{52}$ selected from a range of, for example, 500-3000 Å. In an embodiment, strained layer 118 includes approximately 100% Si or 100% Ge having one or more of the following material characteristics: misfit dislocation density of, e.g., 0-$10^5$ cm/cm$^2$; a threading dislocation density of about $10$ - $10^7$ dislocations/cm$^2$; a surface roughness of approximately 0.01-1 nm RMS; and a thickness uniformity across SSOI substrate 190 of better than approximately ±10% of a mean desired thickness; and a thickness $T_4$ of less than approximately 200 Å. In an embodiment, SSOI substrate 190 has a thickness uniformity of better than approximately ±5% of a mean desired thickness.

In an embodiment, dielectric layer 152 has a $T_m$ greater than that of $SiO_2$. During subsequent processing, e.g., MOSFET formation, SSOI substrate 190 may be subjected to high temperatures, i.e., up to 1100° C. High temperatures may result in the relaxation of strained layer 118 at an interface between strained layer 118 and dielectric layer 152. The use of dielectric layer with a $T_m$ greater than 1700° C. may help keep strained layer 118 from relaxing at the interface between strained layer 118 and dielectric layer 152 when SSOI substrate is subjected to high temperatures.

In an embodiment, the misfit dislocation density of strained layer 118 may be lower than its initial dislocation density. The initial dislocation density may be lowered by, for example, performing an etch of a top surface 186 of strained layer 118. This etch may be a wet etch, such as a standard microelectronics clean step such as an RCA SC1, i.e., hydrogen peroxide, ammonium hydroxide, and water ($H_2O_2$+$NH_4OH$+$H_2O$), which at, e.g., 80° C. may remove silicon.

The presence of surface particles on strained layer 118, as described above with reference to FIG. 1A, may result in the formation of bonding voids at an interface 192 between strained layer 118 and dielectric layer 152. These bonding voids may have a density equivalent to the density of surface particles formed on strained layer 118, e.g., less than about 0.3 voids/cm$^2$.

In some embodiments, strained semiconductor layer 118 includes or consists essentially of Si and is substantially free of Ge; further, any other layer disposed in contact with strained semiconductor layer 118 prior to device processing, e.g., dielectric layer 152, is also substantially free of Ge.

Figure 7:
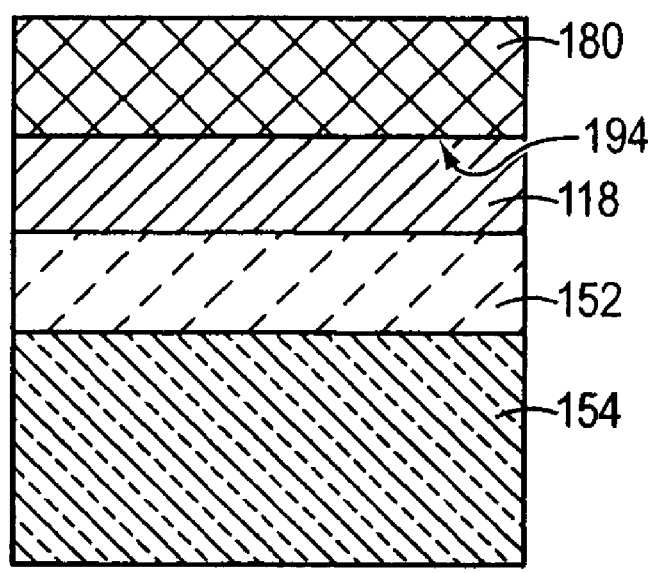
FIG. 7 is a schematic cross-sectional view illustrating an alternative method for fabricating the SSOI substrate illustrated in FIG. 6.

Referring to FIG. 7, in an alternative embodiment, relaxed layer portion 180 may be removed by a selective wet etch that stops at the strained layer 118 to obtain SSOI substrate 190 (see FIG. 6). In embodiments in which relaxed layer portion 180 contains SiGe, a suitable selective SiGe wet etch may be a solution containing nitric acid ($HNO_3$) and dilute HF at a ratio of 3:1 or a solution containing $H_2O_2$, HF, and acetic acid ($CH_3COOH$) at a ratio of 2:1:3. Alternatively, relaxed layer portion 180 may be removed by a dry etch that stops at strained layer 118. In some embodiments, relaxed layer portion 180 may be removed completely or in part by a chemical-mechanical polishing step or by mechanical grinding.

SSOI substrate 190 may be further processed by CMOS SOI MOSFET fabrication methods. During processing, some portions of substantially strained layer 118 may be unintentionally relaxed slightly, for example, during the patterning of the strained layer 118 into smaller regions, such as by the definition shallow trench isolation regions. Some elastic relaxation may occur in some portions of the strained layer 118, particularly near the edges of the smaller defined regions. As used herein, "strained layer 118" may include such unintentionally relaxed portions, as well as intentionally relaxed portions, as discussed below with reference to FIGS. 14-25.

Figure 8A:
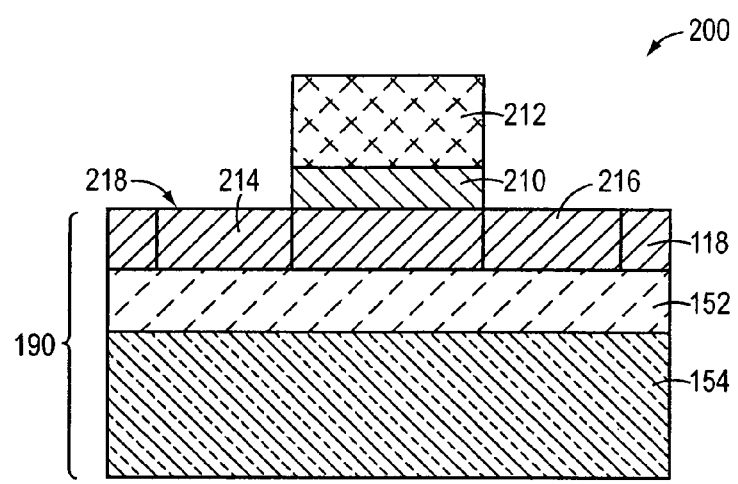
FIG. 8 is a schematic cross-sectional view of a transistor formed on the SSOI substrate illustrated in FIG. 6.

Referring to FIG. 8A, a transistor 200 may be formed on SSOI substrate 190. Forming transistor 200 includes forming a gate dielectric layer 210 above strained layer 118 by, for example, growing an $SiO_2$ layer by thermal oxidation. Alternatively, gate dielectric layer 210 may include or consist essentially of a high-k material with a dielectric constant higher than that of $SiO_2$, such as $HfO_2$, HfSiON, or $HfSiO_4$. In some embodiments, gate dielectric layer 210 may be a stacked structure, e.g., a thin $SiO_2$ layer capped with a high-k material. A gate 212 is formed over gate dielectric layer 210. Gate 212 may be formed of a conductive material, such as doped semiconductor, e.g., polycrystalline Si or polycrystalline SiGe; a metal, e.g., titanium (Ti), tungsten (W), molybdenum (Mo), tantalum (Ta), nickel (Ni), or iridium (Ir); or metal compounds, e.g., titanium nitride (TiN), titanium silicon nitride (TiSiN), tungsten nitride (WN), tantalum nitride (TaN), tantalum silicide (TaSi), nickel silicide (NiSi), or iridium oxide ($IrO_2$), that provide an appropriate workfunction. A source region 214 and a drain region 216 are formed in a portion 218 of strained semiconductor layer 118, proximate gate dielectric layer 210. Source and drain regions 214, 216 may be formed by, e.g., ion implantation of either n-type or p-type dopants.

In some embodiments, strained semiconductor layer 118 may be compressively strained when, for example, layer 118 includes strained Ge. Compressively strained layers may be prone to undulation when subjected to large temperature changes. The risk of such undulation may be reduced by reducing the thermal budget of a process for fabricating devices, such as transistor 200. The thermal budget may reduced by, for example, using ALD to deposit gate dielectric layer 210. Furthermore, a maximum temperature for forming gate 212 may be limited to, e.g., 600° C. by, for example, the use of materials comprising metal or metal compounds, rather than polysilicon or other gate materials that may require higher formation and/or dopant activation temperatures.

Figure 8B:
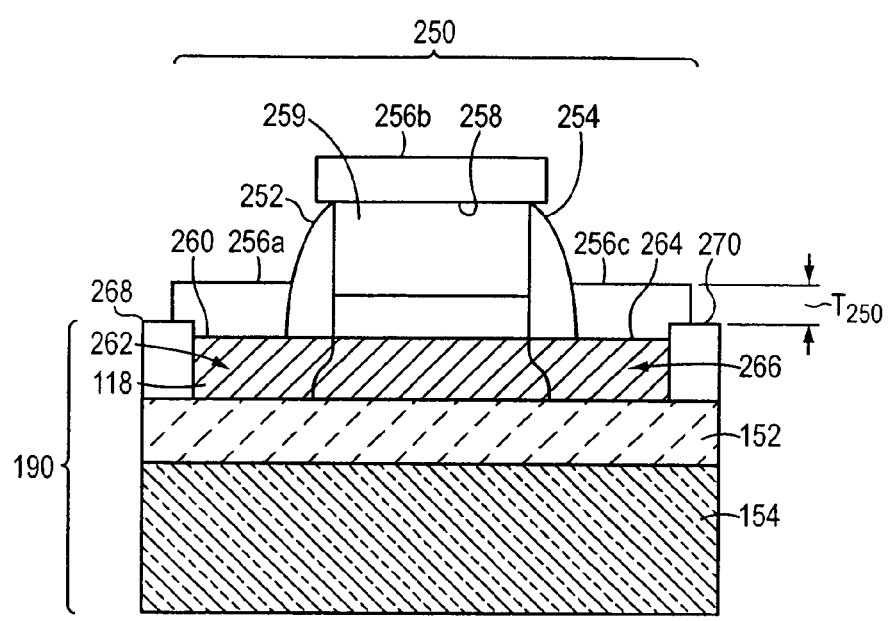

Referring to FIG. 8B, a transistor 250 formed on SSOI substrate 190 may have an elevated source region and an elevated drain region proximate a first and a second sidewall spacer 252, 254. These elevated regions may be formed as follows. A semiconductor layer 256a-256c is formed selectively on exposed silicon surfaces, i.e., on top surface 258 of a gate 259 containing silicon, a top surface 260 of a source 262 defined in strained layer 118, and a top surface 264 of a drain 266 defined in strained layer 118. In an embodiment, semiconductor layer 256a-256c is an epitaxial layer, such as epitaxial silicon, epitaxial germanium, or epitaxial silicon-germanium. No semiconductor layer is formed on non-silicon features, such as sidewall spacers 252, 254 and dielectric isolation regions 268, 270. Semiconductor layer 256a-256c has a thickness $T_{256}$ of, for example, approximately 100-500 Å.

Semiconductor layer 256a-256c has a low resistivity of, e.g., 0.001 Ω-cm, that facilitates the formation of low-resistance contacts. To achieve this low resistivity, semiconductor layer 256a-256c is, for example, epitaxial silicon doped with, for example, arsenic to a concentration of $10^{20}$ atoms/$cm^3$. Semiconductor layer 256a-256c may be doped in situ, during deposition. In alternative embodiments, semiconductor layer 256a-256c may be doped after deposition by ion implantation or by gas-, plasma- or solid-source diffusion. In some embodiments, the doping of semiconductor layer 256a-256c and the formation of source 262 and drain 266 are performed simultaneously. Portions of semiconductor layer 256a, 256c disposed over source 262 and drain 266 may have top surfaces substantially free of facets. In an embodiment, portions of source 262, drain 266, and/or gate 259 may be etched away to define recess prior to deposition of semiconductor layer 256a-256c, and semiconductor layer 256a-256c may then be deposited in the recesses thus formed.

Figure 8C:
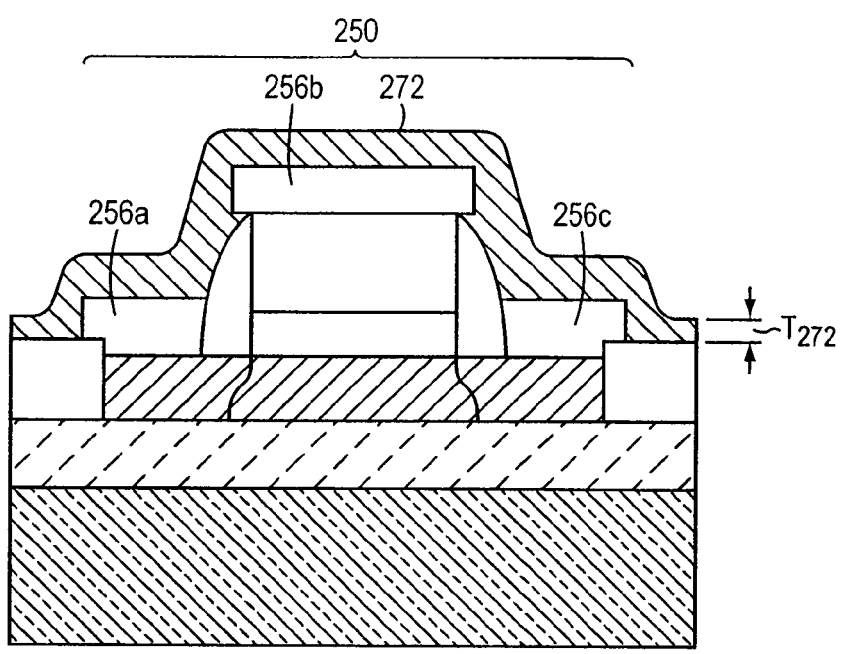

Referring to FIG. 8C, a metal layer 272 is formed over transistor 250. Metal layer 272 is formed by, for example, sputter deposition. Metal layer 272 has a thickness $T_{272}$ of, e.g., 50-200 Å and includes or consists essentially of a metal such as cobalt, titanium, tungsten, nickel, or platinum. The metal is selected to react with semiconductor layer 256a-256c to form a low-resistance metal-semiconductor alloy when exposed to heat, as described below. The metal is also selected such that the metal-semiconductor alloy remains stable at temperatures typically required to complete transistor 250 fabrication, e.g., 400-700° C.

Figure 8D:
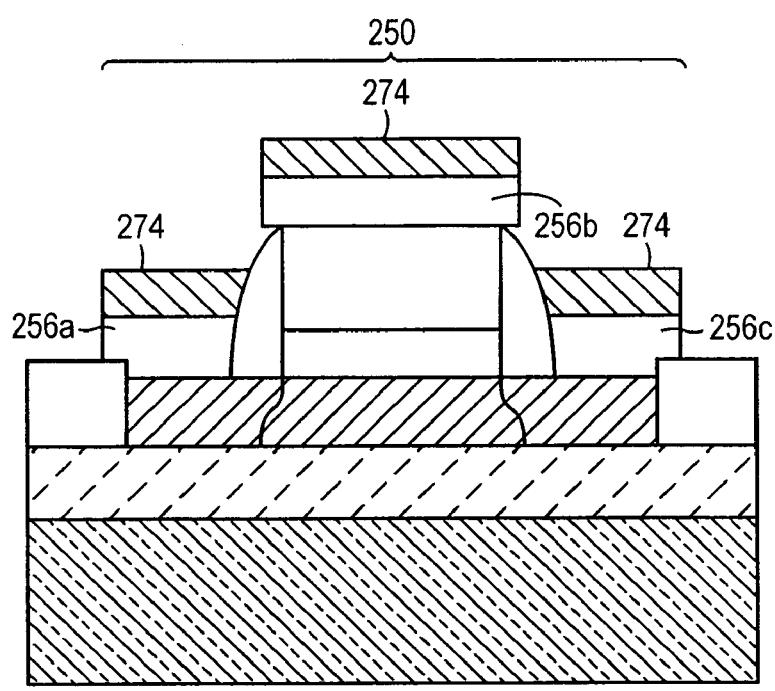

Referring also to FIG. 8D, subsequent to deposition of metal layer 272, a first rapid thermal anneal is performed, e.g., at 550° C. for 60 seconds. This heating step initiates a reaction between metal layer 272 and semiconductor layers 256a-256c, forming a high resistivity phase of a metal-semiconductor alloy, e.g., cobalt silicide (CoSi). Portions of metal layer 272 are removed by a wet etch, such as sulfuric acid and hydrogen peroxide. In an alternative embodiment, the wet etch may be ammonium hydroxide, peroxide, and water. This wet etch removes portions of metal layer 272 disposed over dielectric material, such as over first and second sidewall spacers 252, 254 and isolation regions 268, 270. Portions 274 of metal layer 272 disposed over semiconductor layer 256a-256c that have reacted to form the metal-semiconductor alloy remain in place after the anneal and wet etch.

Figure 8E:
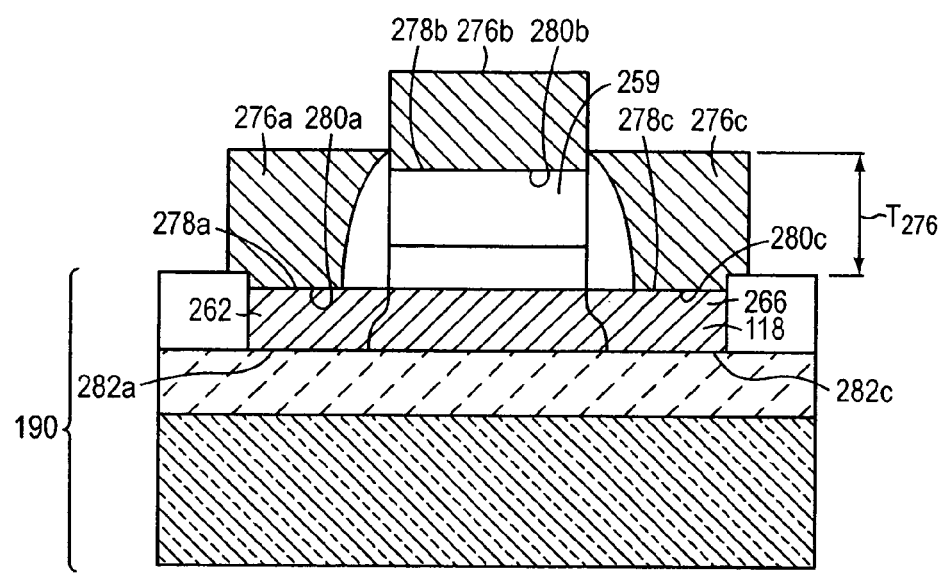

Referring to FIG. 8E, SSOI substrate 190, including transistor 250, is subjected to a second heat treatment. For example, in an embodiment in which metal layer 272 includes cobalt, SSOI substrate 190 undergoes a rapid thermal anneal at 800° C. for 60 seconds in a nitrogen ambient. This heating step initiates a reaction in the metal-semiconductor alloy layer which substantially lowers its resistivity, to form a substantially homogeneous contact layer 276a-276c. Contact layer 276a-276c includes or consists essentially of a metal-semiconductor alloy, e.g., a metal silicide such as a low resistivity phase of cobalt silicide ($CoSi_2$). Contact layer 276a-276c has a thickness $T_{276}$ of, for example, 400 Å. Contact layer 276a-276c has a low sheet resistance, e.g., less than about 10 Ω/□, and enables a good quality contact to be made to source 262 and drain 266, as well as to gate 259.

In some embodiments, during formation, contact layer 276a-276c may consume substantially all of semiconductor layer 256a-256c. A bottommost boundary 278a of contact layer 276a, therefore, shares an interface 280a with strained layer 118 in source 262, and a bottommost boundary 278c of contact layer 276c, therefore, shares an interface 280c with strained layer 118 in drain 266. A bottommost boundary 278b of contact layer 276b shares an interface 280b with gate 259.

In other embodiments, contact layer portions 276a, 276c, disposed over source 262 and drain 266, may extend into strained layer 118. Interfaces 280a, 280c between contact layer 276a, 276c and strained layer 118 are then disposed within source 262 and drain 266, respectively, above bottommost boundaries 282a, 282c of strained layer 118. Interfaces 280a, 280c have a low contact resistivity, e.g., less than approximately $5 \times 10^{-7}$ $\Omega$-cm$^2$. In certain other embodiments, during formation, contact layer 276a-276c may not consume all of semiconductor layer 256a-256c (see FIG. 8D). A bottommost boundary 278a of contact layer 276a, therefore, shares an interface with semiconductor layer 256a over source 262, and a bottommost boundary 278c of contact layer 276c shares an interface with semiconductor layer 256c over drain 266.

Because strained layer 118 includes a strained material, carrier mobilities in strained layer 118 are enhanced, facilitating lower sheet resistances. This strain also results in a reduced energy bandgap, thereby lowering the contact resistivity between the metal-semiconductor alloy and the strained layer.

Figure 9:
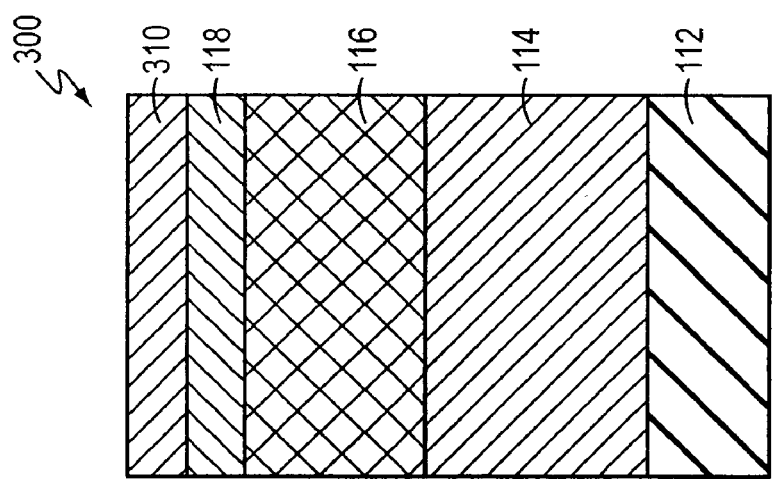

In alternative embodiments, an SSOI structure may include, instead of a single strained layer, a plurality of semiconductor layers disposed on an insulator layer. For example, referring to FIG. 9, epitaxial wafer 300 includes strained layer 118, relaxed layer 116, graded layer 114, and substrate 112. In addition, a semiconductor layer 310 is disposed over strained layer 118. Strained layer 118 may be tensilely strained and semiconductor layer 310 may be compressively strained. In an alternative embodiment, strained layer 118 may be compressively strained and semiconductor layer 310 may be tensilely strained. Strain may be induced by lattice mismatch with respect to an adjacent layer, as described above, or mechanically. For example, strain may be induced by the deposition of overlayers, such as Si$_3$N$_4$. In another embodiment, semiconductor layer 310 is relaxed. Semiconductor layer 310 includes or consists essentially of a semiconductor material, such as at least one of a group II, a group III, a group IV, a group V, and a group VI element. Epitaxial wafer 300 is processed in a manner analogous to the processing of epitaxial wafer 108, as described with reference to FIGS. 1-7.

Figure 10:
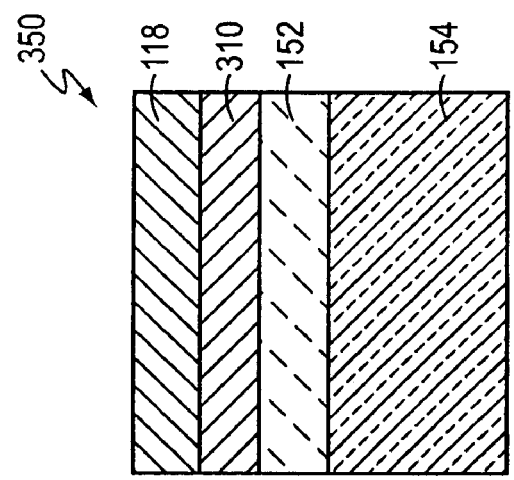
FIGS. 9-10 are schematic cross-sectional views of substrate(s) illustrating a method for fabricating an alternative SSOI substrate.

Referring also to FIG. 10, processing of epitaxial wafer 300 results in the formation of SSOI substrate 350, having strained layer 118 disposed over semiconductor layer 310. Semiconductor layer 310 is bonded to dielectric layer 152, disposed over substrate 154. As noted above with reference to FIG. 9, strained layer 118 may be tensilely strained and semiconductor layer 310 may be compressively strained. Alternatively, strained layer 118 may be compressively strained and semiconductor layer 310 may be tensilely strained. In some embodiments, semiconductor layer 310 may be relaxed.

Figure 11:
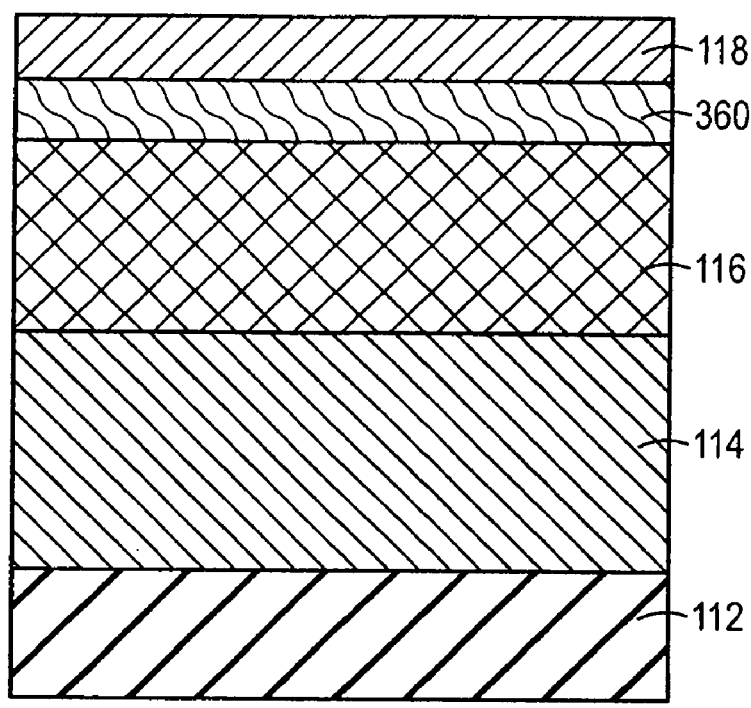
FIG. 11 is a schematic cross-sectional view of a substrate having several layers formed thereon.

Referring to FIG. 11, in some embodiments, a thin strained layer 360 may be grown between strained layer 118 and relaxed layer 116 to act as an etch stop during etching, such as wet etching. In an embodiment in which strained layer 118 includes Si and relaxed layer 116 includes Si$_{1-y}$Ge$_y$, thin strained layer 360 may include Si$_{1-x}$Ge$_x$, with a higher Ge content (x) than the Ge content (y) of relaxed layer 116, and hence will be compressively strained. For example, if the composition of the relaxed layer 116 is 20% Ge (Si$_{0.80}$Ge$_{0.20}$), thin strained layer 360 may contain 40% Ge (Si$_{0.60}$Ge$_{0.40}$) to provide a more robust etch stop. In other embodiments, a second strained layer, such as thin strained layer 360 with higher Ge content than relaxed layer 116, may act as a preferential cleave plane in the hydrogen exfoliation/cleaving procedure described above.

In an alternative embodiment, thin strained layer 360 may contain Si$_{1-x}$Ge$_x$ with lower Ge content than relaxed layer 116. In this embodiment, thin strained layer 360 may act as a diffusion barrier during the wet oxidation process. For example, if the composition of relaxed layer 116 is 20% Ge (Si$_{0.80}$Ge$_{0.20}$), thin strained layer 360 may contain 10% Ge (Si$_{0.90}$Ge$_{0.10}$) to provide a barrier to Ge diffusion from the higher Ge content relaxed layer 116 during the oxidation process. In another embodiment, thin strained layer 360 may be replaced with a thin graded Si$_{1-z}$Ge$_z$ layer in which the Ge composition (z) of the graded layer is decreased from relaxed layer 116 to the strained layer 118.

Referring again to FIG. 7, in some embodiments, a small amount, e.g., approximately 20-100 Å, of strained layer 118 may be removed at an interface 194 between strained layer 118 and relaxed layer portion 180. This may be achieved by overetching after relaxed layer portion 180 is removed. Alternatively, this removal of strained layer 118 may be performed by a standard microelectronics clean step such as an RCA SC1, i.e., hydrogen peroxide, ammonium hydroxide, and water (H$_2$O$_2$+NH$_4$OH+H$_2$O), which at, e.g., 80° C. may remove silicon. This silicon removal may remove any misfit dislocations that formed at the original strained layer 118/relaxed layer 180 interface 194 if strained layer 118 was grown above the critical thickness. The critical thickness may be defined as the thickness of strained layer 118 beyond which it becomes energetically favorable for the strain in the layer to partially relax via the introduction of misfit dislocations at interface 194 between strained layer 118 and relaxed layer 116. Thus, the method illustrated in FIGS. 1-7 provides a technique for obtaining strained layers above a critical thickness without misfit dislocations that may compromise the performance of deeply scaled MOSFET devices.

Figure 12:
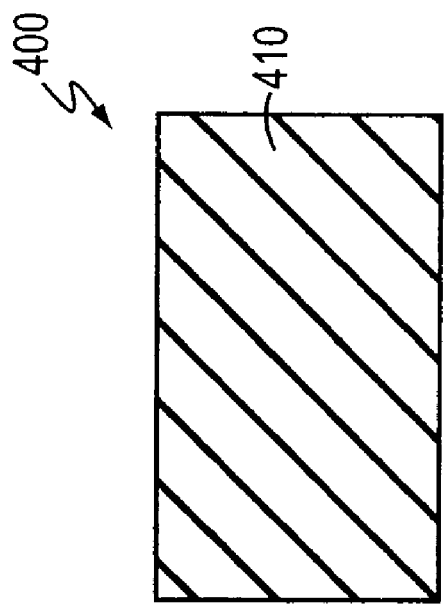

Referring to FIG. 12, in some embodiments, handle wafer 150 may have a structure other than a dielectric layer 152 disposed over a semiconductor substrate 154. For example, a bulk relaxed substrate 400 may comprise or consist essentially of a bulk material 410 such as a semiconductor material, e.g., bulk silicon. Alternatively, bulk material 410 may be a bulk dielectric material, such as Al$_2$O$_3$ (e.g., alumina or sapphire) or SiO$_2$ (e.g., quartz). Epitaxial wafer 108 may then be bonded to handle wafer 400 (as described above with reference to FIGS. 1-6), with strained layer 118 being bonded to the bulk material 410 comprising handle wafer 400. In embodiments in which bulk material 410 is a semiconductor, to facilitate this semiconductor-semiconductor bond, a hydrophobic clean may be performed, such as an HF dip after an RCA SC1 clean.

Figure 13:
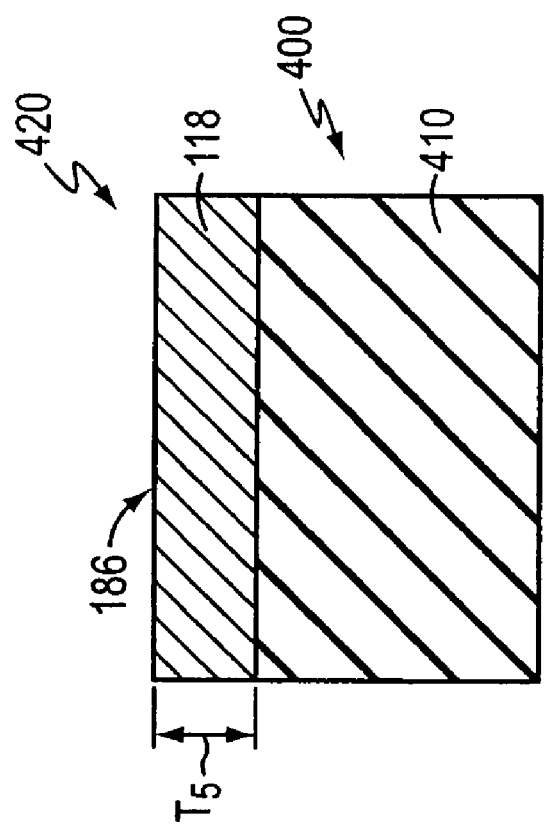
FIGS. 12-13 are schematic cross-sectional views of substrates illustrating a method for fabricating an alternative strained semiconductor substrate.

Referring to FIG. 13, after bonding and further processing (as described above), a strained-semiconductor-on-semiconductor (SSOS) substrate 420 is formed, having strained layer 118 disposed in contact with relaxed substrate 400. The strain of strained layer 118 is not induced by underlying relaxed substrate 400, and is independent of any lattice mismatch between strained layer 118 and relaxed substrate 400. In an embodiment, strained layer 118 and relaxed substrate 400 include the same semiconductor material, e.g., silicon. Relaxed substrate 400 may have a lattice constant equal to a lattice constant of strained layer 118 in the absence of strain. Strained layer 118 may have a strain greater than approximately $10^{-3}$. Strained layer 118 may have been formed by epitaxy, and may have a thickness $T_5$ of between approximately 20 Å-1000 Å, with a thickness uniformity of better than approximately +10%. In an embodiment, strained layer 118 may have a thickness uniformity of better than approximately ±5%. Surface 186 of strained layer 118 may have a surface roughness of less than 20 Å.

A PAI may be performed prior to a source/drain implantation step to reduce channeling in the source/drain regions, thereby enabling the creation of a tighter distribution of source/drain dopants and, thereby, providing abrupt junctions for the source/drain regions. When performing the PAI on an SSOI wafer, such as on SSOI substrate 190, strained active area regions, i.e., strained channel and/or source/drain regions, may relax upon recrystallization, leading to loss of mobility enhancement. This phenomenon is preferably either prevented or combined with various strain-inducing techniques to improve device performance.

Figure 14:
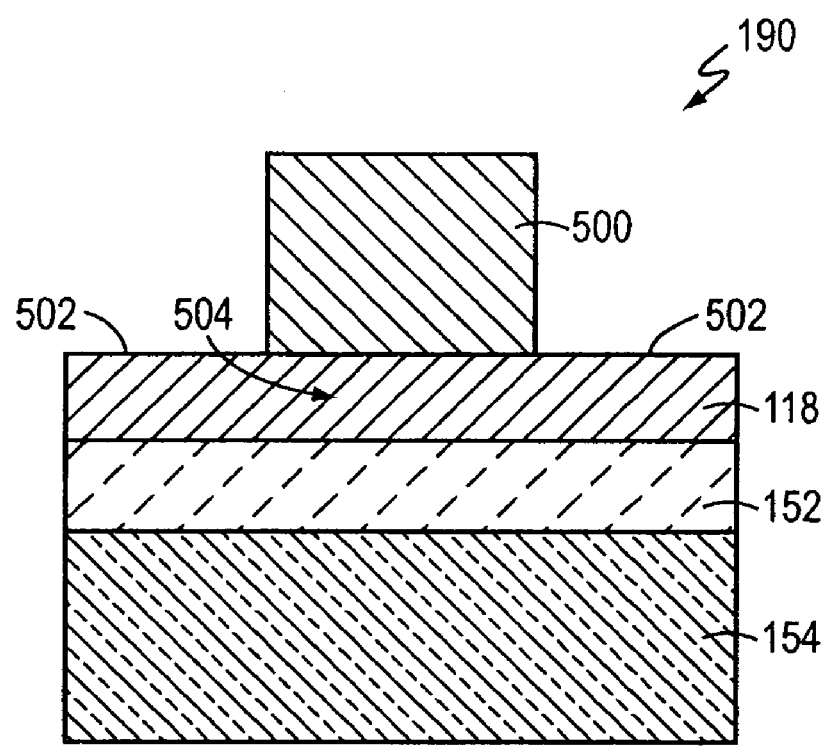
FIG. 14 is a schematic cross-sectional view of the SSOI substrate illustrated in FIG. 6 after additional processing.
Figure 15A:
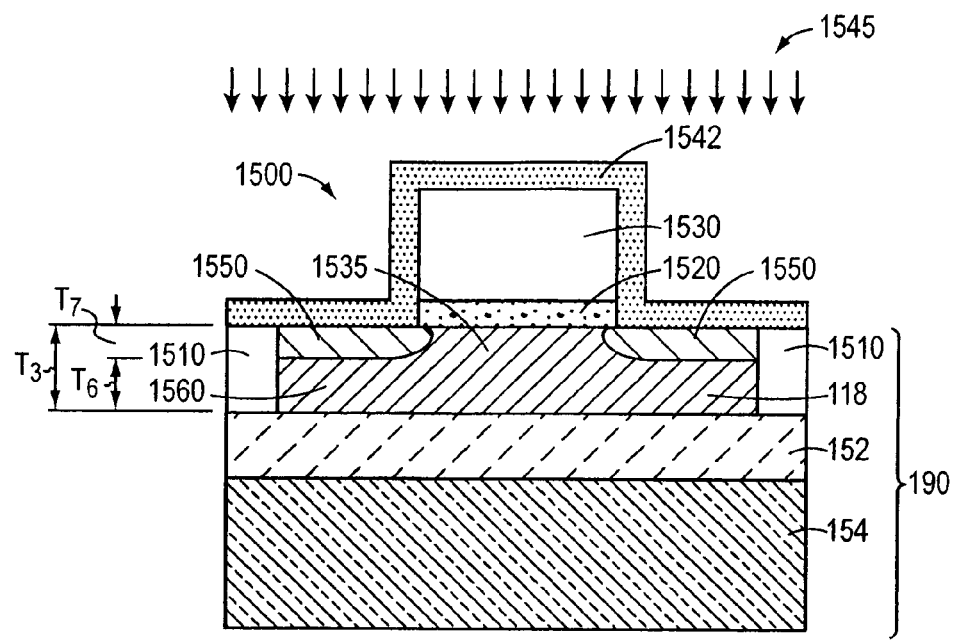
FIGS. 15A, 15B, 16A, 16B, 17A, 17B, 17C, 18A, 18B, 18C, 19A, and 19B are schematic cross-sectional views of single transistors disposed on SSOI substrates, illustrating methods of altering strain in the transistors.
Figure 15B:
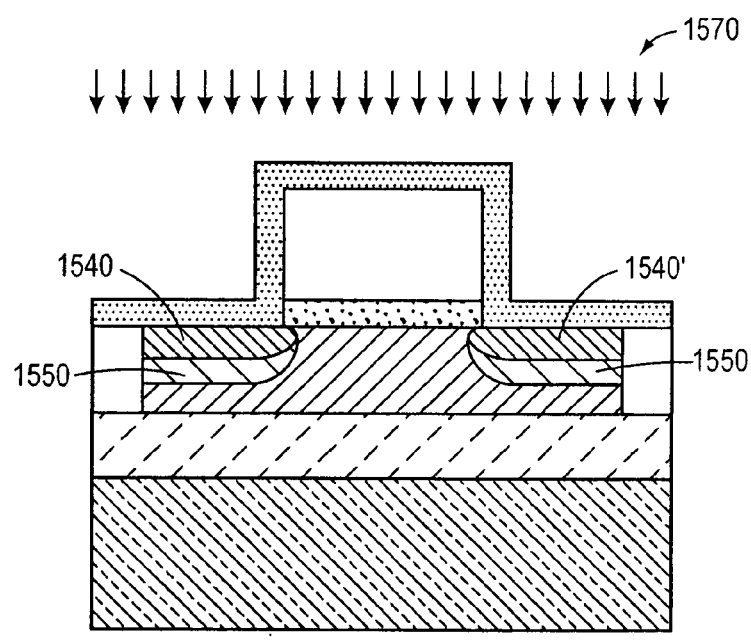
Figure 15C:
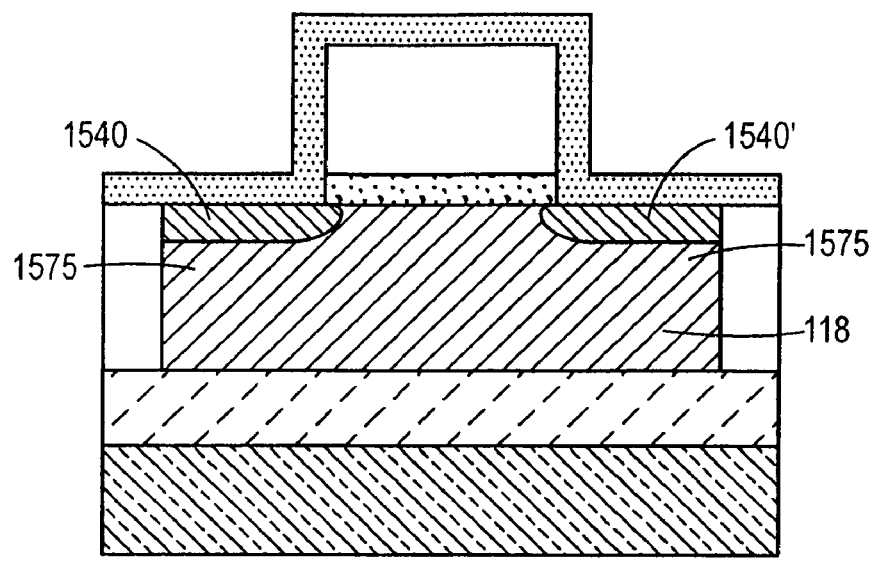
Figure 15D:
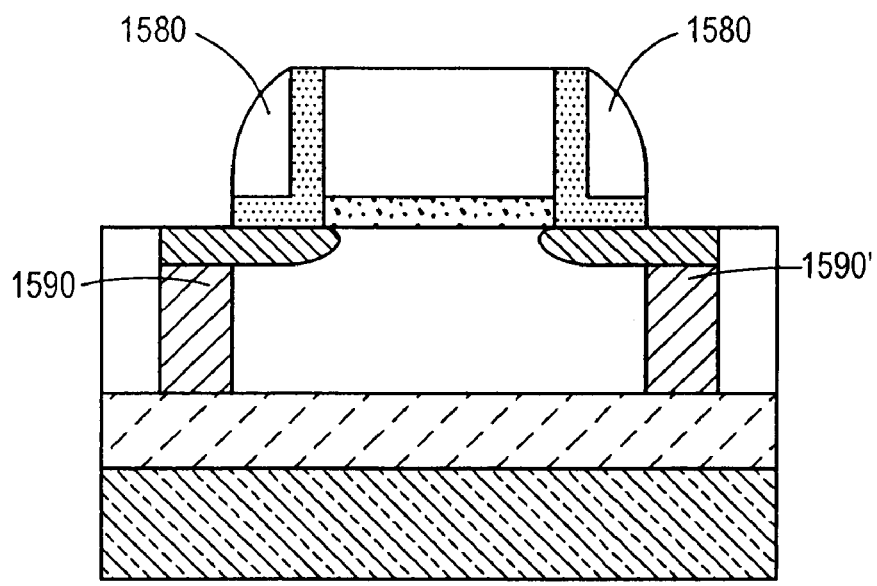

More specifically, referring to FIG. 14, in an embodiment, after fabrication of the SSOI structure 190 including semiconductor substrate 154 and dielectric layer 152, it may be favorable to selectively relax the strain in at least a portion of strained layer 118. This could be accomplished by introducing a plurality of ions by, e.g., ion implantation after a photolithography step in which at least a portion of the structure is masked by, for example, a photoresist feature 500. Ion implantation parameters may be, for example, an implant of Si ions at a dose of $10^{15}$-$10^{17}$ ions/cm², at an energy of 5-75 keV. After ion implantation, a relaxed portion 502 of strained layer 118 is relaxed, while a strained portion 504 of strained layer 118 remains strained.

Referring to FIGS. 15A-15D, the formation of a MOS-FET 1500 on SSOI substrate 190, such as the transistors 200, 250 discussed above, may include definition of shallow trench isolation (STI) regions 1510, a gate dielectric layer 1520, a gate electrode 1530, and a channel 1535, as is known in the art. After the definition of the gate electrode 1530, shallow source and drain extension regions 1540, 1540' may be formed by, e.g., a shallow ion implantation of the same dopant type as will be used to define the source and drain (see below). A thin dielectric layer 1542 may be formed over SSOI substrate 190 prior to any implantation to prevent the introduction of impurities into MOSFET 1500. The thin dielectric layer 1542 may later become part of a sidewall spacer (see below). The thin dielectric layer 1542 may include or consist essentially of silicon dioxide or silicon nitride, and may be formed by deposition or oxidation. Prior to forming the shallow source and drain extension regions 1540, 1540' in a MOSFET, a PAI 1545, i.e., an implant of a plurality of ions, such as of Si, Ge, or noble gas atoms (e.g., Ar, Kr, or Xe) may be performed to amorphize a region 1550 of the strained layer 118 that is deeper than an eventual desired depth of the shallow source and drain extension regions 1540, 1540'. The atomic species selected for the PAI is preferably isoelectronic, i.e., non-doping, with respect to strained layer 118. In some embodiments, the atomic species is relatively heavy, i.e., has a high atomic number, with respect to the material of the strained layer 118, thereby facilitating the inducement of lattice damage. Lattice damage is more easily and cheaply attained with a heavy atom. In an embodiment, during the PAI, Xe atoms are introduced into strained layer 118 that consists essentially of Si. The dose is greater than a critical dose for amorphization, i.e., greater than the dose at which the density of point defects introduced into the strained layer 118 exceeds about 10% of the atomic density of the atomic layer. For example, the dose may be greater than $0.5 \times 10^{14}$ atoms/cm², and in some embodiments, may be greater than $1 \times 10^{15}$ atoms/cm². The critical dose for amorphizing silicon may be calculated by:

$$N_{crit} \cong 5 \Delta R_p \frac{NE_d}{E_0}$$

where $N_{crit}$ is the critical dose, $\Delta R_p$ is the implant straggle, N is the target atom density, $E_0$ is the beam energy, and $E_d$ is the atom displacement energy (approximately 14-15 eV for Si and GaAs). (See *VLSI Fabrication Principles: Silicon and Gallium Arsenide* by Sorab K. Ghandhi, published by John Wiley & Sons, Inc., New York, 1994, Chapter 6, pp. 368-450.)

Some approximate critical doses for various implant species are:

| | |
|---|---|
| Kr or Sb | $5 \times 10^{13}$ cm$^{-2}$ |
| Ge or As | $10^{14}$ cm$^{-2}$ |
| Ar | $4 \times 10^{14}$ cm$^{-2}$ |
| Si or P | $5 \times 10^{14}$ cm$^{-2}$ |
| BF$_2$ | $8 \times 10^{14}$ cm$^{-2}$ |
| Ne | $1 \times 10^{15}$ cm$^{-2}$ |
| B | 1.2-5 $\times 10^{15}$ cm$^{-2}$ |
| N | $3 \times 10^{15}$ cm$^{-2}$ |

For devices fabricated on SSOI substrate 190, as described here, it is preferable during PAI not to amorphize the entire strained layer 118 down to the insulator layer, i.e., dielectric layer 152. If the entire strained layer 118 is amorphized, it may not recrystallize during subsequent annealing because of the lack of a crystalline seed layer. Typically, a non-amorphized region 1560 of the strained layer 118 having a thickness $T_6$ of, e.g., about 10 nm below the amorphized region 1550 is sufficient for recrystallization to occur. In an embodiment, the thickness of the amorphous region may be thicker than 50% of the thickness of strained layer 118.

After the PAI, a desired dopant species 1570 for the shallow source and drain extension regions 1540, 1540' is implanted into the amorphized regions 1550. The dopant species implanted for the shallow source and drain extension regions 1540, 1540' may be, for example, either n- or p-type dopants, such as B, BF$_2$, As, P, In, or Sb.

A recrystallization anneal is performed to recrystallize the amorphized region 1550 to restore mobility enhancement. Although the channel 1535 was not amorphized, device performance may be improved if lattice damage is healed. Carrier scattering may occur if carriers are transported from a crystalline region to an amorphous region or vice versa. Thus, it may be preferable to potentially improve device performance by recrystallizing the damaged lattice. The dopants introduced for the shallow source and drain extension regions 1540, 1540' may be activated during a solid-phase recrystallization process having a relatively low thermal budget. Examples of suitable anneals are an anneal at <800° C. for 1-30 minutes, an anneal at >900° C. for less than 10 seconds, an anneal at >1000° C. for less than 5 seconds, or a laser anneal for less than 1 second or even less than 0.5 seconds, e.g., less than 100 nanoseconds. A suitable laser annealing energy is less than approximately 1 Joules/cm² (J/cm²), preferably less than 0.5 J/cm². During the recrystallization process, the amorphous region 1550 created by the PAI recrystallizes, incorporating the dopant implanted during the shallow source and drain extension region formation step. The low thermal budget of this annealing step reduces the diffusion of the implanted dopants, thereby helping to ensure an abrupt junction between the dopants and the remainder of strained layer 118.

The PAI provides several advantages. Because the dopants for the shallow source and drain extension regions 1540, 1540' are implanted into an amorphous region 1550 substantially free of long-range crystalline order, implant channeling does not occur, and the implant profile is very abrupt. The amorphous region 1550 is non-crystalline, i.e., it does not have a regular atomic spacing and lattice that repeats in a regular fashion over many layers. Finally, the creation of the amorphous region 1550 helps prevent transient enhanced diffusion (TED) by blocking interstitial defects that tend to form below a peak of a dopant implant.

To prevent relaxation of the recrystallized strained layer 118, a reduced PAI dose of less than a critical dose, i.e., $<5\times10^{14}$ cm$^{-2}$ and/or at a lower energy may used, such that the amorphous region has a thickness $T_7$ that is less than approximately 50% of the strained semiconductor layer 118 thickness $T_3$, or even less than 25% of the strained semiconductor layer 118 thickness $T_3$. Generally, an amorphization depth is preferably greater than or equal to a depth of the shallow source and drain extension implant.

The strained layer 118, as formed, may have a first type of strain (e.g., tensile or compressive) and recrystallized regions 1575 of the strained layer 118 may have a second type of strain (e.g., tensile or compressive). The second type of strain may be substantially the same as the first type of strain, i.e., both the first and second types of strain may be tensile strain or compressive strain.

After the recrystallization anneal, dielectric sidewall spacers 1580 are defined proximate the gate electrode 1530 by methods known in the art, and a deep source/drain implant of n- or p-type dopants is performed to define deep source and drain regions 1590. For example, for an n-type transistor, the deep source/drain implant may be the implantation of As at a power of 30 keV and a dose of $10^{15}$ cm$^{-2}$. The same n- or p-type dopant atoms, e.g., As or B, are typically implanted, respectively, for both the deep source and drain regions 1590 and the shallow source and drain extension regions 1540, 1540'. Different dopant species, however, may be used for the two implants. For example, a heavier species may be used for implantation of the relatively shallow source and drain extension regions 1540, 1540', such as BF$_2$, while a lighter species, such as B, may be used for implantation of the deep source and drain regions 1590.

In an embodiment, a second PAI may be performed prior to the implantation of the deep source and drain regions 1590. This second PAI before the formation of the deep source and drain regions 1590 may be performed for the same reasons as given above for the first PAI before the shallow source and drain extension region 1540, 1540' formation, i.e., reduction of implant channeling, the creation of abrupt implant profiles, and prevention of TED by blocking interstitial defects that tend to form below a peak of a dopant implant.

In some embodiments, SSOI substrate 190 may be heated during implantation. The thermal energy provided in this way allows the crystalline structure of the strained layer 118 to heal itself, i.e., to recrystallize during implantation. The temperature during implantation may be greater than 25° C., and in an embodiment may be greater than approximately 100° C.

Figure 16A:
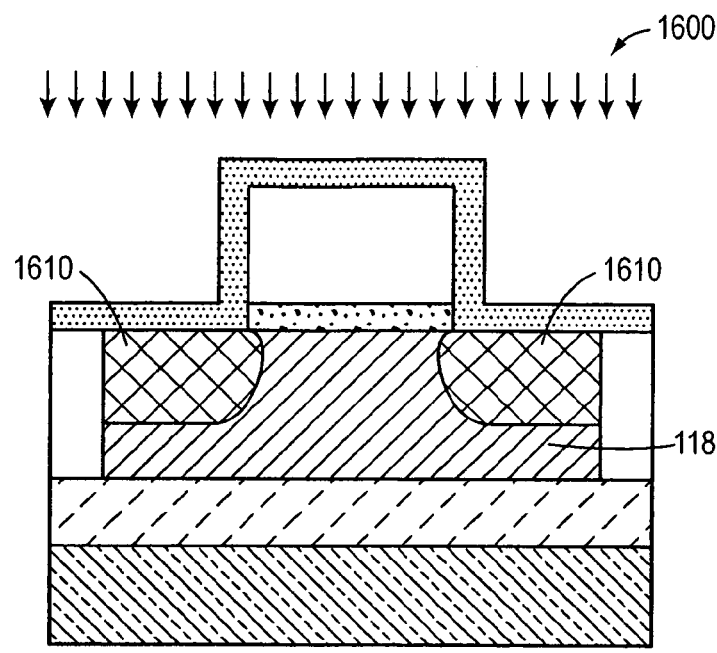
Figure 16B:
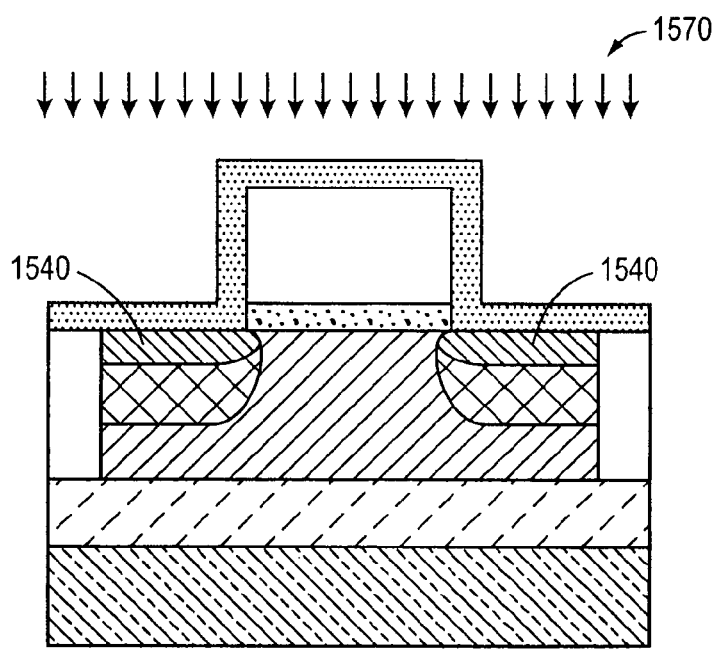

Referring to FIGS. 16A-16B, in an alternative embodiment, the PAI 1545 may be replaced by a co-implant 1600 that may be performed before or after the implantation of dopants to define the shallow source and drain extension regions 1540, 1540'. The co-implant 1600 is an implantation step in which lattice vacancies 1610 in the strained layer 118 are created. Interstitial defects created by the shallow source and drain extension region implant 1570 recombine with the vacancies created by the co-implant 1600 and are thereby eliminated. Moreover, these vacancies may significantly reduce transient enhanced diffusion and thereby assist in maintaining abrupt junctions in implanted shallow source and drain extension regions 1540, 1540'. The co-implant may introduce elements such as Si, F, O, N, or Ar into the strained layer 118. The criteria for selection of an element for the co-implant 1600 are similar to the selection of an element for the PAI. The co-implant, however, preferably creates vacancies rather than interstitials. The co-implant element is preferably non-doping, and is not necessarily a very heavy atom. In some embodiments, a light co-implant element, such as N, O, or F, is preferable so that interstitial lattice damage does not occur. For strained layer consisting essentially of Si, elements equal to or lighter than Ar (18) are particularly suitable for the co-implant. The other major difference is that the dose is preferably smaller for the co-implant, as discussed below. In embodiments in which the co-implant dose is 3-5×10$^{14}$ cm$^{-2}$ or higher, SSOI substrate 190 may be heated, e.g., to ~50-100° C., during the co-implant to help prevent amorphization.

Figure 17A:
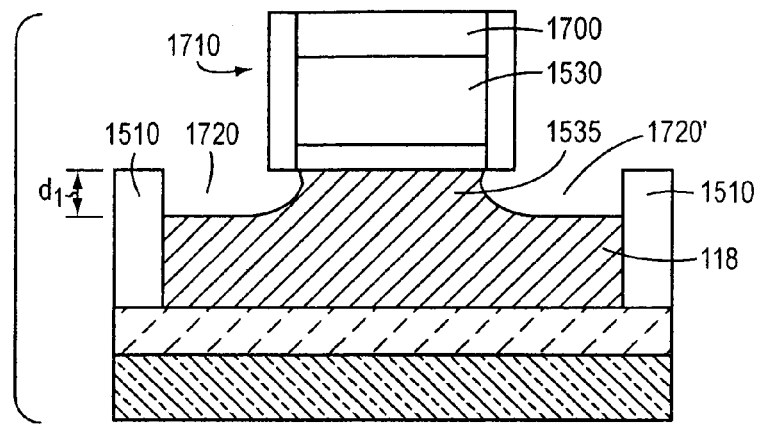
Figure 17B:
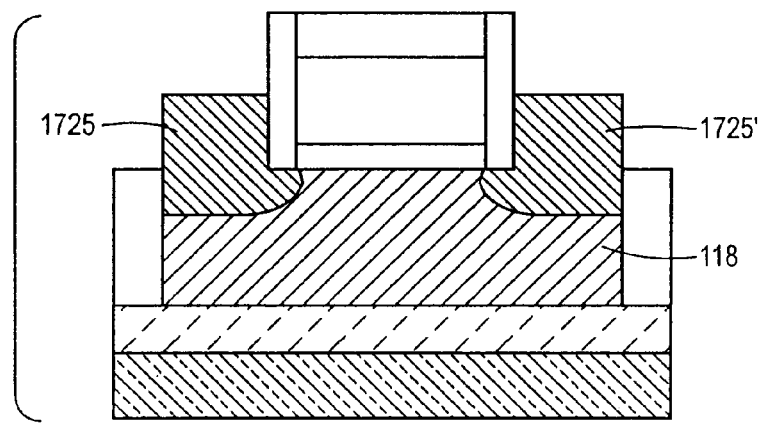
Figure 17C:
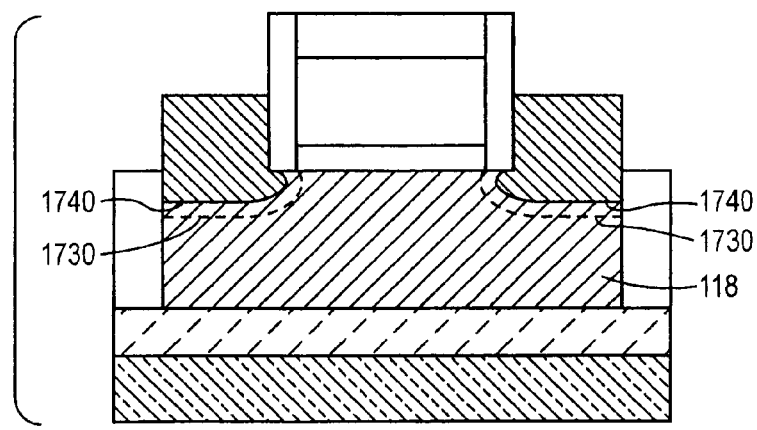

In another embodiment, relaxation of strained layer 118 due to a PAI step is avoided by using a process flow that omits the performance of a PAI. Referring to FIGS. 17A-17C, rather than forming shallow source and drain extension regions 1540, 1540' by implantation as described above, source and drain regions are formed in recesses as follows.

A hard mask 1700, e.g., an oxide mask, such as silicon dioxide, is defined over the gate electrode 1530. The hard mask 1700 may be initially formed as part of a gate stack, i.e., gate dielectric, gate electrode, and oxide hard mask layers deposited over the substrate (not shown). The gate stack is patterned to define the gate 1710, with the hard mask 1700 disposed on a top surface of the gate electrode 1530. Source and drain regions are defined by first defining first and second recesses 1720, 1720' by removing a first portion and a second portion of the strained layer 118, and then depositing a source/drain material into the recesses 1720, 1720'. The recesses may be formed by a suitable wet or dry etch. For example, the recesses 1720, 1720' may be formed by a selective etch that removes the material of the strained layer 118 selectively with respect to the hard mask 1700 and exposed STI regions 1510. In one embodiment, a dry etch containing 40 sccm CF$_4$, 15 sccm HeO$_2$, 200 sccm He, and 20 sccm Cl$_2$ at 300 W power and a pressure of 20-50 mTorr is used. Recesses 1720, 1720' each have a depth $d_1$ of 20-150 nm. This depth $d_1$ is preferably deep enough for subsequently deposited source/drain material to adequately conduct carriers traversing the channel 1535. As shown in FIG. 17B, source/drain material is deposited into the recesses 1720, 1720' to define source and drain regions 1725, 1725' by, e.g., selective epitaxy. The source/drain material, therefore, is selectively deposited only on exposed crystalline surfaces, e.g., in the recesses 1720, 1720'. The source/drain material may be a conductive material such as a heavily doped semiconductor, such as Si, Ge, SiGe, SiC, or SiGeC, or a metal, such as tungsten (W). The deposition step may be followed by an anneal to drive a source/drain junction 1730 with the strained layer 118 deeper than an interface 1740 (see FIG. 17C) between the strained layer 118 and the deposited source/drain material, i.e., diffusion of the source/drain dopants result in a source/drain junction 1730 with the strained layer 118 that is deeper than the recesses 1720, 1720'. Thus, any defects at the interface 1740 between the strained layer 118 and the deposited source/drain material are unlikely to hinder device performance. The anneal may be carried out at 800-1000° C. for 1-10 minutes. This anneal may not be needed in embodiments with metal source/drain regions.

Figure 18A:
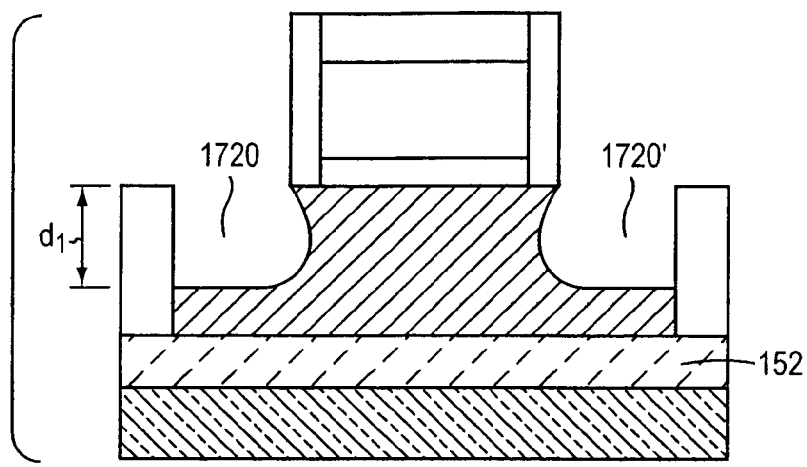
Figure 18B:
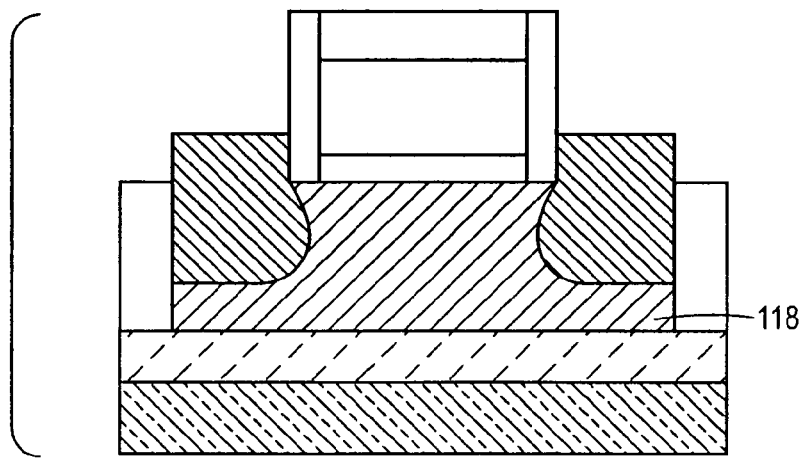
Figure 18C:
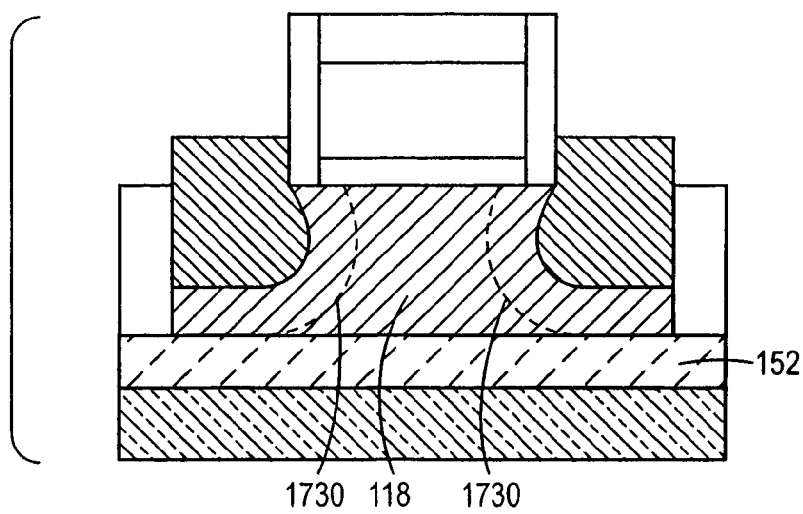

Referring to FIGS. 18A-18C, in an embodiment, the depths $d_1$ of the recesses 1720, 1720' may be deeper than described above with reference to FIGS. 17A-17C, for example 100-150 nm. The recesses 1720, 1720' preferably do not extend all the way to the underlying dielectric layer 152, as this configuration would not leave a crystalline semiconductor template for the selective epitaxy step. Here, after an anneal step, the junction 1730 of the source and drain regions with the strained layer 118 may extend as far as the dielectric layer 152 disposed below the recesses 1720, 1720'. Thus, the source/drain junctions 1730 with the strained layer 118 may reach all the way to the buried dielectric layer 152, thereby reducing junction capacitance.

Figure 19A:
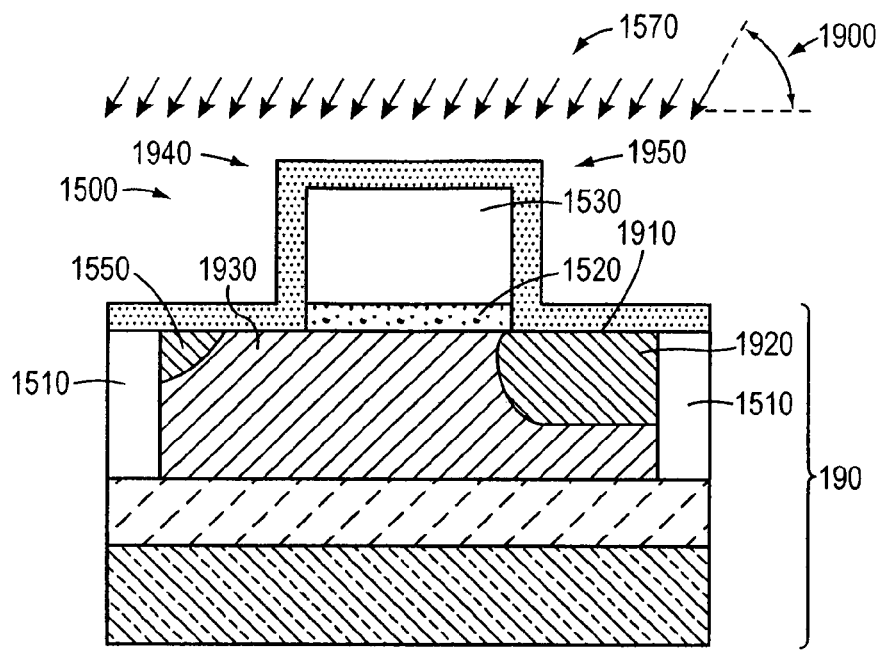
Figure 19B:
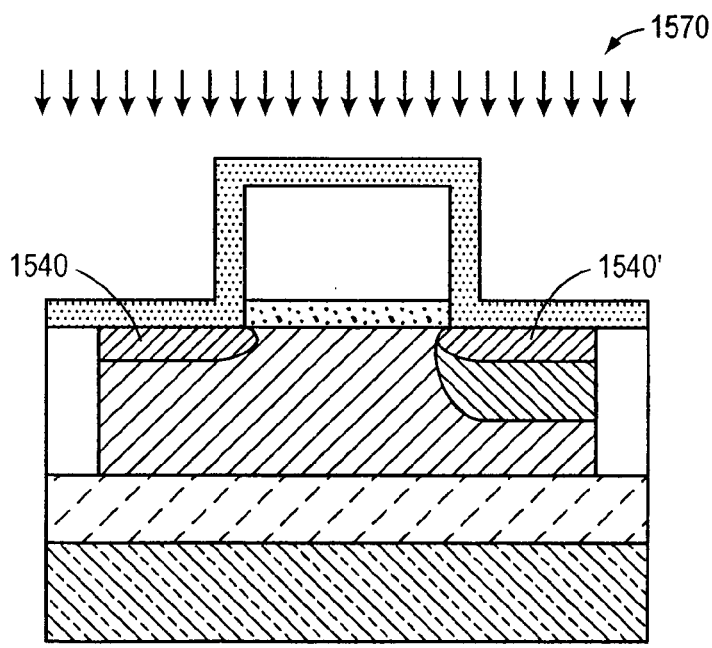

In an embodiment, amorphization by PAI may be performed such that amorphization occurs only in, e.g., a drain region and not in other regions, such as source regions. Because device performance typically depends predominantly on carrier injection velocity from the source side, relaxation may be tolerated on the drain side, as long as the source side remains strained. Referring to FIGS. 19A and 19B, formation of transistor 1500 on SSOI substrate 190 includes the definition of STI regions 1510, a gate dielectric layer 1520, and a gate electrode 1530, as is known in the art. The PAI 1545' is performed at an angle 1900 less than 90° with respect to a surface 1910 of a drain region 1920 on SSOI substrate 190 so that the incident ions impinge on the drain region 1920, but not on a source region 1930. At least a portion of the ions are blocked from entering the source region by the gate electrode 1530. In an embodiment, the shadowing effect of the gate electrode 1530 may be enhanced by forming an additional layer (not shown) on a top surface of the gate electrode 1530 to temporarily provide additional gate height and shadowing ability. The additional layer may be similar (and formed similarly) to the hard mask described above. Thus, substantially fewer, or even no ions may impinge on the source side 1940 of the gate electrode 1530, such that an amorphous region is formed only on the drain side 1950 of the structure.

After the PAI, shallow source and drain extension regions 1540, 1540' may be implanted as described above with respect to FIGS. 15A-15D, followed by a recrystallization anneal. Because of the angled PAI, although the drain region 1920 may be partially relaxed after amorphization, the source region 1930 remains fully strained throughout the PAI and the shallow source and drain extension region 1540, 1540' formation.

Figure 20:
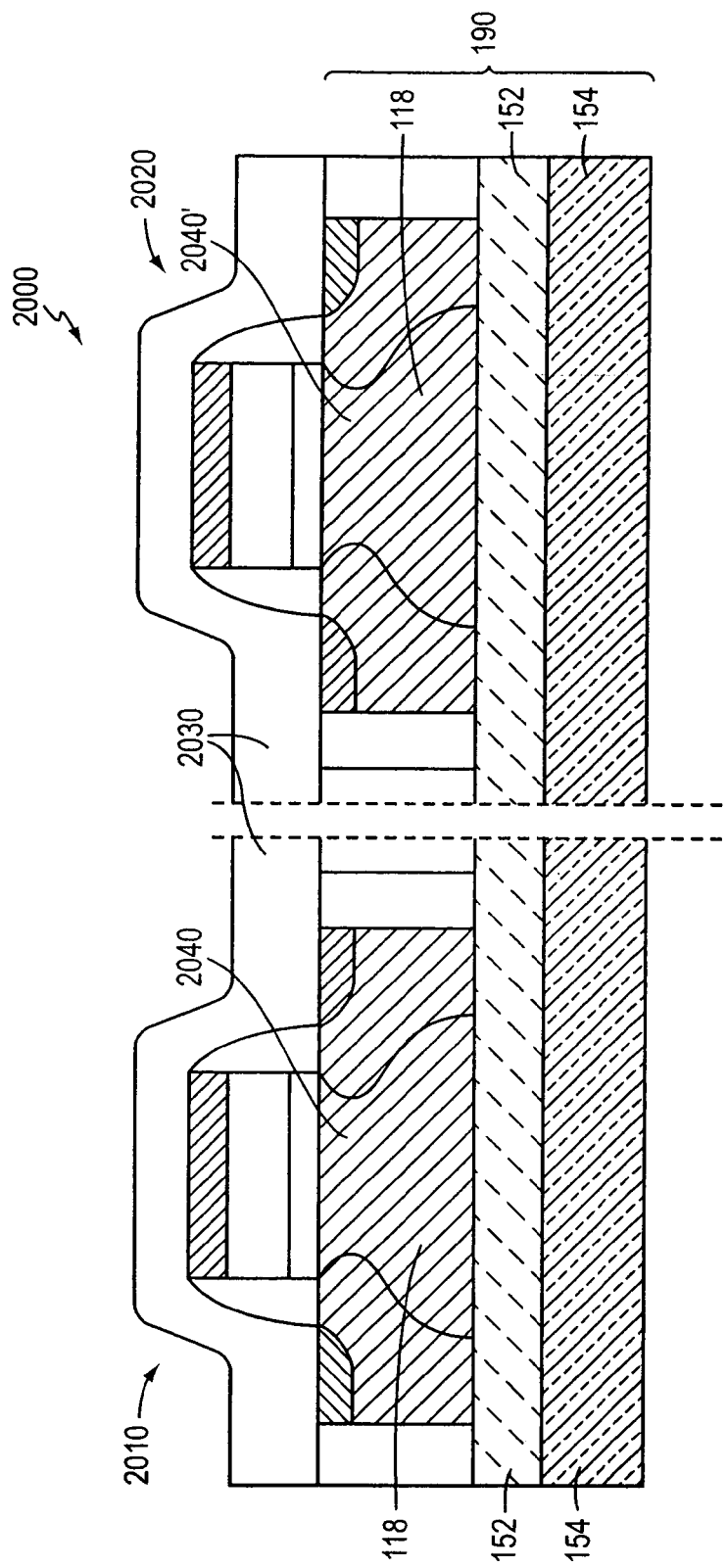
FIGS. 20, 21, 22A, 22B, 23A, 23B, 23C, 23D, 24A, 24B, and 25 are schematic sectional views of pairs of transistors disposed on SSOI substrates, illustrating methods of altering strain in the transistors.

Referring to FIG. 20, a structure 2000 formed in accordance with the process described above may include an NMOS transistor 2010 and a PMOS transistor 2020, with each transistor including the fully strained semiconductor material of strained layer 118 over an insulator, i.e., dielectric layer 152. The strained material may retain the tensile or compressive strain inherent to the SSOI substrate 190. A strain-inducing overlayer 2030 may be formed over each of the NMOS and PMOS transistors 2010, 2020, further inducing additional strain in each transistor. First and second channels, e.g., NMOS channel 2040 and PMOS channel 2040' of the two types of devices 2010, 2020, may be disposed in tensilely strained semiconductor material of strained layer 118, and the overlayer 2030 may be, e.g., a $Si_3N_4$ layer that induces tensile strain in each type of device, thereby enhancing the performance of both devices. Because the starting SSOI strained layer 118 is tensilely strained, the tensile strain-inducing overlayer 2030 works in concert with that innate strain rather than against it. For the case of a compressively strained SSOI starting strained layer 118, the desired overlayer 2030 may induce compressive strain on both devices.

This approach is simpler than schemes that include two overlayers, such as a first tensile strain-inducing overlayer disposed over NMOS devices and a second compressive strain-inducing overlayer disposed over PMOS devices. This approach, therefore, may provide an advantageous device fabrication sequence.

Figure 21:
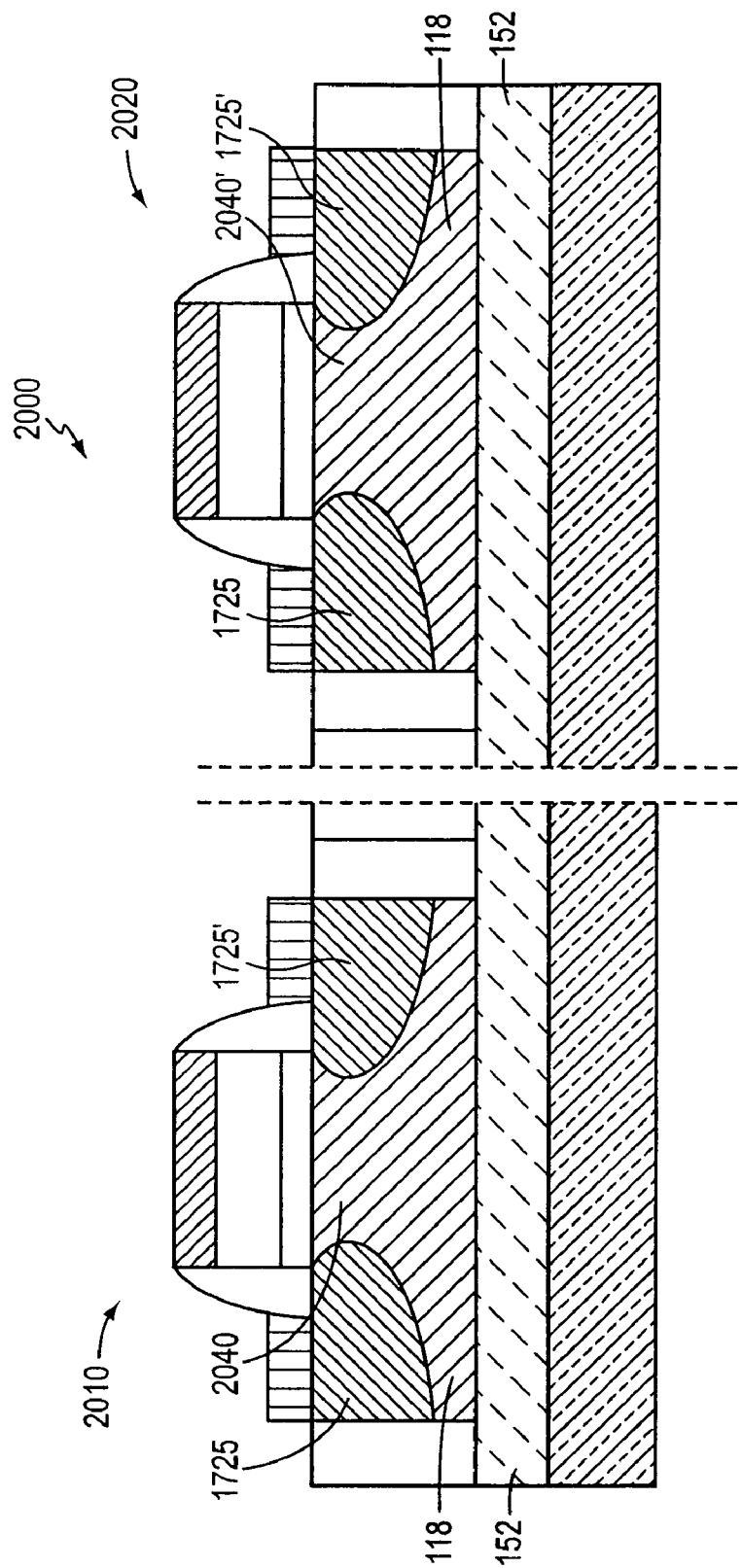

Referring to FIG. 21, in an alternative embodiment, a structure formed in accordance with the process described above may include first and second transistors, such as NMOS and PMOS field-effect transistors 2010, 2020, with each transistor including a fully strained semiconductor bonded to an insulator, e.g., strained layer 118 over dielectric layer 152. The strained material of layer 118 may have a first type of strain, e.g., tensile strain. In an embodiment, one or both of the first and second transistors may be a fin-field-effect transistor (finFET). Each transistor 2010, 2020 includes strain-inducing epitaxially refilled source/drain regions 1725, 1725' that induce additional strain of a second type, e.g., tensile train, in the channel 2040, 2040' of the respective transistor. These epitaxially refilled source/drain regions 1725, 1725' may be formed as discussed above with reference to FIGS. 17A-17C.

In an embodiment, the first type of strain and the second type of strain are the same, e.g., both tensile. In another embodiment, the first type of strain is different from the second type of strain, e.g., the first type of strain is tensile and the second type of strain is compressive. By selecting source/drain materials with appropriate lattice constants, desired types of stress may be selectively induced into the channel. For example, a first channel may be under tensile strain, and/or the second channel may be under compressive strain. In an embodiment, the channel 2040' of the PMOS transistor 2020 is compressively strained and the channel 2040 of the NMOS transistor 2010 is tensilely strained; thus, the carrier mobilities of both devices are enhanced. Here, the NMOS transistor source/drain material has a lattice constant that is smaller than a lattice constant of the NMOS transistor channel. Hence, the NMOS transistor channel 2040 is tensilely strained. The lattice constant of the PMOS transistor source/drain material is larger than a lattice constant of the PMOS transistor channel, and as a result, the PMOS transistor channel 2040' is compressively strained. More particularly, the NMOS transistor source/drain material may include or consist essentially of SiC, the PMOS transistor source/drain material may include or consist essentially of SiGe, and the channel material include or consist essentially of Si.

Figure 22A:
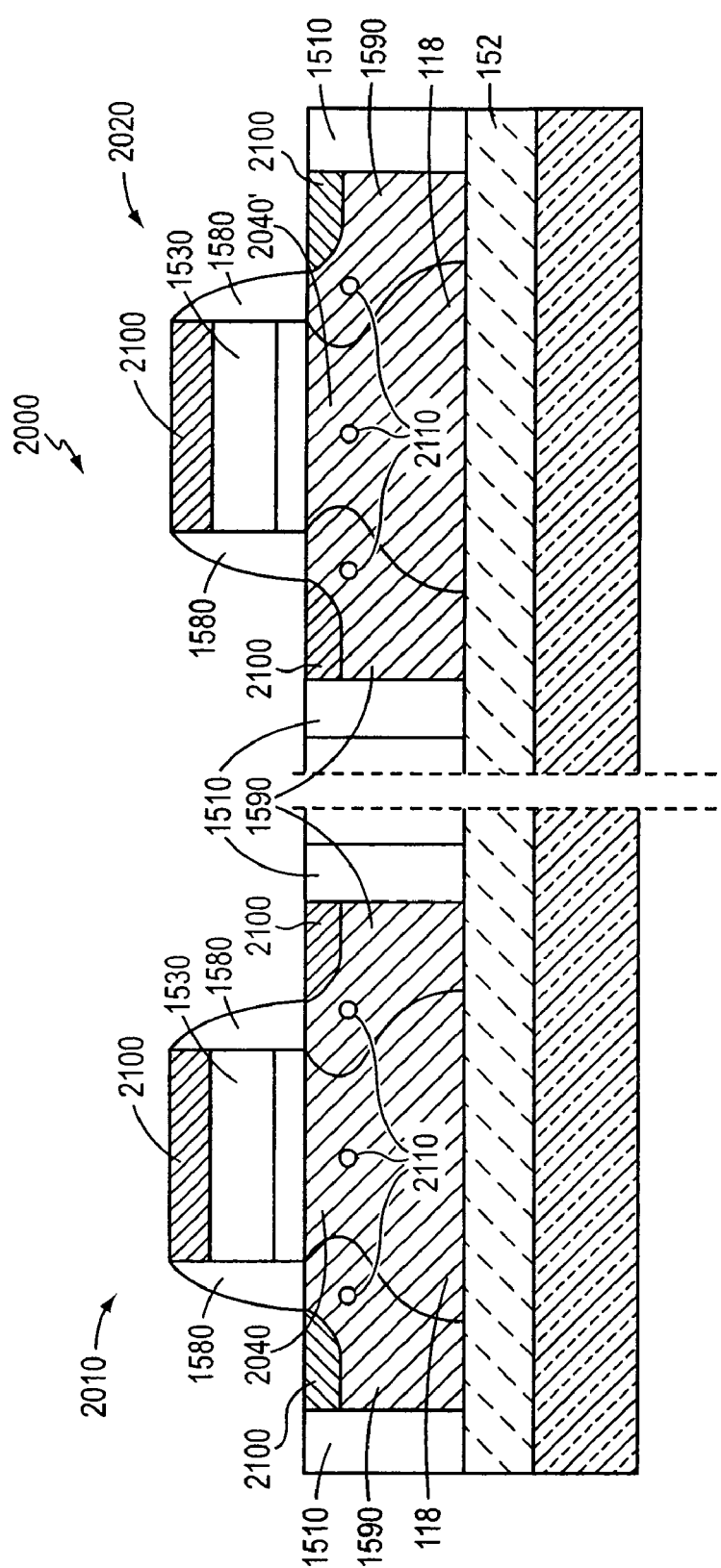
Figure 22B:
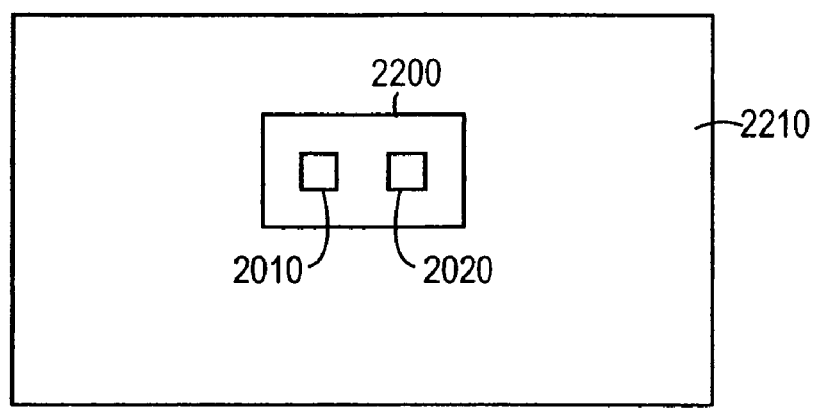

Referring to FIGS. 22A-22B, in an alternative embodiment, the structure 2000 includes first and second transistors, such as NMOS field-effect transistor 2010 and PMOS field-effect transistor 2020, with each transistor including a fully strained semiconductor bonded to an insulator, e.g., dielectric layer 152. The strained material may be, e.g., strained layer 118 having a first type of strain, such as tensile strain. In an embodiment, one or both of the first and second transistors may be a finFET. Each of the transistors 2010, 2020 includes a strain-inducing stressor that induces a second strain in the respective channels 2040, 2040' of the transistors. The strain-inducing stressor for each of these transistors may be at least one of the following: STI region 1510 disposed proximate a source/drain region 1590; a gate electrode 1530 disposed over the strained layer 118; a metal-semiconductor alloy 2100, such as silicide, disposed on the source/drain regions 1590; or dielectric sidewall spacers 1580 disposed proximate the gate electrode 1530. In an embodiment, the strain-inducing stressor may be a void 2110 implanted into the source/drain regions 1590 or below the channel 2040, 2040'. The void 2110 may be defined by the implantation of a gaseous species, e.g., hydrogen, oxygen, helium, or other noble gas, prior to gate electrode formation; alternatively, it may be introduced by an angled implant after gate electrode formation. In an embodiment, both NMOS and PMOS transistors 2010, 2020 incorporate the same strain-inducing stressor that induces, e.g., tensile strain. In another embodiment, each device incorporates a different strain-inducing stressor, each of which induces the same type of strain, e.g., tensile strain. For the case of a strained layer 118 that is compressively strained, each of the NMOS and PMOS devices may incorporate a compressive strain-inducing stressor. These compressive strain-inducing stressors can be the same or different, as in the case of the tensile strain-inducing stressors.

In another embodiment, the strain-inducing stressor may be introduced during back-end metallization steps or during die-level packaging of a chip 2200 including NMOS and PMOS transistors 2010, 2020. For example, the strain-inducing stressor may be a package 2210 to which the chip 2200 is attached after the completion of device fabrication Such a package 2210 can be engineered, e.g., deformed or strained, to induce strain across an entire chip along one or more directions, thereby inducing strain in channels 2040, 2040'. For such embodiments, the underlying substrate may have a reduced thickness, e.g., due to removal of material by backside grinding. In another embodiment, the strain-inducing stressor may be a metallization layer or a dielectric layer between metal wiring layers deposited and/or processed in a manner such that strain is induced in channels 2040, 2040'.

More specifically, in an embodiment in which it is desired that STI region 1510 induce tensile strain, the STI trench may include a fill material that includes an amorphous semiconductor, e.g., amorphous silicon. In a subsequent step (either an additional step, or during a further processing step), the fill material may be heated to a temperature above its amorphous-polycrystalline phase transition temperature by annealing or by irradiation with ultraviolet or laser energy. Depending on the method, this may include heating the fill material to a temperature higher than approximately 500-700° C. During the phase transition that takes place above its amorphous-polycrystalline phase transition temperature, the fill material contracts, inducing tensile strain in a region bounded by the trench structure, e.g., in a channel region of a subsequently fabricated device.

In an alternative embodiment, the fill material has a thermal expansion coefficient greater than that of the material within which it is predominantly formed (i.e. strained layer 118) and it is deposited at elevated temperatures. Depending on the materials present in the strained layer 118, the fill material may be selected to have a coefficient of thermal expansion greater than that of Si ($2.6 \times 10^{-6}$/° C.), Ge ($5.8 \times 10^{-6}$/° C.), or GaAs ($6.86 \times 10^{-6}$/° C.). In the case of the STI trench being formed predominantly in SiGe, the coefficient of thermal expansion of the SiGe may be approximated as the weighted average of the coefficients of thermal expansion of Si and Ge. Because coefficients of thermal expansion for these materials tend to increase with temperature, the fill material may be chosen to have a coefficient of thermal expansion greater than $8 \times 10^{-6}$/° C. In this embodiment, when the fill material is cooled to room temperature, it contracts more than the surrounding material, inducing tensile strain in a region bounded by the trench structure, e.g., in the channel region of a subsequently fabricated device. A material suitable for use as the fill material is zinc-alumina-silicate glass.

In another embodiment, the fill material is not fully densified, e.g., the fill material may include low temperature oxide (LTO), medium temperature oxide (MTO), and/or silicon dioxide deposited from a tetraethylorthosilicate (TEOS) precursor. An anneal at a temperature above the deposition temperature, e.g., above 700° C., may cause the fill material to densify, i.e., contract, thereby inducing tensile strain in the region bounded by the trench structure, e.g., in the channel region of a subsequently fabricated device. Such a densification anneal is preferably performed at a temperature sufficiently low, e.g., below 1100-1200° C., to prevent strain relief by flow of the fill material.

In an embodiment, the trench structure induces compressive strain, and fill material with a coefficient of thermal expansion smaller than that of the surrounding material may be deposited at elevated temperature. For example, when the surrounding material is predominantly silicon, the fill material may be silicon dioxide. Thus, when the fill material is cooled to room temperature, it contracts less than the surrounding material, inducing compressive strain in the region bounded by the trench structure, e.g., in the channel region of a subsequently fabricated device. In an alternative embodiment, the fill material may induce tensile strain as-deposited and may be densified or annealed at high temperatures, e.g., above 900° C. Flow of the fill material at such high temperatures may result in compressive strain being induced by the fill material after cooling. In another embodiment, compressive silicon dioxide may be deposited by PECVD. In an alternative embodiment, a protective liner may be absent in the trench, and an oxidation step may be performed after filling the trench with the fill material. Such oxidation is accompanied by a volume expansion which may further induce compressive strain in the region bounded by the trench structure, e.g., in the channel region of a subsequently fabricated device.

The gate electrode 1530 of each of the NMOS and PMOS transistors 2010, 2020 may also induce strain in the respective channel 2040, 2040' if the gate electrode 1530 is composed completely or nearly completely of a metal silicide, metal germanosilicide, or metal germanocide, e.g., nickel silicide (NiSi), nickel germanosilicide (NiSiGe), or nickel germanocide (NiGe). The reaction between the metal and the gate polycrystalline silicon, polycrystalline silicon-germanium, or polycrystalline germanium may result in a volumetric change that may induce strain in channel region 2040, 2040' after processing. In an alternative embodiment, strain in gate electrode 1530 may be induced by deposition of an overlayer, e.g., an oxide, and annealing prior to complete or incomplete silicidation of the gate. Gate electrode 1530 may include or consist essentially of a semiconductor material that has been amorphized, e.g., by an ion implantation step, and may undergo an amorphous-crystalline phase transition (and accompanying volumetric change) during a subsequent anneal. The presence of an overlayer during such an anneal may result in a strain being induced in channel 2040, 2040', even after the overlayer is removed and the gate is silicided.

In another embodiment, strain in NMOS and PMOS channels 2040, 2040' may also be induced predominantly by a silicided region of source/drain region 1590 in the respective NMOS and PMOS transistor 2010, 2020. Volumetric changes during the reaction of the silicide metal with the semiconductor material in source/drain region 1590 may cause strain to be induced in channels 2040, 2040'. Such metals may include titanium, nickel, cobalt, platinum or other suitable metals. In such embodiments, source/drain region 1590 may not be etched and refilled with alternative semiconductor materials.

Stress in channels 2040, 2040' may be induced by dielectric sidewall spacers 1580 disposed proximate the gate electrode 1530. In an embodiment, the dielectric sidewall spacers include or consist essentially of silicon nitride. The composition of these layers may be selected as described above with respect to the overlayers to induce a desired level of strain. In another embodiment, the sidewall spacers include or consist essentially of silicon dioxide. Deposited TEOS oxide may exert tensile strain and deposited high-density plasma (HDP) oxide may exert compressive strain. Both types may be used together, e.g., an oxide/nitride stacked spacer, with each layer exerting the same type of strain.

Selective PAI-induced relaxation may be used to enhance compatibility with other device stressors. The performance of a PAI step may be omitted, or one of the methods described above may be used to prevent relaxation of one type of device. For example, a PAI may be formed selectively on a PMOS device so that inherent strain in the PMOS SSOI material relaxes after a recrystallization anneal. The NMOS device on the same substrate, however, may not be subjected to a PAI, so that the inherent SSOI tensile or compressive strain is retained in the NMOS regions. Thereby, the selectively-relaxed SSOI substrate is highly compatible with process-inducing strain sequences that apply different types of strain to different device types.

Referring to FIGS. 23A-23D, after the definition of STI regions 1510, gate dielectrics 1520, and gate electrodes 1530 for both an NMOS transistor 2010 and a PMOS transistor 2020, a photoresist mask 2300 is defined over the NMOS transistor features. An aggressive PAI 1545 is performed on the PMOS transistor 2020 region, such that the regions 1550 of the strained layer 118 in which the PMOS source/drain will be formed amorphize to a large degree. For example, the PAI parameters 1545 may be a Ge implant at a dose of $5\times10^{14}$-$2\times10^{15}$ cm$^{-2}$, an energy of 10-50 keV, with the source/drain regions being amorphized to a depth of 30-80 nm. After the PAI, an implantation step is performed to introduce p-type dopants 1570, thereby defining the PMOS shallow source and drain extension regions 1540, 1540'. The NMOS transistor 2010 features are shielded by the photoresist mask 2300 during the PAI and PMOS shallow source and drain extension region 1540, 1540' formation. Regions 2310 of the strained layer 118 in which the NMOS source and drain regions will be formed are not amorphized because of the shielding effect of the photoresist mask 2300.

After the PAI 1545 and PMOS dopant implantation 1570, the photoresist mask 2300 over the NMOS region is removed and a recrystallization anneal is performed. After the recrystallization anneal, a region 2310 of the strained semiconductor layer 118 in which the NMOS device is to be formed remains strained, but at least the amorphized region 1550 of the strained semiconductor layer 118 in which the PMOS source/drain and channel will be disposed relaxes significantly. In an embodiment, the channel of the PMOS transistor may also relax significantly upon recrystallization of region 1550.

This sequence for the definition of the PMOS transistor 2020 is repeated for the definition of the NMOS transistor 2010. A photoresist mask (not shown) is formed over the PMOS transistor region. A PAI may be performed over the NMOS transistor region, but with less aggressive parameters than those used for the PMOS PAI. For example, the PAI performed on NMOS transistor region may utilize Ge at a dose of less than $5\times10^{14}$ cm$^{-2}$ and an energy of 10-20 keV. In an alternative embodiment, no PAI is performed over the NMOS transistor region. A dopant implant is performed to define the NMOS shallow source and drain extension regions. After the formation of the NMOS shallow source and drain extension regions, a recrystallization anneal is performed.

In an alternative embodiment, one or more of the other techniques described above may be used to maintain the strain in the NMOS region. For example, source/drain regions may be defined by the definition of recesses and selective growth of source/drain material. An angled and/or heated PAI may be performed. Moreover, strain in the NMOS region may be maintained by applying heat to the substrate during the shallow source and drain extension region implant.

Figure 23A:
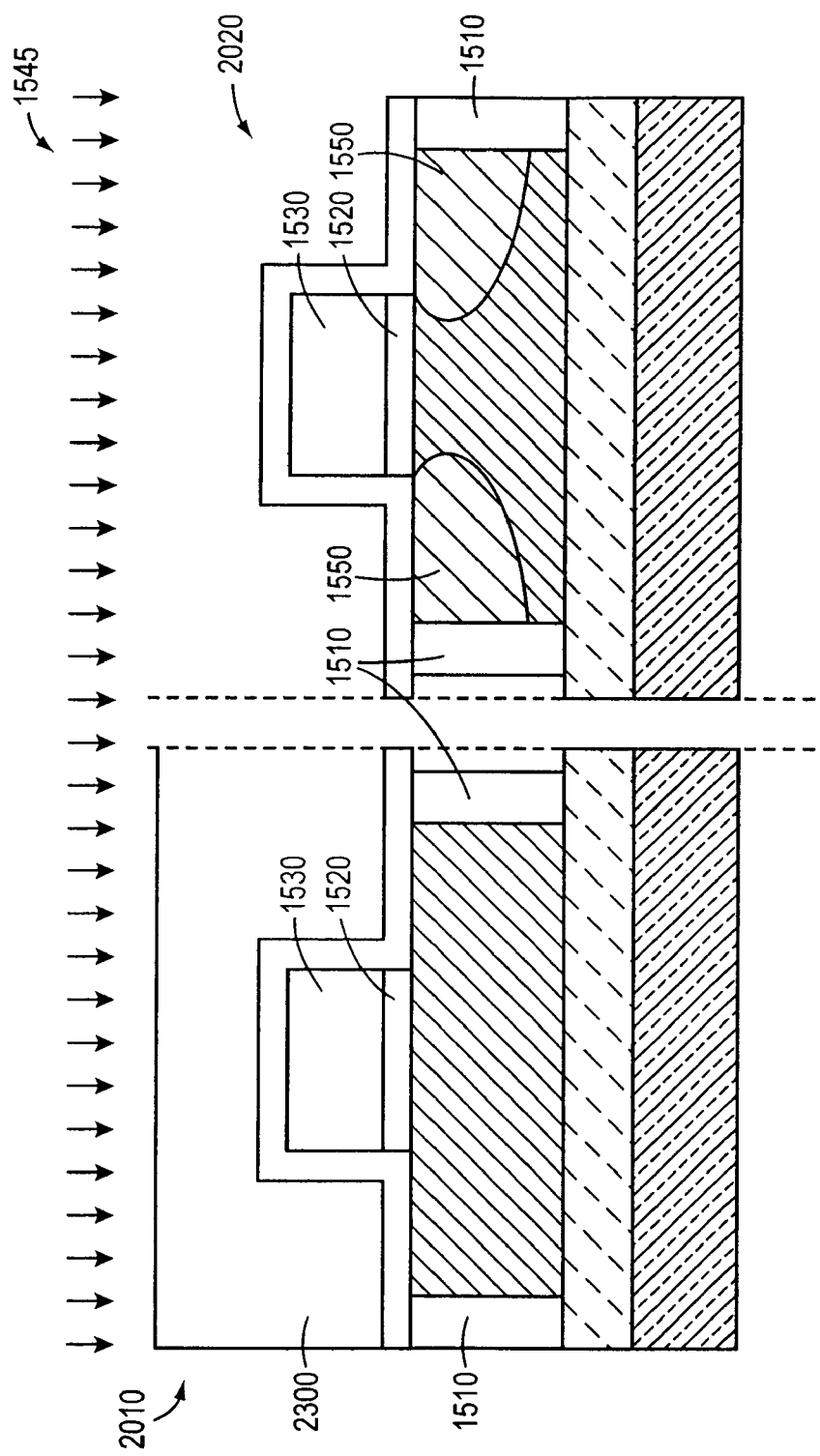
Figure 23B:
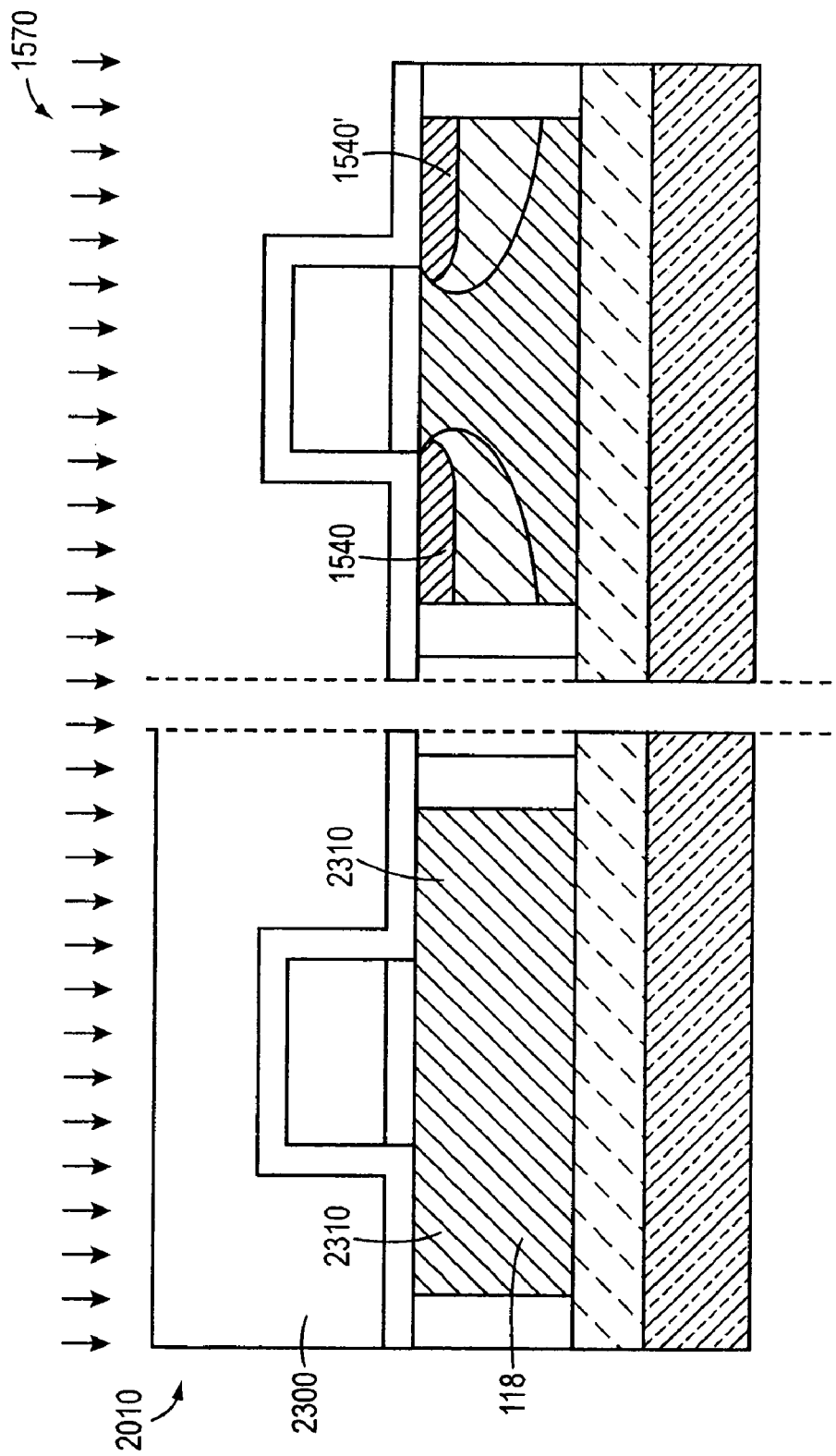
Figure 23C:
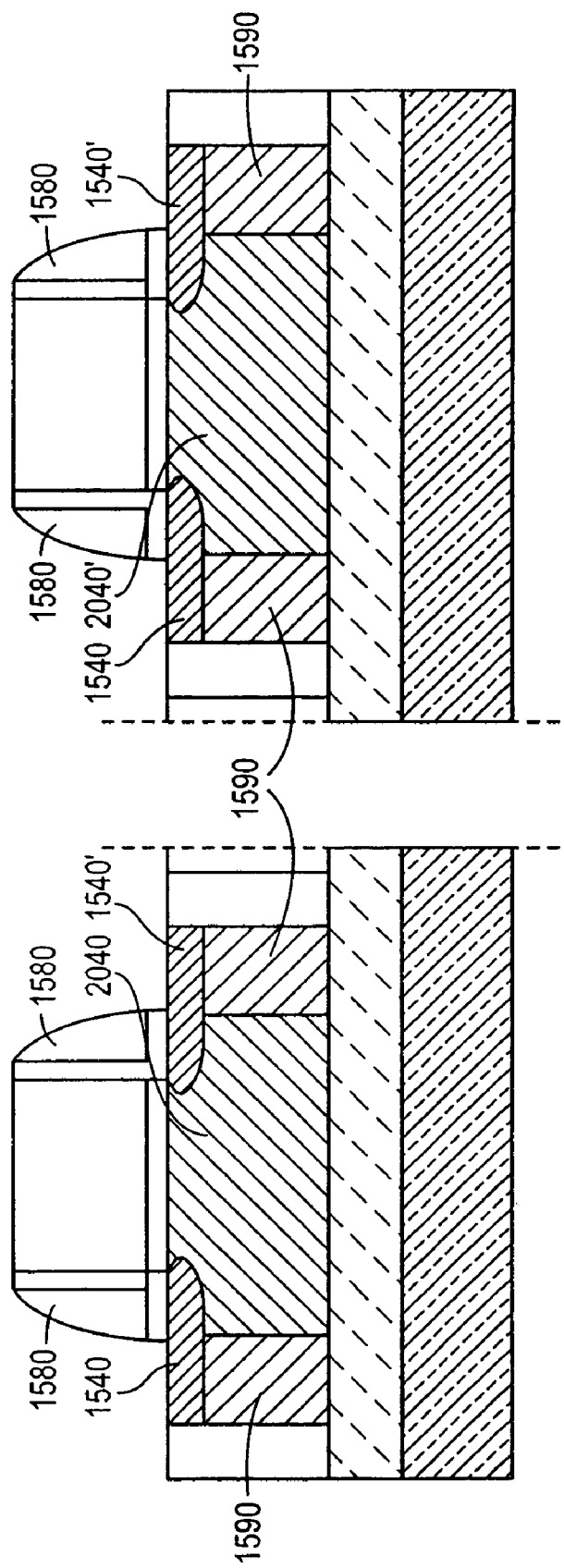

Referring to FIG. 23C, sidewall spacers 1580, and NMOS and PMOS shallow and deep source and drain regions 1540, 1540', 1590, 1590' are defined, as described above. The NMOS channel 2040 is strained, e.g., tensilely strained, and the PMOS channel 2040' is at least partially relaxed. This structure is particularly compatible with strain-inducing processes that induce tensile NMOS stain and compressive PMOS strain.

Figure 23D:
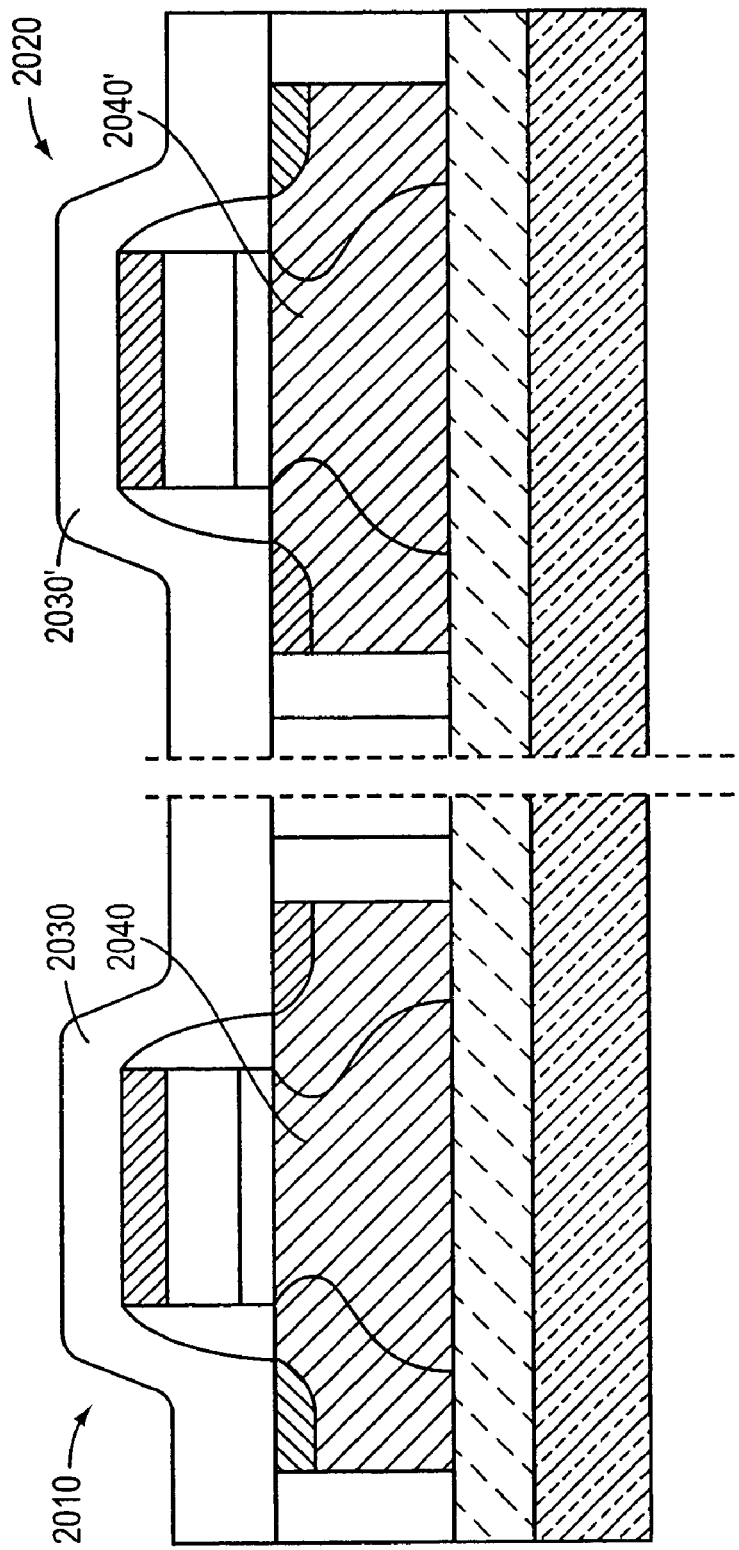

Referring to FIG. 23D, in a final structure, a first overlayer 2030 is disposed over the NMOS transistor 2010. The NMOS transistor 2010 includes a strained SSOI channel 2040 that is, e.g., tensilely strained, and the first overlayer 2030 contributes additional tensile strain. In this embodiment, the first overlayer includes silicon nitride. A second overlayer 2030' is disposed over the PMOS transistor 2020. The PMOS transistor 2020 includes an at least partially relaxed channel 2040', and the second overlayer 2030' induces compressive strain. The PMOS channel 2040' is initially relaxed, rather than fully tensilely strained, so that the final strain state is compressive. Generally, because the PMOS channel is initially relaxed, the overlayer 2030' does not have to reverse much strain inherent to the strained semiconductor layer, but substantially alone determines the final strain state of the channel 2040'. In an embodiment, the second overlayer 2030' includes silicon nitride. First and second overlayers 2030, 2030' can include or consist essentially of different dielectric materials, such as silicon oxynitride. In embodiments in which the two overlayers include the same material, e.g., silicon nitride, the strain of the overlayers may be selected as described below.

The strain of silicon nitride films grown by LPCVD at temperatures greater than approximately 700° C. may be selected by varying the silicon content of the nitride film. (See, e.g., S. Habermehl, *J. Appl. Phys.*, 83 (9) p. 4672 (1998), incorporated herein by reference.) For example, LPCVD stoichiometric silicon nitride films (i.e., $Si_3N_4$) are typically tensilely strained, while silicon-rich nitride films (e.g., with a silicon volume fraction greater than 0.1-0.15, or with a Si/N atomic ratio greater than 0.75) are typically compressively strained. The silicon content of a nitride film formed by LPCVD may be varied by changes in the ratio of silicon and nitrogen precursors utilized in the growth process. For example, a nitride growth process performed at 850° C. and a pressure of 200 milliTorr (mTorr) utilizing dichlorosilane ($SiCl_2H_2$) as a silicon precursor and ammonia ($NH_3$) as a nitrogen precursor will form a silicon-rich nitride when the ratio of dichlorosilane flow to the total gas flow is greater than approximately 0.85. For lower temperatures, the relative amount of dichlorosilane may need to be increased to form silicon-rich nitride films. Compressive silicon nitride films may have a refractive index greater than approximately 2.4, and tensile silicon nitride films may have a refractive index smaller than approximately 2.4. (See, e.g., M. Sekimoto, et al., *J. Vac. Sci. Technol.*, 21 (4) p. 1017 (1982), incorporated herein by reference.)

In another embodiment, silicon nitride films for various strain levels may be formed by PECVD at deposition temperatures less than approximately 700° C. Variations in precursor gas ratio, RF power, dilution gas, and plasma excitation frequency may lead to strain variations in the final film. For example, for a PECVD process performed at 220° C., 200 Pascals pressure, 100 watts RF power, and helium dilution, a compressive silicon nitride film may be deposited when the ratio of silane flow to total gas flow (silane, ammonia, and nitrogen) is smaller than approximately 0.03. When this ratio is larger than approximately 0.03, a tensilely strained silicon nitride film may be deposited. (See, e.g., M. J. Loboda, et al., *J. Mater. Res.*, 11 (2) p. 391 (1996), incorporated herein by reference.)

In an alternative embodiment, silicon nitride films of varying strain levels may be produced by high density plasma CVD (HDPCVD) in a process utilizing an inductively coupled plasma (ICP) source at temperatures less than 500° C. with precursors such as silane, ammonia, and nitrogen. The plasma used in this process may utilize noble gases such as argon or helium, which may also act as dilution gases in this process. The chuck power levels may be varied to tailor strain levels in silicon nitride films. For example, a process at 150° C. and 10 mTorr utilizing silane, ammonia, and helium gases (total gas flow of 40 standard cubic centimeters per minute (sccm)) and an ICP power of 800 watts may produce compressively strained silicon nitride films for RF chuck power levels less than approximately 40 watts and tensilely strained silicon nitride films for RF chuck power levels greater than approximately 40 watts. (See, e.g., J. W. Lee, et al., *J. Electrochemical. Soc.*, 147 (4) p. 1481 (2000), incorporated herein by reference.)

Figure 24A:
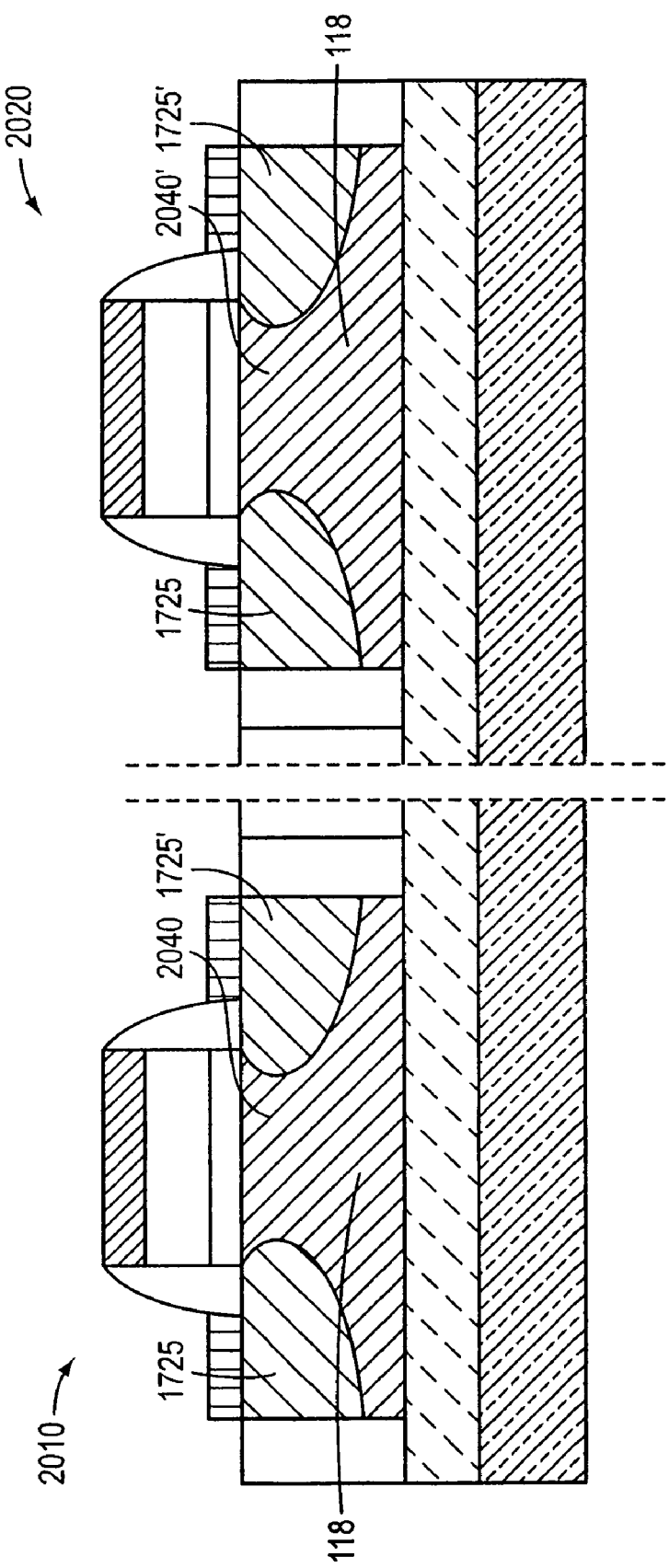
Figure 24B:
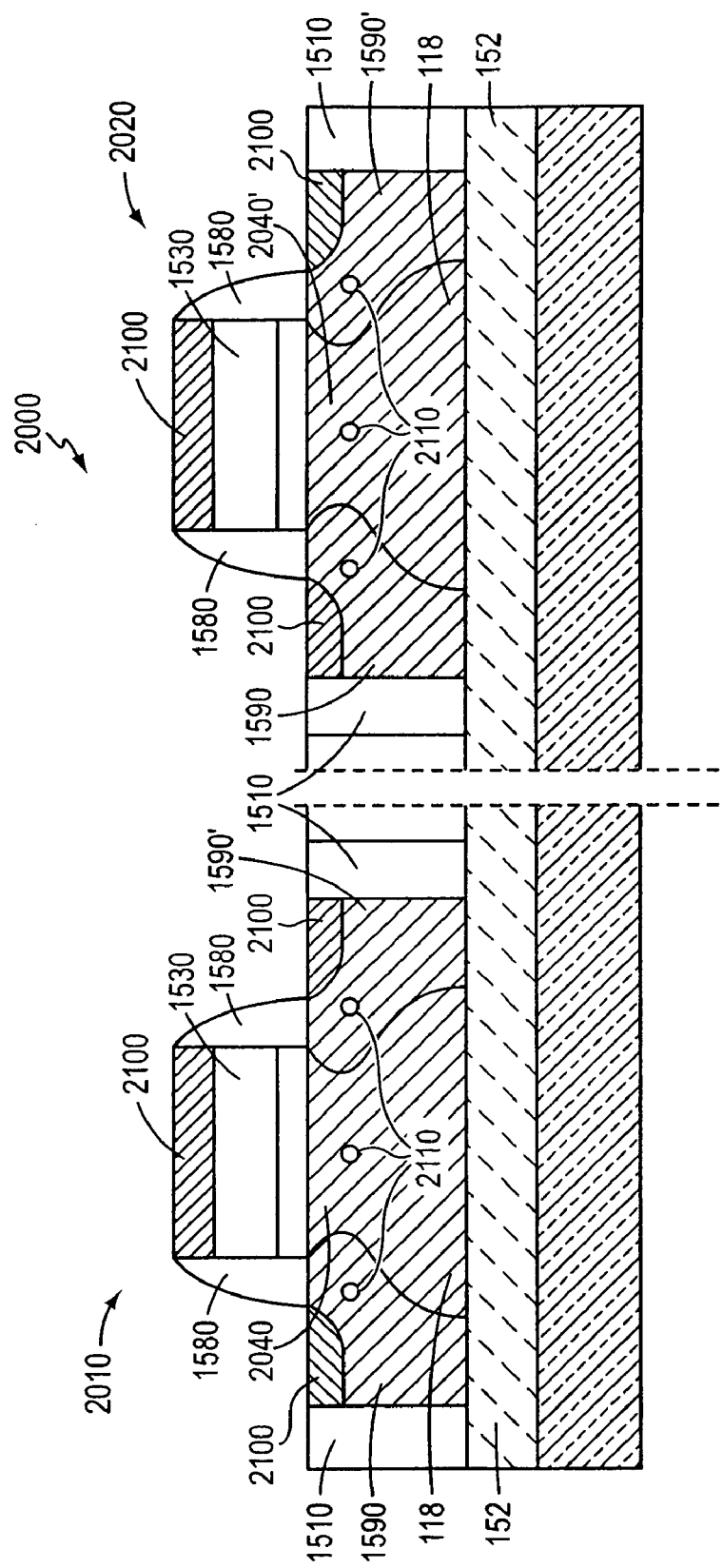

Referring to FIGS. 24A-24B, alternatively, instead of or in addition to different overlayers, relaxed PMOS devices may incorporate strain-inducing stressors such as recessed source/drain stressors, STI strain, silicide strain, gate strain, package strain, or a combination thereof. Thus, both NMOS and PMOS device types are fabricated separately and device performance may be better than that achieved by separate fabrication on a bulk SOI wafer or on a non-selectively relaxed SSOI wafer that includes the global incorporation of additional strain.

Referring to FIG. 24A, in an embodiment, an SSOI strained layer 118 is initially tensilely strained. An NMOS transistor 2010 includes a strained SSOI channel 2040 that is, e.g., tensilely strained, and strain-inducing epitaxial refilled source and drain regions 1725, 1725' that induce the same type of strain as is present in the NMOS channel 2040, e.g., tensile strain. The refilled source and drain regions 1725, 1725' may be defined as discussed above with reference to FIGS. 17A-17C. On the same substrate, a PMOS transistor 2020 may be defined, including an initially relaxed channel 2040' and strain-inducing epitaxial refilled source and drain regions 1725, 1725'. The strain induced in the PMOS channel 2040' by the epitaxial refilled source and drain regions 1725, 1725' may be of a type opposite to the strain induced by the NMOS source and drain regions 1725, 1725'. For example, the PMOS source and drain regions 1725, 1725' may induce compressive strain, such that the PMOS channel 2040' is compressively strained. The SSOI channels of both the NMOS and PMOS devices 2010, 2020 may include or consist essentially of silicon, the NMOS source/drain material may be SiC (generally, a material with a smaller lattice constant than the channel material), and the PMOS source/drain material may include or consist essentially of SiGe or Ge (generally, a material with a larger lattice constant than the channel material). In an embodiment, the NMOS transistor 2010 may include a compressively strained channel 2040 and/or a compressive strain-inducing stressor, and the PMOS transistor 2020 may include a tensilely strained channel 2040 and/or a tensile strain-inducing stressor. Such an embodiment may be preferable for channel materials other than Si that may have different piezoresistance coefficients, i.e., materials in which carrier mobilities respond differently to different strains.

Referring to FIG. 24B, an NMOS transistor 2010 includes a strained SSOI channel 2040 that is, e.g., tensilely strained, as well as at least one additional strain-inducing stressor that induces additional strain of the same type as the strained SSOI channel, e.g., tensile strain. On the same SSOI substrate, a PMOS transistor 2020 includes an initially relaxed channel 2040' and a strain-inducing stressor that induces strain of the opposite type induced by the strain-inducing stressor in NMOS transistor 2010, e.g., the strain-inducing stressor induces compressive strain. In an alternative embodiment, an NMOS transistor 2010 includes an initially relaxed channel 2040 and a strain-inducing stressor induces tensile strain. On the same SSOI substrate, a PMOS transistor 2020 includes a strained SSOI channel 2040' that is, e.g., compressively strained, and at least one additional strain-inducing stressor induces additional strain of the same type as the strained SSOI channel, e.g., compressive strain. Referring also to FIG. 22B, The NMOS and PMOS strain-inducing stressors may be, for example, STI regions 1510, gate electrodes 1530, metal-semiconductor alloy 2100, e.g., silicide, disposed on the gate electrode 1530 and/or the source and drain regions 1590, 1590', sidewall spacers 1580, voids 2110 implanted into the source and drain regions or below the channels 2040, 2040', or the package 2210 to which the chip 2200 including NMOS and PMOS transistors 2010, 2020 is attached. In an embodiment, the NMOS transistor 2010 may include a compressively strained channel 2040 and/or a compressive strain-inducing stressor, and the PMOS transistor 2020 may include a tensilely strained channel 2040' and/or a tensile strain-inducing stressor. Such an embodiment may be preferable for channel materials other than Si that may have different piezoresistance coefficients.

Figure 25:
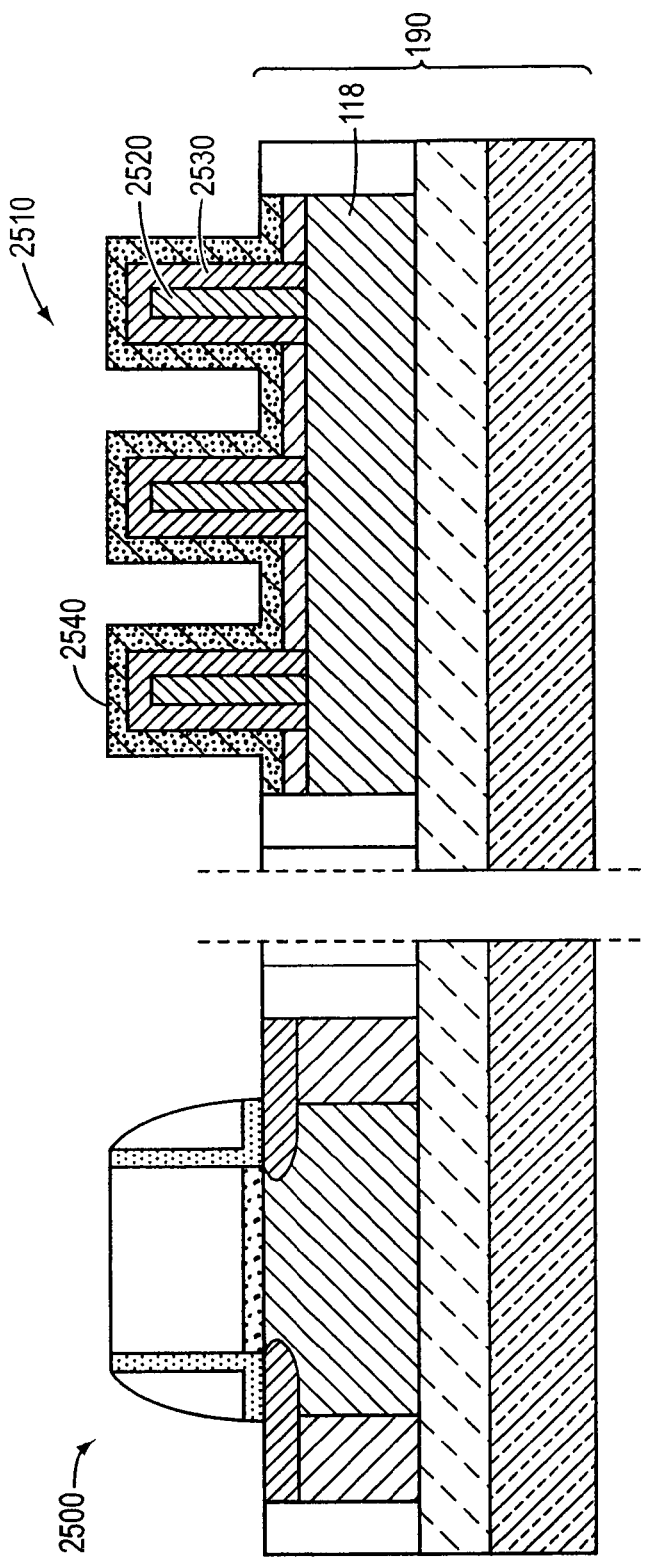

Referring to FIG. 25, a planar transistor 2500, e.g., an NMOS transistor or PMOS transistor as described above and a finFET 2510 are both formed on SSOI substrate 190. Initially, strain in the strained layer 118 is selectively relaxed in a region where the finFET is to be defined. A planar transistor is defined in another, unrelaxed region. Because the finFET will have carrier conduction (channels) that are vertical (on the sides of the fin) and perhaps horizontal (on the top of the fin), it may be preferable to make the finFET from an isotropic material (e.g., relaxed in both directions) rather than one that is strained in one direction.

FinFETs typically have two gates (one on either side of the channel, where the channel is here oriented vertically), allowing much greater control of channel charge than in a single gate device. This configuration may also result in higher drive current and lower stand-by leakage current Unlike in a traditional planar FET, this channel region is raised above the wafer surface: the channel (or portions of the channel) falls in a plane perpendicular (or at least non-parallel) to the wafer surface. There may in addition be gates below the channel region, such as in a wrap-around gate FET.

The finFET 2510 is defined as follows. A portion of the substrate is relaxed by, e.g., a PAI as described above. The relaxed semiconductor layer 118 portion may be patterned to define a plurality of fins 2520. In particular, fins 2520 may be defined by the formation of a photolithographic mask (not shown) over the substrate 190, followed by anisotropic reactive ion etching (RIE) of the substrate 130. The photolithographic mask is removed after the RIE step. A dielectric layer 2530 is conformally deposited over and between the fins 2520, to define a gate dielectric. Dielectric layer 2530 is a gate dielectric layer and includes a dielectric material that may include a first metal nitride and/or a metal oxide.

After the formation of the dielectric layer 2530, electrode layer 2540 is subsequently formed to define a gate electrode. The electrode layer 2540 is conformally deposited over dielectric layer 2530. Electrode layer 2540 includes or consists essentially of at least one of a metal or a second metal nitride. A photolithographic mask is formed over electrode layer 2540. Portions of the electrode layer 2540 are selectively removed by, e.g., RIE to define a gate crossing over the fins 2520, and terminating in a gate contact area. Portions of the dielectric layer 2530 are exposed (or even removed) by the RIE of electrode layer 2540. The formation of a finFET may completed by methods known to those of skill in the art. FinFET 2510 may also include a tensile or compressive strain-inducing stressor, as described above with respect to NMOS transistor 2010 and PMOS transistor 2020.

Prior to or after the definition of the finFET, an NMOS or PMOS transistor may be defined on a strained portion of strained layer 118, as described above.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A method for forming a structure, the method comprising:
   providing a strained semiconductor layer disposed over and contacting a dielectric layer disposed over a semiconductor substrate, the strained semiconductor layer having a first type of strain; and
   forming a transistor including a channel disposed in a portion of the strained semiconductor layer by:
      performing an implant of an isoelectronic species to introduce a plurality of point defects into a region of the strained semiconductor layer,
      thereafter, performing a shallow source and drain implant having a implant depth less than an approximate implant depth of the isoelectronic species, and
      performing a deep source and drain implant.

2. The method of claim 1, wherein the point defects comprise interstitial defects, and performing the implant comprises performing a pre-amorphization implant to introduce at least a critical dose of interstitial defects into the region of the strained semiconductor layer to amorphize the region.

3. The method of claim 2, wherein a thickness of the amorphous region is less than 50% of a thickness of the strained semiconductor layer.

4. The method of claim 3, wherein the thickness of the amorphous region is less than 25% of the thickness of the strained semiconductor layer.

5. The method of claim 2, further comprising:
   recrystallizing the amorphized region.

6. The method of claim 5, wherein the recrystallized region has a second type of strain substantially the same as the first type of strain.

7. The method of claim 6, wherein the first and second types of strain are tensile strain.

8. The method of claim 6, wherein the first and second types of strain are compressive strain.

9. The method of claim 2, wherein the pre-amorphization implant is performed selectively on the region of the strained semiconductor layer.

10. The method of claim 2, wherein forming the transistor further comprises defining a strain-inducing stressor, and the strain-inducing stressor induces strain of a same type as the first strain.

11. The method of claim 10, wherein the strain induced by the strain-inducing stressor is tensile strain.

12. The method of claim 10, wherein the strain induced by the strain-inducing stressor is compressive strain.

13. The method of claim 10, wherein the point defects comprise lattice vacancies and performing the implant of the isoelectronic species comprises performing a co-implant to create lattice vacancies in the region of the strained semiconductor layer, the region of the strained semiconductor layer remaining crystalline.

14. The method of claim 10, wherein the strain-inducing stressor comprises a shallow trench isolation disposed proximate at least one of a source and a drain formed during the deep source and drain implant.

15. The method of claim 10, wherein the strain-inducing stressor comprises a gate electrode formed over a portion of the strained semiconductor layer.

16. The method of claim 10, wherein the strain-inducing stressor comprises a metal-semiconductor alloy disposed on at least one of a source and a drain formed during the deep source and drain implant.

17. The method of claim 10, wherein the strain-inducing stressor comprises at least one dielectric spacer disposed proximate a gate electrode formed over a portion of the strained semiconductor layer.

18. The method of claim 10, wherein the strain-inducing stressor comprises a dielectric overlayer disposed over a gate electrode formed over a portion of the strained semiconductor layer and at least one of a source and a drain formed during the deep source and drain implant.

19. The method of claim 1, wherein the region of the strained semiconductor layer comprises a drain of the transistor and the implant of the isoelectronic species is performed at an angle of less than 90° with respect to a top surface of the drain.

20. The method of claim 19, wherein performing the implant of the isoelectronic species amorphizes at least a portion of the drain of the transistor, and substantially all of a source of the transistor remains crystalline.

21. The method of claim 19, wherein, after forming the transistor, the drain is partially relaxed and a source of the transistor is approximately fully strained.

22. The method of claim 1, wherein the implant is performed at a temperature above 25° C.

23. The method of claim 1, wherein the step of performing a deep source and drain implant forms a source region and a drain region, wherein the source region and the drain region are each formed entirely within the strained semiconductor layer.

24. The method of claim 1, further comprising performing a recrystallization anneal after the step of performing the shallow source and drain implant and prior to the step of performing the deep source and drain implant.

25. A method for forming a structure, the method comprising:
   providing a strained semiconductor layer disposed over and contacting a dielectric layer disposed over a semiconductor substrate, the strained semiconductor layer having a first amount of strain; and
   forming a first transistor including:
      defining a channel disposed in a portion of the strained semiconductor layer;
      removing at least a portion of the strained semiconductor layer proximate the channel to define a recess, and
      selectively depositing a conductive material into the recess to define at least a portion of a source or a drain of the first transistor,
   wherein the conductive material induces additional strain such that the channel has a second amount of strain greater than the first amount of strain.

26. The method of claim 25, wherein the conductive material comprises at least one of a metal or a doped semiconductor.

27. The method of claim 25, wherein the first strain and the second strain are compressive.

28. The method of claim 25, wherein the first strain and the second strain are tensile.

29. The method of claim 25, further comprising forming a second transistor including:
   defining a second channel disposed in a second portion of the strained semiconductor layer,
   removing at least a portion of the strained semiconductor layer proximate the second channel to define a second recess, and
   selectively depositing a second conductive material into the second recess to define at least a portion of a source or a drain of the second transistor,
   wherein the second conductive material induces strain of a type different from the first and second strains such that the second channel has a third amount of strain which is less than the first amount of strain.

30. The method of claim 29, wherein the conductive material and the second conductive material are different.

31. A method for forming a structure, the method comprising:
   providing a strained semiconductor layer disposed over and contacting a dielectric layer disposed over a semiconductor substrate, the strained semiconductor layer having a first amount of strain; and
   forming a first transistor including:
      defining a channel disposed in a portion of the strained semiconductor layer;
      removing at least a portion of the strained semiconductor layer proximate the channel to define a recess, and
      selectively depositing a metal into the recess to define at least a portion of a source or a drain of the first transistor,
   wherein a second amount of strain in the channel after metal deposition is greater than or equal to the first amount of strain.

* * * * *